United States Patent
Oguma

(10) Patent No.: US 8,153,276 B2
(45) Date of Patent: Apr. 10, 2012

(54) POLYMER COMPOUND AND POLYMER LIGHT EMITTING DEVICE USING THE SAME

(75) Inventor: Jun Oguma, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 919 days.

(21) Appl. No.: 11/911,867

(22) PCT Filed: Apr. 28, 2006

(86) PCT No.: PCT/JP2006/309353
§ 371 (c)(1),
(2), (4) Date: Oct. 18, 2007

(87) PCT Pub. No.: WO2006/118345
PCT Pub. Date: Nov. 9, 2006

(65) Prior Publication Data
US 2010/0066237 A1    Mar. 18, 2010

(30) Foreign Application Priority Data

Apr. 28, 2005   (JP) .................. 2005-131383

(51) Int. Cl.
*H01J 1/34*   (2006.01)
(52) U.S. Cl. ......... 428/690; 313/504; 313/505; 313/506
(58) Field of Classification Search .............. 428/690; 313/504, 505, 506
See application file for complete search history.

(56) References Cited

U.S. PATENT DOCUMENTS

| | | | |
|---|---|---|---|
| 2001/0026878 A1 | 10/2001 | Woo et al. | |
| 2003/0181617 A1 | 9/2003 | Schwalm et al. | |
| 2006/0094859 A1* | 5/2006 | Marrocco et al. | 528/394 |

FOREIGN PATENT DOCUMENTS

| | | |
|---|---|---|
| EP | 1961782 A1 | 8/2008 |
| GB | 2434798 A | 8/2007 |
| JP | 2005-100781 * | 4/2005 |
| JP | 2008-519140 A | 6/2006 |
| WO | WO 2006/52457 A2 | 5/2006 |

OTHER PUBLICATIONS

Holbro Th., Bromofluoranthenes.II. Synthesis of 4, 11-dibromo fluoranthene, Helvetica Chimica Acta, vol. 33, (1950), pp. 2178-2185.

* cited by examiner

*Primary Examiner* — Jennifer Chriss
*Assistant Examiner* — Gregory Clark
(74) *Attorney, Agent, or Firm* — Sughrue Mion, PLLC

(57) ABSTRACT

A polymer compound comprising at least one of residues of compounds of the following formula (1):

formula 1

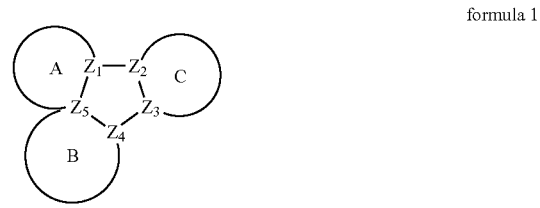

(wherein, ring A, ring B and ring C represent each independently an aromatic ring or non-aromatic ring optionally having a substituent, $Z_1$, $Z_2$, $Z_3$, $Z_4$ and $Z_5$ represent each independently C-(Q)$_z$ or nitrogen atom, Q represents a substituent or hydrogen atom, z represents 0 or 1, the ring A and the ring B may share an atom other than $Z_5$ constituting each ring, and one or more and two or less of the rings A, B and C are non-aromatic rings.).

4 Claims, No Drawings

POLYMER COMPOUND AND POLYMER LIGHT EMITTING DEVICE USING THE SAME

TECHNICAL FIELD

The present invention relates to a polymer compound and a polymer light emitting device using the same

BACKGROUND ART

Light emitting materials and charge transporting materials of high molecular weight are soluble in a solvent and capable of forming an organic layer in a light emitting device by an application method, thus, are variously investigated. Polyfluorenes are known as polymer compounds which can be used as light emitting materials or charge transporting materials in electron devices such as polymer light emitting devices (polymer LED) and the like (International Publication No. 99/54385).

The device performance of the devices using the above-described polymer compound as a light emitting material or charge transporting material and the like, however, is not necessarily in practically satisfactory level yet.

For example, polymer LEDs using the above-described polymer compound do not show practically satisfactory level yet in device performances thereof such as light emitting efficiency, hue of emitted light, and the like.

DISCLOSURE OF THE INVENTION

The present invention has an object of providing a polymer compound capable of giving, when used as an electron device material, an electron device excellent in device performances.

That is, the present invention provides a polymer compound comprising at least one of residues of compounds of the following formula (1):

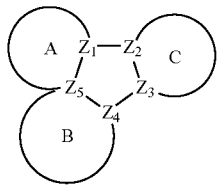

formula 1

(wherein, ring A, ring B and ring C represent each independently an aromatic ring or non-aromatic ring optionally having a substituent, $Z_1$, $Z_2$, $Z_3$, $Z_4$ and $Z_5$ represent each independently C-(Q)$_z$ or nitrogen atom, Q represents a substituent or hydrogen atom, z represents 0 or 1, the ring A and the ring B may share an atom other than $Z_5$ constituting each ring, and one or more and two or less of the rings A, B and C are non-aromatic rings.).

BEST MODE FOR CARRYING OUT THE INVENTION

In the formula (1), ring A, ring B and ring C represent each independently an aromatic ring or non-aromatic ring optionally having a substituent.

As the aromatic ring, those containing (4n+2) π electrons in the ring structure are mentioned. Specifically mentioned are aromatic hydrocarbon rings such as a benzene ring, cyclodecanepentaene ring and the like; and aromatic hetero rings such as a furan ring, thiophene ring, pyrrole ring, pyridine ring, pyrimidine ring, pyridazine ring and the like.

The non-aromatic ring includes alicyclic rings such as a cyclopentane ring, cyclopentene ring, cyclopentadiene ring, cyclohexane ring, cyclohexene ring, cyclohexadiene ring, cycloheptane ring, cycloheptene ring, cycloheptadiene ring, cycloheptatriene ring, cyclooctane ring, cyclooctene ring, cyclooctadiene ring, cyclooctatriene ring, cyclooctatetraene ring, cyclononane ring, cyclononene ring, cyclononanediene ring, cyclononanetriene ring, cyclodecane ring, cyclodecene ring, cyclodecanediene ring, cyclodecanetriene ring, cyclodecanetetraene ring, cyclododecanepentaene ring, cycloundecane ring, cycloundecene ring, cycloundecanediene ring, cycloundecanetriene ring, cycloundecanetetraene ring, cycloundecanepentaene ring, cycloundecanehexaene ring and the like; and non-aromatic hetero rings such as a pyran ring, thiopyran ring and the like.

When the aromatic ring or non-aromatic ring has a substituent, the substituent includes an alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, fluorine atom, acyl group, acyloxy group, amide group, acid imide group, monovalent heterocyclic group, carboxyl group, substituted carboxyl group, cyano group and nitro group, and further preferable are an alkyl group, alkoxy group, aryl group, aryloxy group, arylalkyl group, arylalkoxy group and arylalkylthio group.

Here, the alkyl group may be any of linear, branched or cyclic, and has a number of carbon atoms of usually about 1 to 20, preferably 3 to 20, and as specific examples thereof, a methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group and the like are mentioned, and preferable are a pentyl group, isoamyl group, hexyl group, octyl group, 2-ethylhexyl group, decyl group and 3,7-dimethyloctyl group.

The alkoxy group may be any of linear, branched or cyclic, and has a number of carbon atoms of usually about 1 to 20, preferably 3 to 20, and as specific examples thereof, a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group and the like are mentioned, and preferable are a pentyloxy group, hexyloxy group, octyloxy group, 2-ethylhexyloxy group, decyloxy group and 3,7-dimethyloctyloxy group.

The alkylthio group may be any of linear, branched or cyclic, and has a number of carbon atoms of usually about 1 to 20, preferably 3 to 20, and as specific examples thereof, a methylthio group, ethylthio group, propylthio group, 1-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group and the like are mentioned, and preferable are a pentylthio group, hexylthio group, octylthio group, 2-ethylhexylthio group, decylthio group and 3,7-dimethyloctylthio group.

The aryl group is an atomic group obtained by removing one hydrogen atom from an aromatic hydrocarbon and includes also those having a condensed ring, and those obtained by bonding of two or more independent benzene rings or condensed rings directly or via a vinylene group and the like. The aryl group has a number of carbon atoms of usually about 6 to 60, preferably 7 to 48 and as specific examples thereof, a phenyl group, $C_1$ to $C_{12}$ alkoxyphenyl groups ($C_1$ to $C_{12}$ means a number of carbon atoms of 1 to 12. Applicable also in the later descriptions), $C_1$ to $C_{12}$ alkylphenyl groups, 1-naphthyl group, 2-naphthyl group, 1-anthracenyl group, 2-anthracenyl group, 9-anthracenyl group, pentafluorophenyl group and the like are exemplified, and preferable are $C_1$ to $C_{12}$ alkoxyphenyl groups and $C_1$ to $C_{12}$ alkylphenyl groups. Specifically exemplified as the $C_1$ to $C_{12}$ alkoxy are methoxy, ethoxy, propyloxy, i-propyloxy, butoxy, 1-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy and the like.

Specifically exemplified as the $C_1$ to $C_{12}$ alkylphenyl group are a methylphenyl group, ethylphenyl group, dimethylphenyl group, propylphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group and the like.

The aryloxy group has a number of carbon atoms of usually about 6 to 60, preferably 7 to 48, and specific examples thereof include a phenoxy group, $C_1$ to $C_{12}$ alkoxyphenoxy groups, $C_1$ to $C_{12}$ alkylphenoxy groups, 1-naphthyloxy group, 2-naphthyloxy group, pentafluorophenyloxy group and the like, and preferable are $C_1$ to $C_{12}$ alkoxyphenoxy groups and $C_1$ to $C_{12}$ alkylphenoxy groups.

Specifically exemplified as the $C_1$ to $C_{12}$ alkoxy are methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy and the like.

Specifically exemplified as the $C_1$ to $C_{12}$ alkylphenoxy group are a methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, dodecylphenoxy group and the like.

The arylthio group has a number of carbon atoms of usually about 3 to 60 carbon atoms, and specific examples thereof include a phenylthio group, $C_1$ to $C_{12}$ alkoxyphenylthio groups, $C_1$ to $C_{12}$ alkylphenylthio groups, 1-naphthylthio group, 2-naphthylthio group, pentafluorophenylthio group and the like, and preferable are $C_1$ to $C_{12}$ alkoxyphenylthio groups and $C_1$ to $C_{12}$ alkylphenylthio groups.

The arylalkyl group has a number of carbon atoms of usually about 7 to 60, preferably 7 to 48, and specific examples thereof include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, and preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylalkoxy group has a number of carbon atoms of usually about 7 to 60, preferably 7 to 48, and specific examples thereof include phenyl-$C_1$ to $C_{12}$ alkoxy groups such as a phenylmethoxy group, phenylethoxy group, phenylbutoxy group, phenylpentyloxy group, phenylhexyloxy group, phenylheptyloxy group, phenyloctyloxy group and the like, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like, and preferable are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The arylalkylthio group has a number of carbon atoms of usually about 7 to 60, preferably 7 to 48, and specific examples thereof include phenyl-$C_1$ to $C_{12}$ alkylthio groups, $C_1$ to $C_{12}$ alkoxyphenyl-$C_1$ to $C_{12}$ alkylthio groups, $C_1$ to $C_{12}$ alkylphenyl-$C_1$ to $C_{12}$ alkylthio groups, 1-naphthyl-$C_1$ to $C_{12}$ alkylthio groups, 2-naphthyl-$C_1$ to $C_{12}$ alkylthio groups and the like, and preferable are $C_1$ to $C_{12}$ alkoxyphenyl-$C_1$ to $C_{12}$ alkylthio groups and $C_1$ to $C_{12}$ alkylphenyl-$C_1$ to $C_{12}$ alkylthio groups.

The arylalkenyl group has a number of carbon atoms of usually about 8 to 60, and specific examples thereof include phenyl-$C_2$ to $C_{12}$ alkenyl groups, $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl-$C_2$ to $C_{12}$ alkenyl groups, 2-naphthyl-$C_2$ to $C_{12}$ alkenyl groups and the like, and preferable are $C_1$ to $C_{12}$ alkoxyphenyl-$C_2$ to $C_{12}$ alkenyl groups and $C_2$ to $C_{12}$ alkylphenyl-$C_1$ to $C_{12}$ alkenyl groups.

The arylalkynyl group has a number of carbon atoms of usually about 8 to 60 carbon atoms, and specific examples thereof include phenyl-$C_2$ to $C_{12}$ alkynyl groups, $C_1$ to $C_{12}$ alkoxyphenyl-$C_2$ to $C_{12}$ alkynyl groups, $C_1$ to $C_{12}$ alkylphenyl-$C_2$ to $C_{12}$ alkynyl groups, 1-naphthyl-$C_2$ to $C_{12}$ alkynyl groups, 2-naphthyl-$C_2$ to $C_{12}$ alkynyl groups and the like, and preferable are $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups.

The substituted amino group includes amino groups substituted with one or two groups selected from alkyl groups, aryl groups, arylakyl groups or monovalent heterocyclic groups, and the alkyl group, aryl group, arylalkyl group or monovalent heterocyclic group may have a substituent. The number of carbon atoms of the substituted amino group is usually about 1 to 60 excepting the number of carbon atoms of the substituent, preferably 2 to 48.

Specifically exemplified are a methylamino group, dimethylamino group, ethylamino group, diethylamino group, propylamino group, dipropylamino group, 1-propylamino group, diisopropylamino group, butylamino group, i-butyamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino group, phenylamino group, diphenylamino group, $C_1$ to $C_{12}$ alkoxyphenylamino groups, di($C_1$ to $C_{12}$ alkoxyphenyl)amino groups, di($C_1$ to $C_{12}$ alkylphenyl)amino groups, 1-naphthylamino group, 2-naphthylamino group, pentafluorophenylamino group, pyridylamino group, pyridazinylamino group, pyrimidylamino group, pyrazylamino group, triazylamino group, phenyl $C_1$ to $C_{12}$ alkylamino groups, $C_1$ to $C_{12}$ alkoxyphenyl-$C_1$ to $C_{12}$ alkylamino groups, $C_1$ to $C_{12}$ alkylphenyl-$C_1$ to $C_{12}$ alkylamino groups, di($C_1$ to $C_{12}$ alkoxyphenyl-$C_1$ to $C_{12}$ alkyl)amino groups, di($C_1$ to $C_{12}$ alkylphenyl-$C_1$ to $C_{12}$ alkyl)amino groups, 1-naphthyl-$C_1$ to $C_{12}$ alkylamino groups, 2-naphthyl-$C_1$ to $C_{12}$ alkylamino groups and the like.

The substituted silyl group includes silyl groups substituted with one, two or three groups selected from alkyl groups, aryl groups, arylakyl groups and monovalent heterocyclic groups. The substituted silyl group has a number of carbon atoms of usually about 1 to 60, preferably 3 to 48. The alkyl group, aryl group, arylakyl group or monovalent heterocyclic group may have a substituent.

Specifically exemplified are a trimethylsilyl group, triethylsilyl group, tripropylsilyl group, tri-i-propylsilyl group, dimethyl-i-propylsilyl group, diethyl-i-propylsilyl group, t-butylsilyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, phenyl-$C_1$ to $C_{12}$ alkylsilyl groups, $C_1$ to $C_{12}$ alkoxyphenyl-$C_1$ to $C_{12}$ alkylsilyl groups, $C_1$ to $C_{12}$ alkylphenyl-$C_1$ to $C_{12}$ alkylsilyl groups, 1-naphthyl-$C_1$ to $C_{12}$ alkylsilyl groups, 2-naphthyl-$C_1$ to $C_{12}$ alkylsilyl groups, phenyl-$C_1$ to $C_{12}$ alkyldimethylsilyl groups, triphenylsilyl group, tri-p-xylylsilyl group, tribenzylsilyl group, diphenylmethylsilyl group, t-butyldiphenylsilyl group, dimethylphenylsilyl group and the like.

The acyl group has a number of carbon atoms of usually about 2 to 20, preferably 2 to 18, and specific examples thereof include an acetyl group, propionyl group, butylyl group, isobutylyl group, pivaloyl group, benzoyl group, trifluoroacetyl group, pentafluorobenzoyl group and the like.

The acyloxy group has a number of carbon atoms of usually about 2 to 20, preferably 2 to 18, and specific examples thereof include an acetoxy group, propionyloxy group, butylyloxy group, isobutylyloxy group, pivaloyloxy group, benzoyloxy group, trifluoroacetyloxy group, pentafluorobenzoyloxy group and the like.

The amide group has a number of carbon atoms of usually about 2 to 20, preferably 2 to 18, and specific examples thereof include a formamide group, acetamide group, propioamide group, butyloamide group, benzamide group, trifluoroacetamide group, pentafluorobenzamide group, diformamide group, diacetamide group, dipropioamide group, dibutyloamide group, dibenzamide group, ditrifluoroacetamide group, dipentafluorobenzmide group and the like.

The acid imide group includes residues obtained by removing a hydrogen atom bonded to a nitrogen atom from an acid imide, has a number of carbon atoms of about 4 to 20, and specific examples thereof include the following groups and the like.

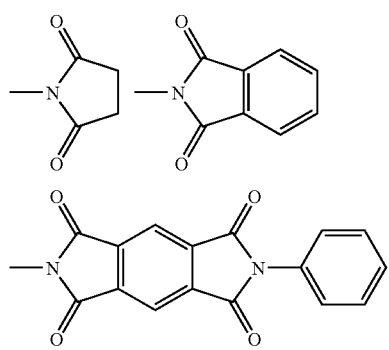

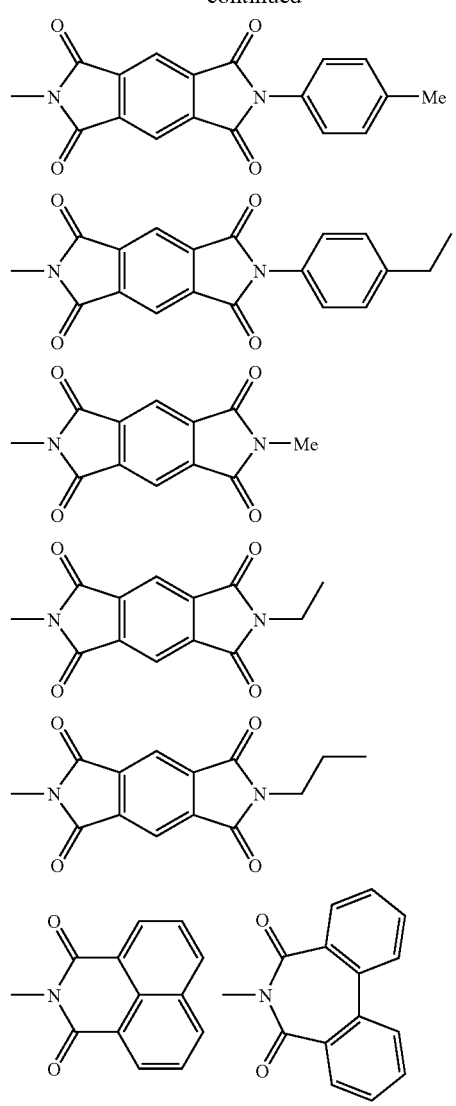

The monovalent heterocyclic group means an atomic group remaining after removal of one hydrogen atom from a heterocyclic compound, and has a number of carbon atoms of usually about 4 to 60, preferably 4 to 20. The number of carbon atoms of the heterocyclic group does not include the number of carbon atoms of the substituent. Here, the heterocyclic compound includes organic compounds having a cyclic structure in which elements constituting the ring include not only a carbon atom but also hetero atoms such as oxygen, sulfur, nitrogen, phosphorus, boron and the like contained in the ring. Specifically, the following structures are shown.

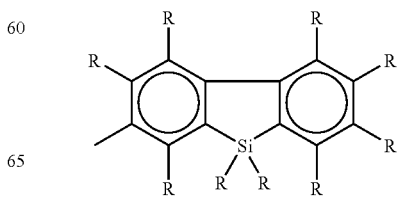

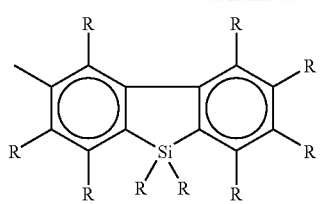
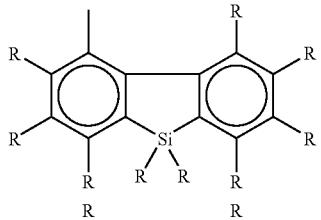
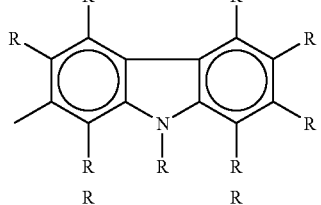
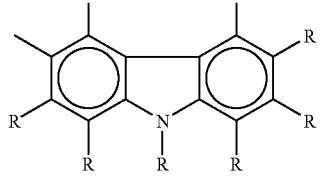
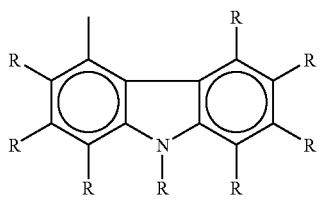
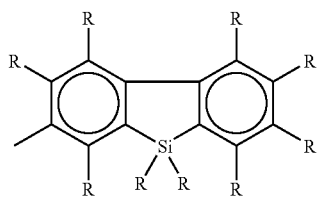
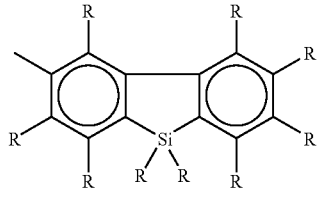
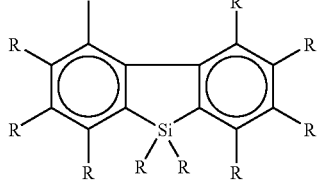
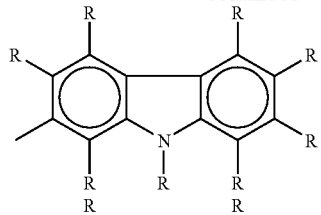
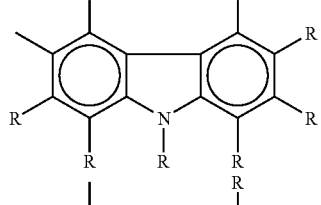
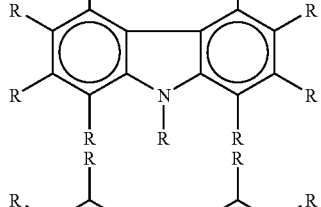
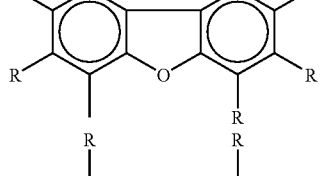
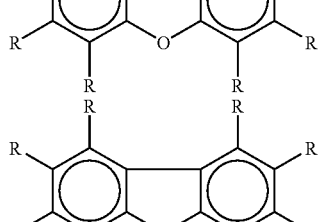
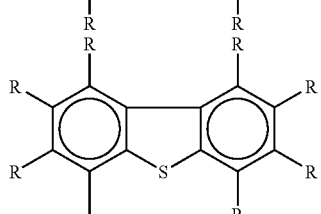
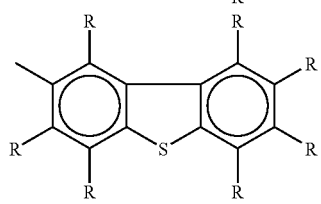
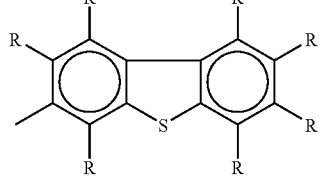

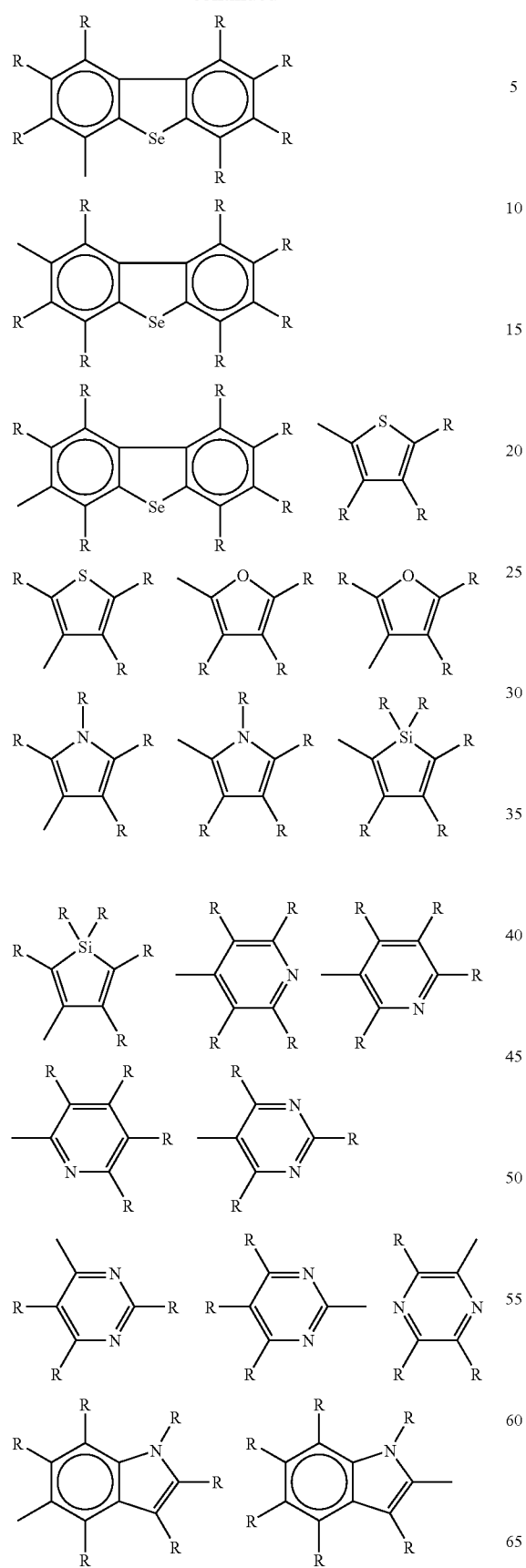
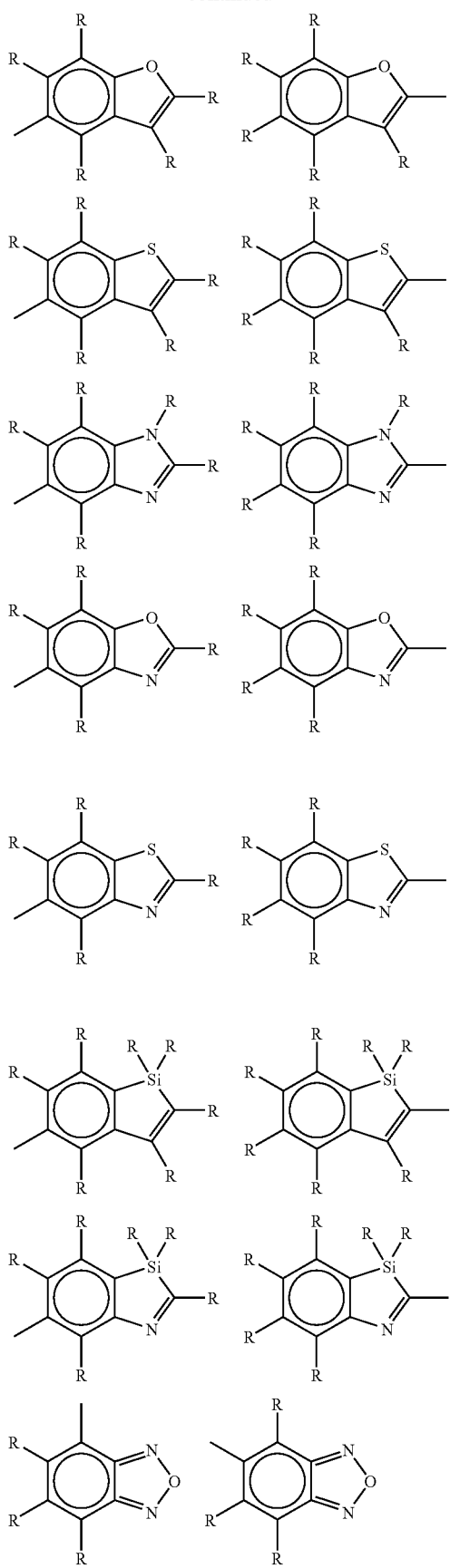

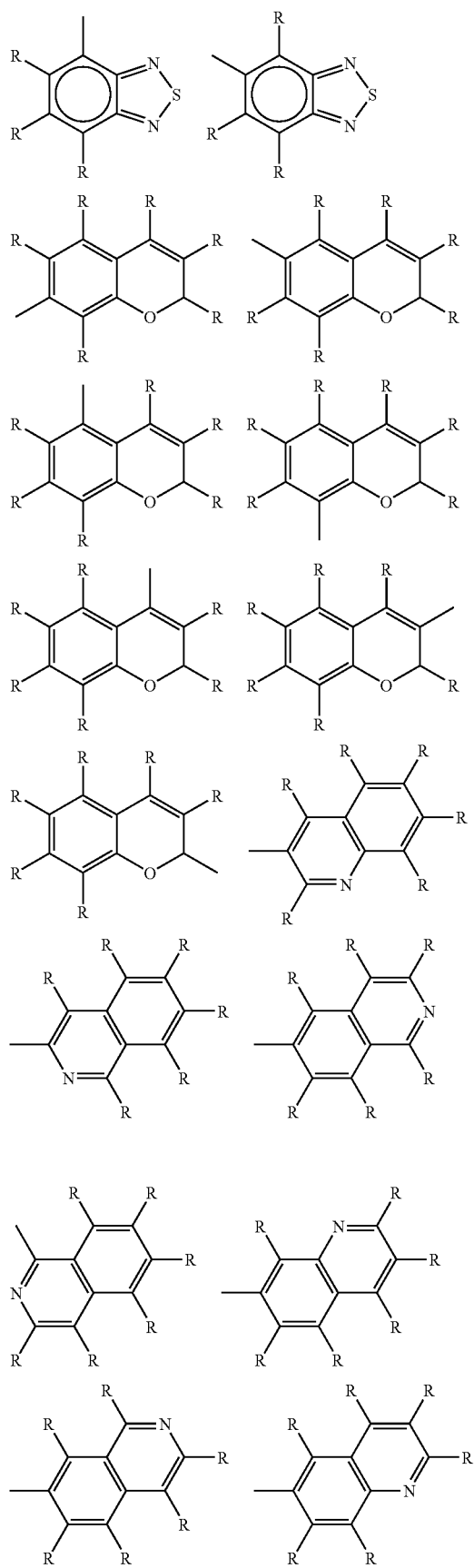
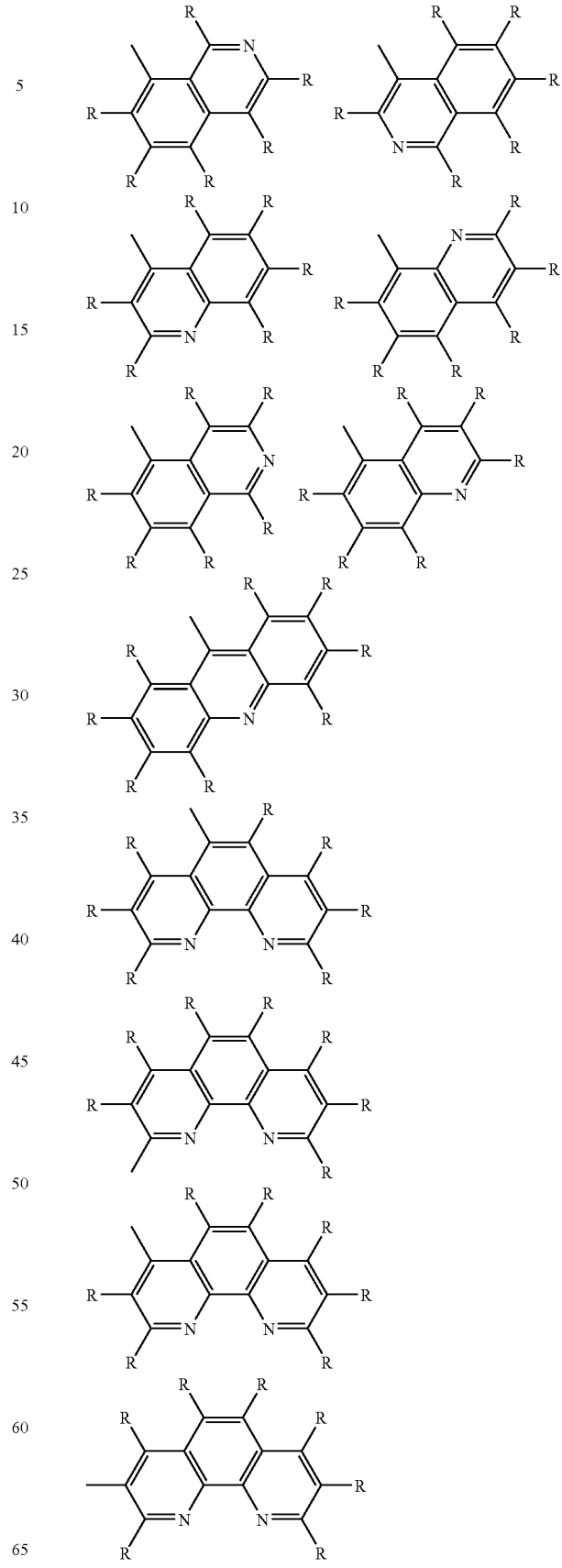

In the above-described formulae, Rs represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group.

Of them, preferable are a thienyl group, $C_1$ to $C_{12}$ alkylthienyl groups, pyrrolyl group, furyl group, pyridyl group, $C_1$ to $C_{12}$ alkylpyridyl groups, piperidyl group, quinolyl group, isoquinolyl group and the like, further preferable are a thienyl group, $C_1$ to $C_{12}$ alkylthienyl groups, pyridyl group, $C_1$ to $C_{12}$ alkylpyridyl groups.

The substituted carboxyl group means a carboxyl group substituted by an alkyl group, aryl group, arylalkyl group or mono-valent heterocyclic group, and has a number of carbon atoms of usually about 2 to 60, preferably 2 to 48. Specific examples thereof include a methoxycarbonyl group, ethoxycarbonyl group, propoxycarbonyl group, i-propoxycarbonyl group, butoxycarbonyl group, i-butoxycarbonyl group, t-butoxyarbonyl group, pentyloxy carbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group, pyridyloxycarbonyl group, and the like. The alkyl group, aryl group, arylalkyl group or mono-valent heterocyclic group may have a substituent. The number of carbon atoms of the substituted carboxyl group does not include the number of carbon atoms of the substituent.

In the above-described formula (1), $Z_1$, $Z_2$, $Z_3$, $Z_4$ and $Z_5$ represent each independently C-(Q)$_z$ or nitrogen atom, Q represents a substituent or hydrogen atom, and z represents 0 or 1.

The substituent Q includes an alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, fluorine atom, acyl group, acyloxy group, amide group, acid imide group, mono-valent heterocyclic group, carboxyl group, substituted carboxyl group, cyano group, nitro group and the like, and definitions and specific examples thereof are the same as described above.

The ring A and the ring B may share a ring atom other than $Z_5$ constituting each ring, and one or more and two or less of the rings A, B and C are non-aromatic rings.

Preferably, the ring A and the ring B share one ring atom other than $Z_5$. Further, it is preferable that there is one non-aromatic ring.

It is preferable that the polymer compound of the present invention contains a repeating unit of the following formula (1-1), (1-2) or (1-3):

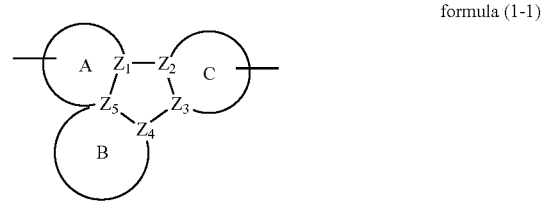

formula (1-1)

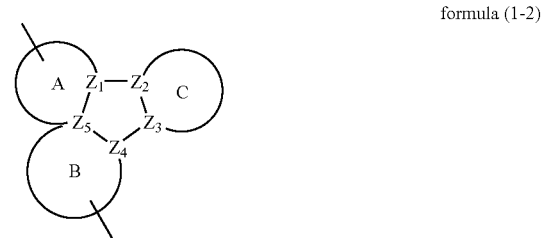

formula (1-2)

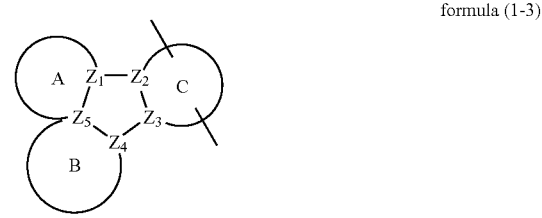

formula (1-3)

(wherein, ring A, ring B and ring C represent each independently an aromatic ring or non-aromatic ring optionally having a substituent, $Z_1$, $Z_2$, $Z_3$, $Z_4$ and $Z_5$ represent each independently C-(Q)$_z$ or nitrogen atom, Q represents a substituent or hydrogen atom, z represents 0 or 1, the ring A and the ring B may share a ring atom other than $Z_5$, substituents on the rings may mutually be connected to further form a ring, and one or more rings having no connecting bond among the rings A, B and C are non-aromatic rings.).

Specific examples of the repeating unit of the formula (1-1) includes:

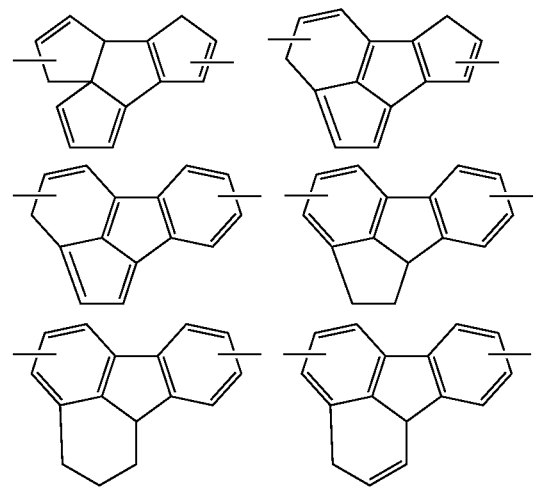

-continued
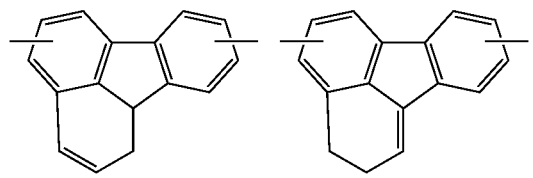
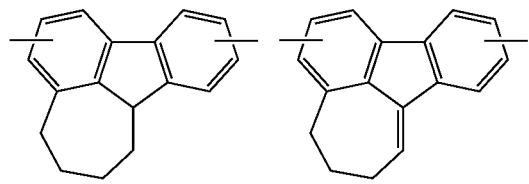
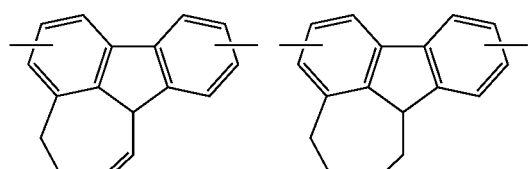
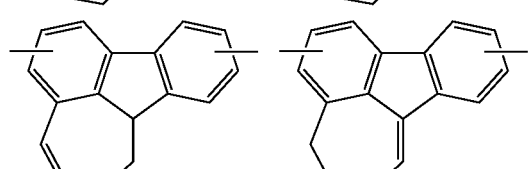
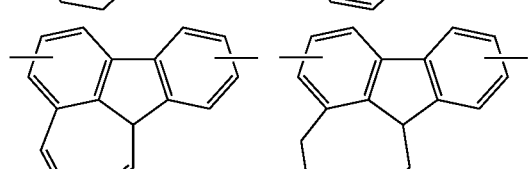
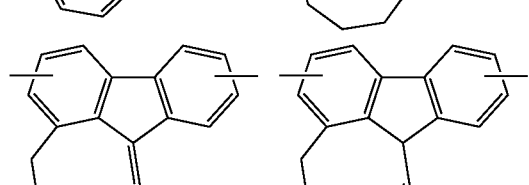
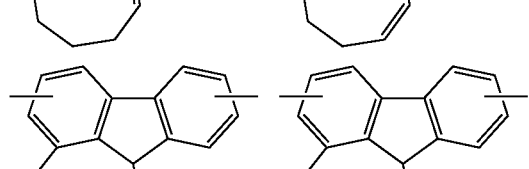
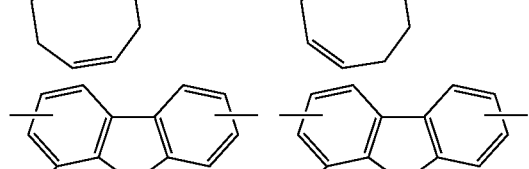
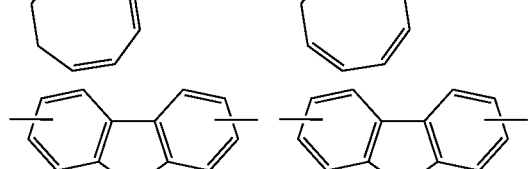
-continued
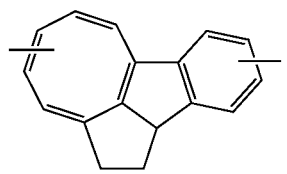
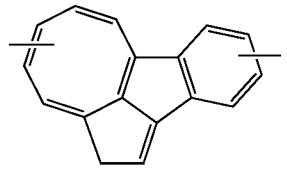
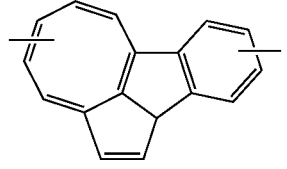
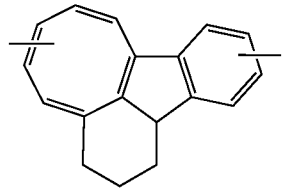
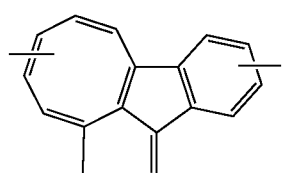
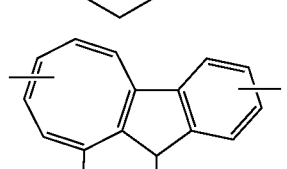
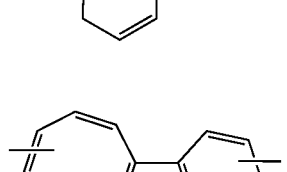
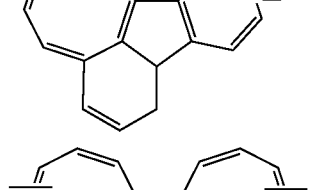
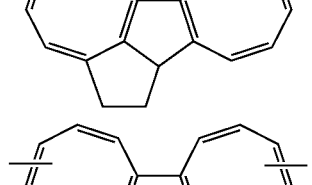

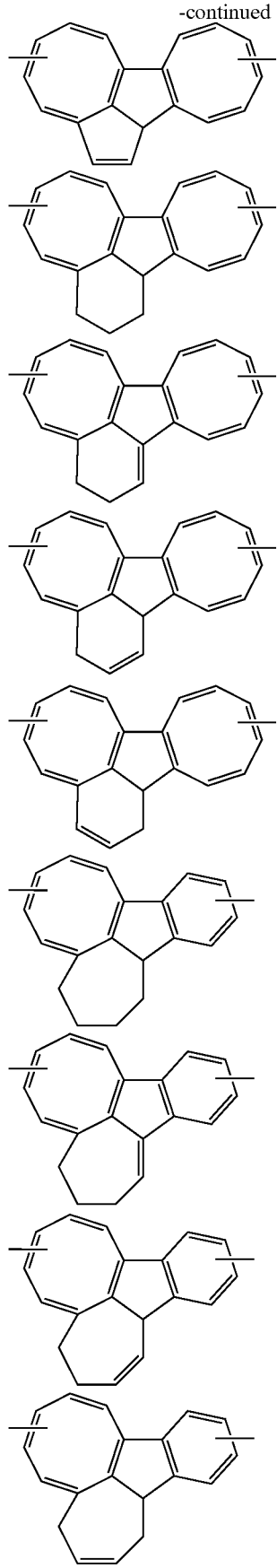
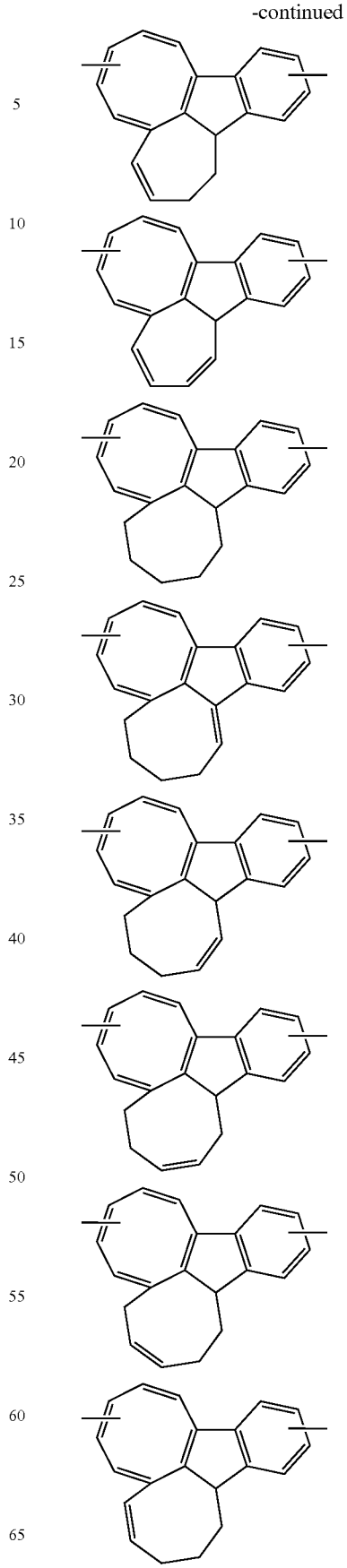

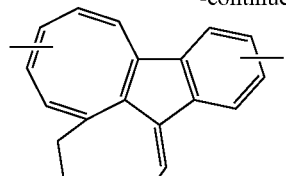
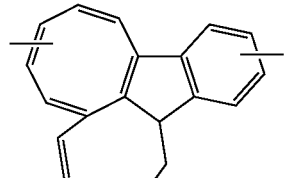
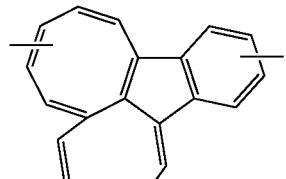
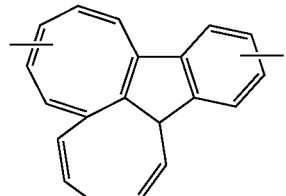
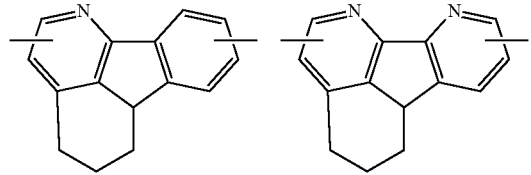
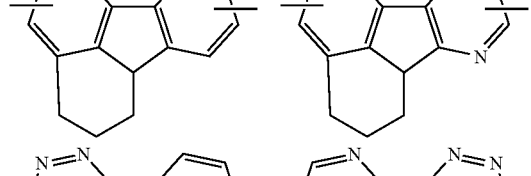
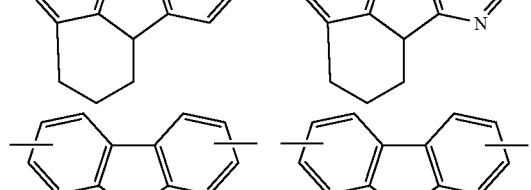
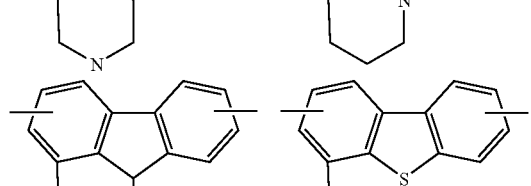
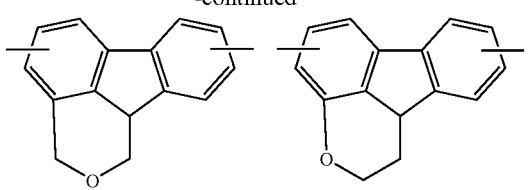
and the like and those carrying a substituent on these units.
Specific examples of the repeating unit of the formula (1-2) includes:
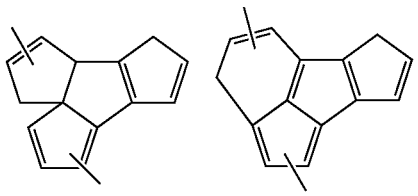
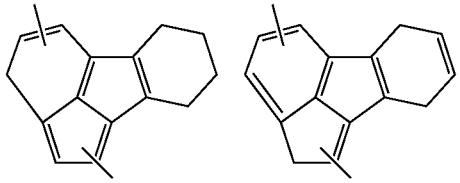
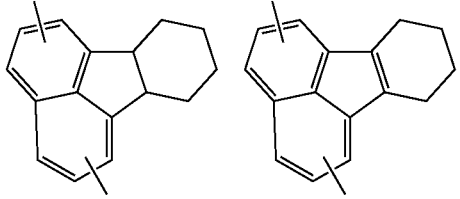
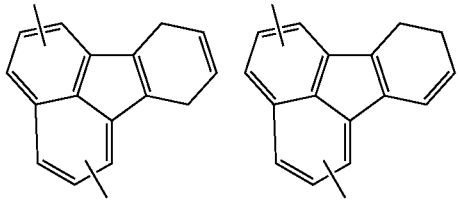
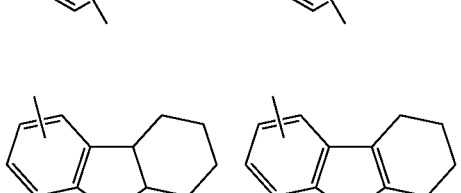
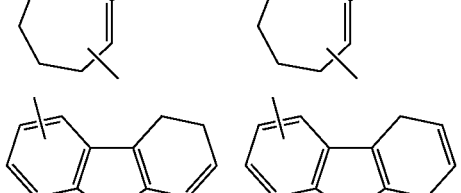
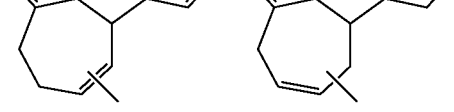

21
-continued
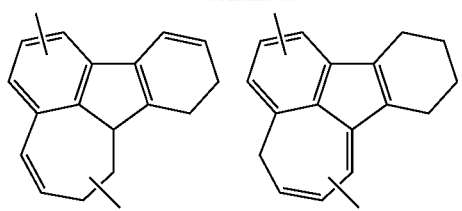
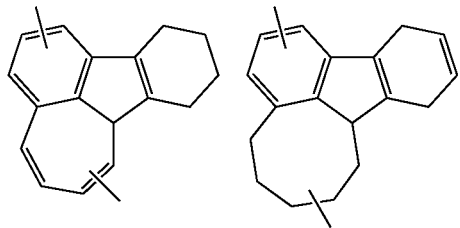
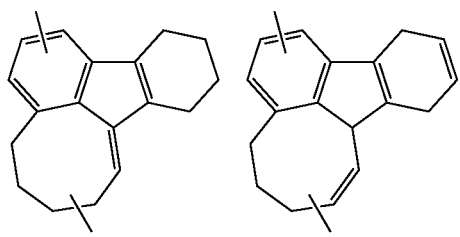
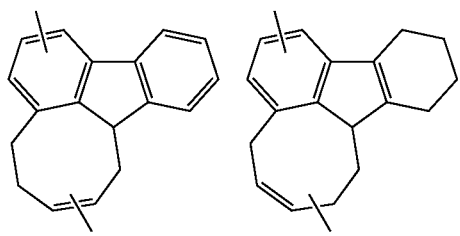
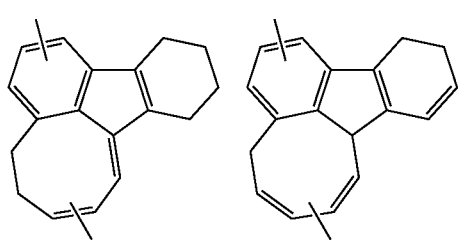
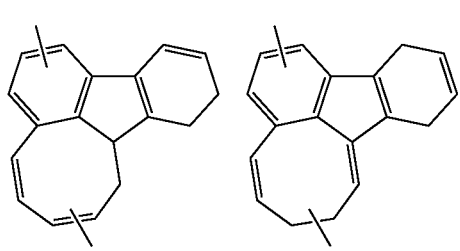
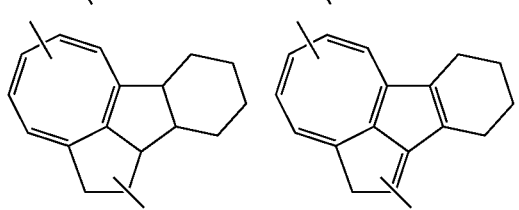
22
-continued
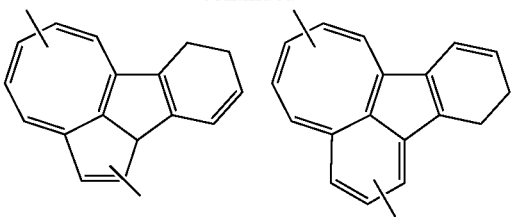
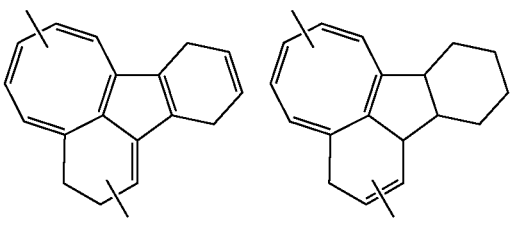
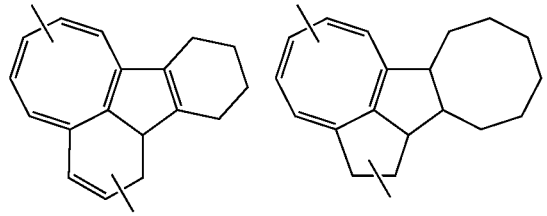
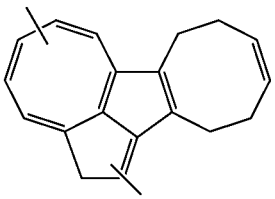
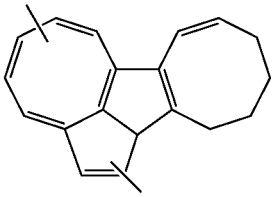
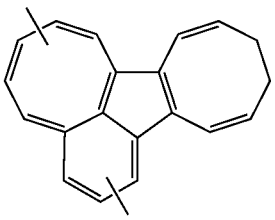
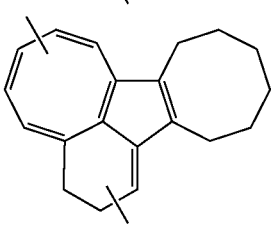
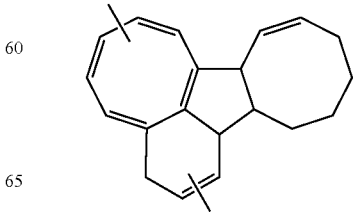

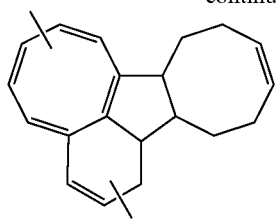
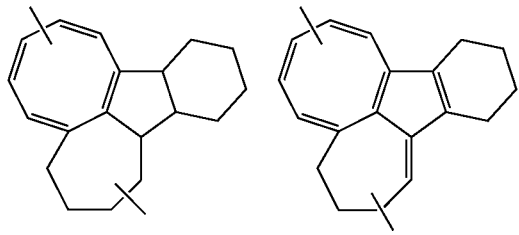
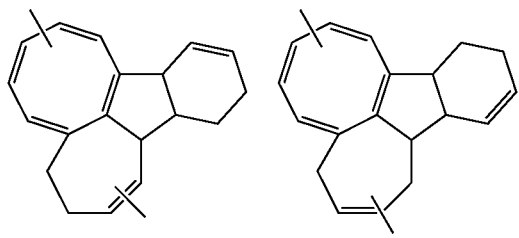
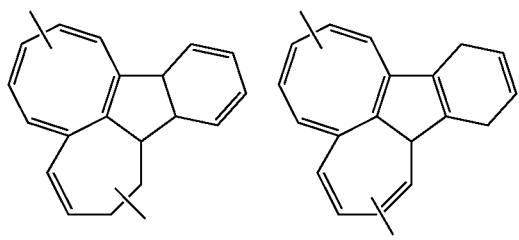
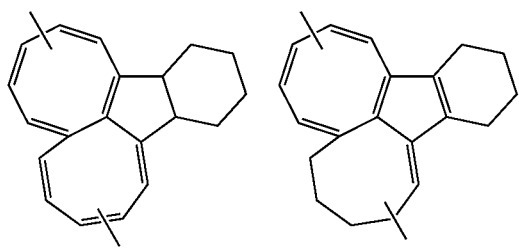
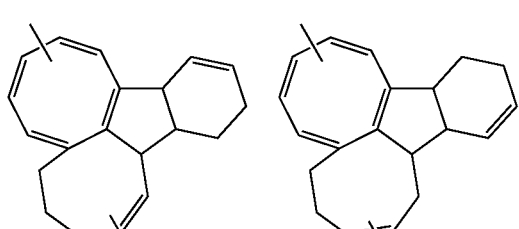
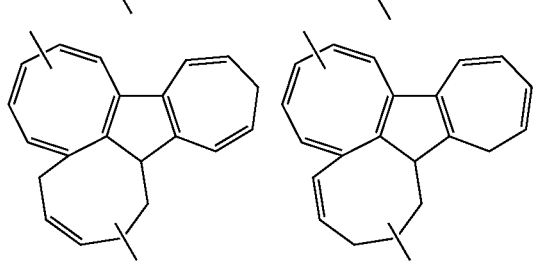
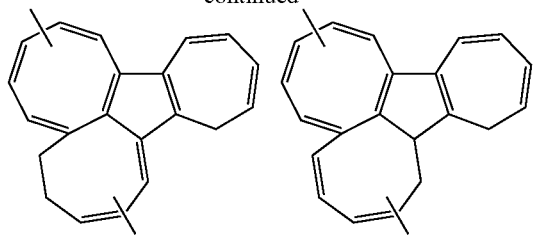
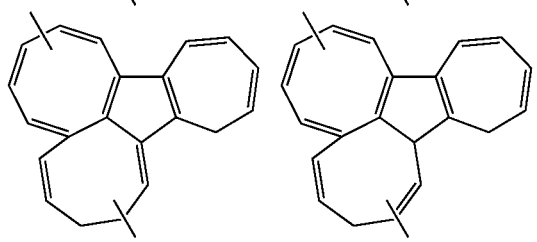
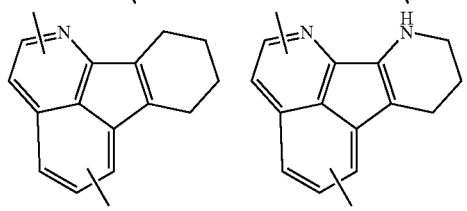
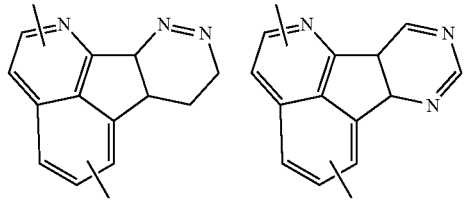
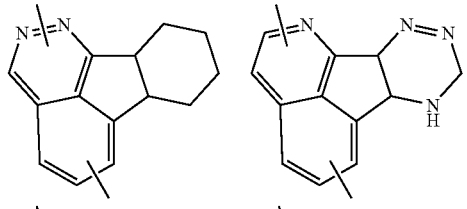
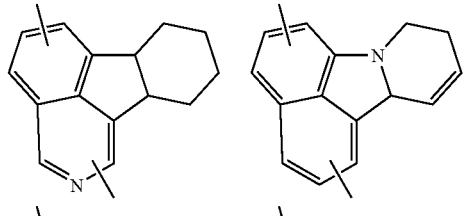
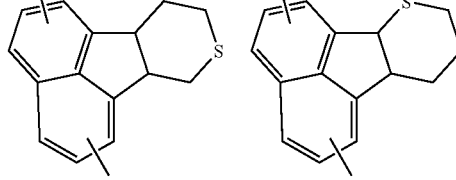
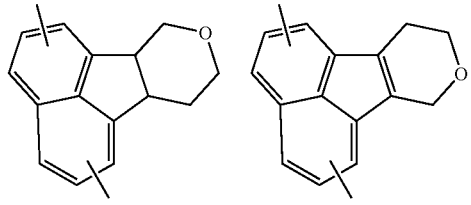
and the like and those carrying a substituent on these units.

Specific examples of the repeating unit of the formula (1-3) includes:
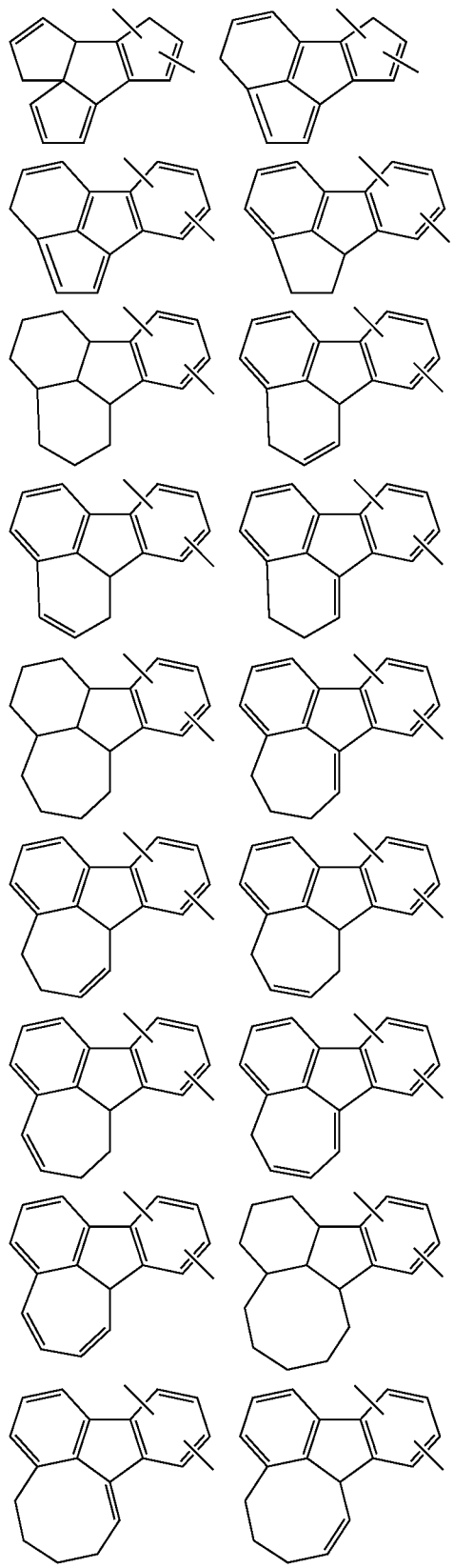
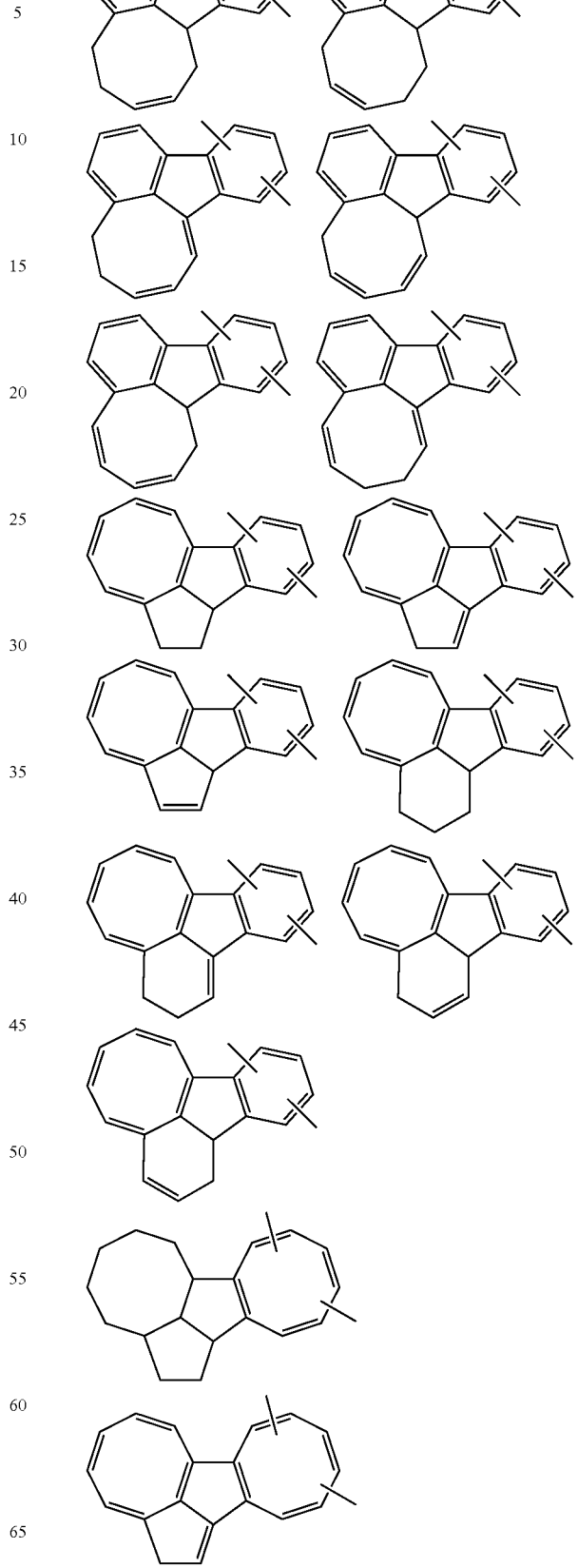

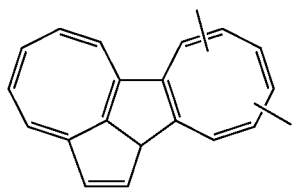
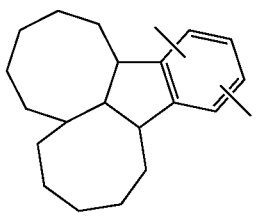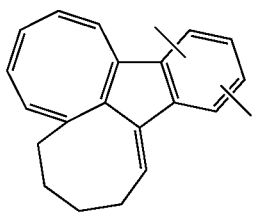
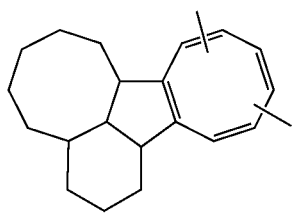
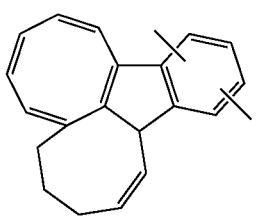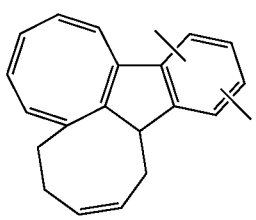
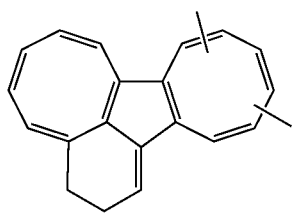
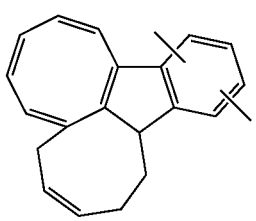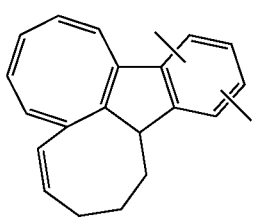
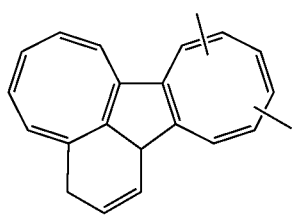
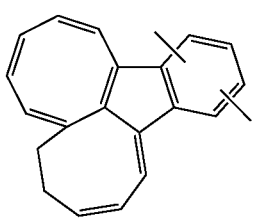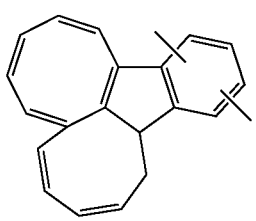
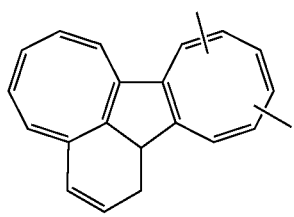
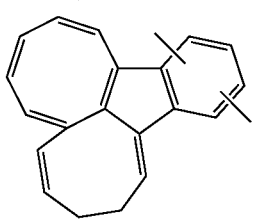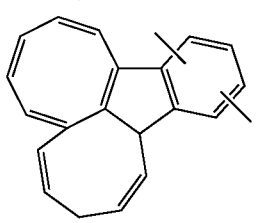
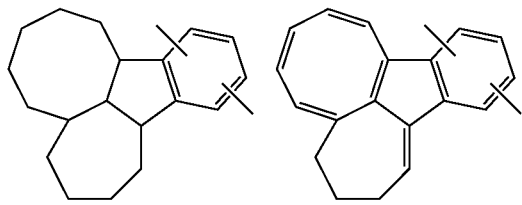
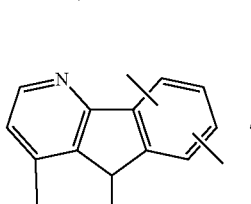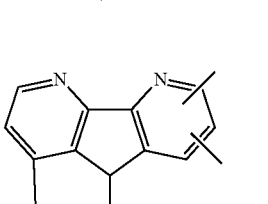
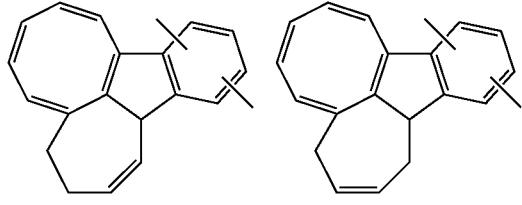
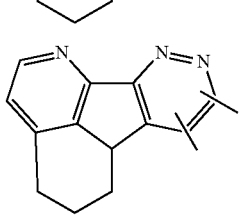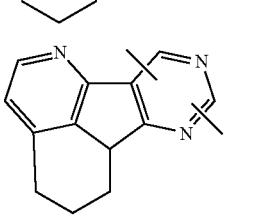
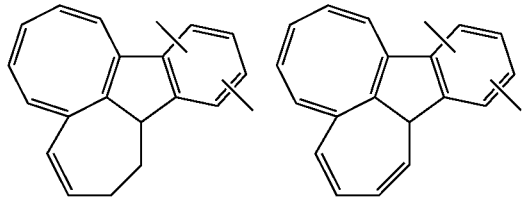
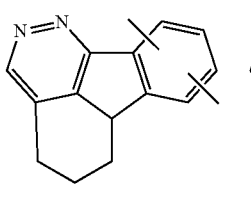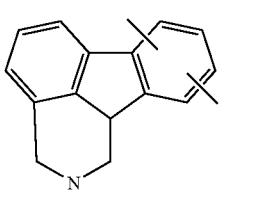

-continued

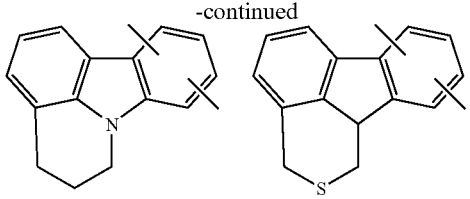

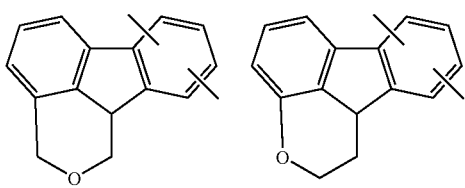

and the like and those carrying a substituent on these units.

In the repeating units of the above-described formulae (1-1) to (1-3), atoms constituting the rings A, B and C ("atom constituting a ring" means an atom forming the skeleton of the ring) may contain atoms such as nitrogen, oxygen, sulfur, silicon, selenium and the like in addition to a carbon atom, and from the standpoint of regulation of charge transportability, it is preferable that atoms constituting the rings A, B and C are all carbon atoms.

From the standpoint of enhancement of solubility of a polymer compound, from the standpoint of regulation of light emitting wavelength and from the standpoint of regulation of charge transportability, it is preferable that at least one of the rings A, B and C has a substituent.

Further, from the standpoint of charge transportability, repeating units having a structure of the above-described formula (1-1) or (1-2) are preferable, and from the standpoint of easy synthesis, structures of the above-described formula (1-1) are further preferable.

Further, it is more preferable that the above-described formula (1-1) is the following formula (2-1):

formula (2-1)

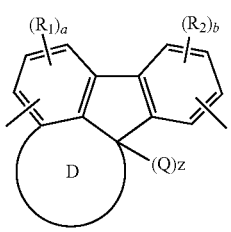

(wherein, $R_1$ and $R_2$ represent each independently a substituent, ring D represents a non-aromatic ring optionally having a substituent, a represents an integer of 0 to 2, b represents an integer of 0 to 3, and when there are two or more $R_1$s and two or more $R_2$s, respectively, they may be the same or different, and $R_1$ and $R_2$ may be mutually connected to form a ring. $R_1$ and/or $R_2$ may be connected with ring D to form a ring, and Q and z represent the same meanings as described above.).

It is preferable that the repeating unit containing the above-described formula (2-1) is a repeating unit of the following formula (3-1):

formula (3-1)

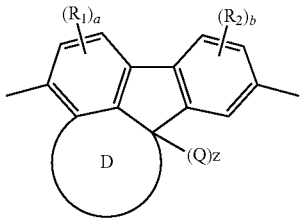

(wherein, $R_1$, $R_2$, ring D, Q, z, a and b represent the same meanings as described above.).

Among the repeating units of the formula (3-1), those of the following formulae (4-1), (4-2), (4-3) and (4-4) are further preferable from the standpoint of regulation of charge transportability.

formula (4-1)

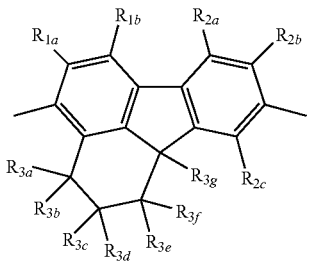

formula (4-2)

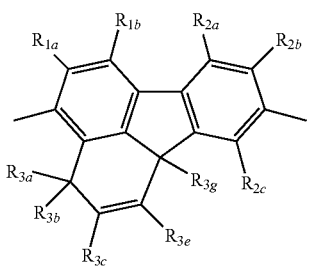

formula (4-3)

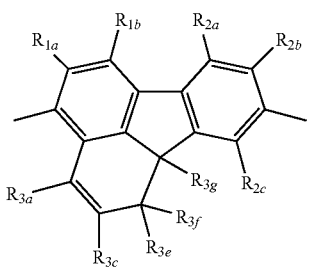

formula (4-4)

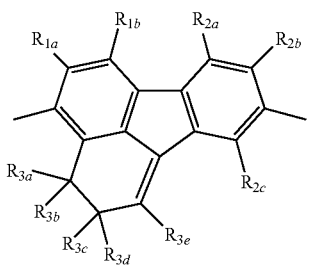

(wherein, $R_{1a}$, $R_{1b}$, $R_{2a}$ to $R_{2c}$ and $R_{3a}$ to $R_{3g}$ represent a substituent. In the formulae (4-1) to (4-3), $R_{2c}$ and $R_{3g}$ may be mutually connected to form a ring. In the formula (4-4), $R_{2c}$ and $R_{3e}$ may be mutually connected to form a ring.).

As the ring to be formed by mutual connection, aromatic rings and non-aromatic rings and the like are mentioned, and specific examples thereof are the same as described above.

The units of the formulae (4-1) to (4-3) are included in the case of the formula (3-1) in which z=1, and the unit of the formula (4-4) is included in the case of the formula (3-1) in which z=0.

Specific examples of the repeating unit of the above-described formula (4-1) include:

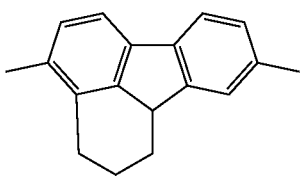

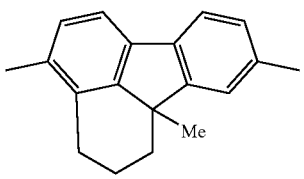

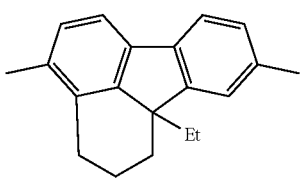

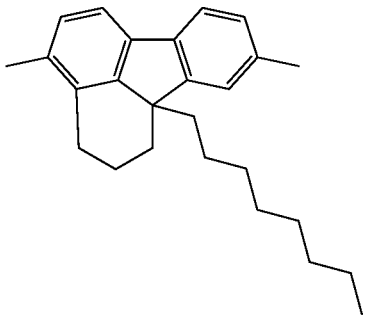

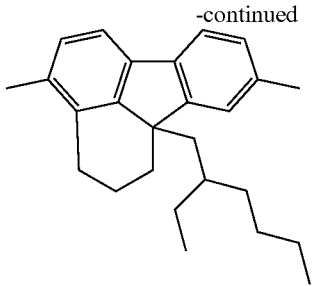

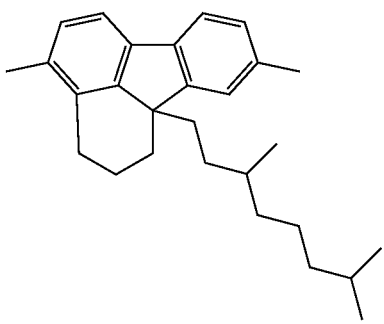

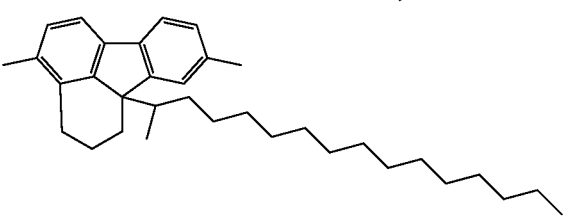

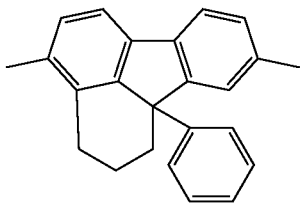

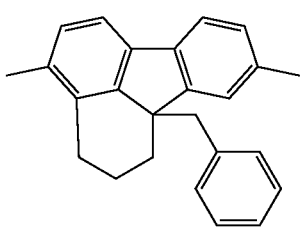

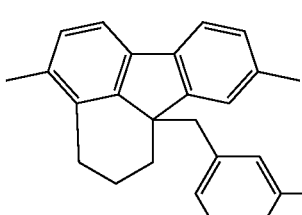

33
-continued
34
-continued
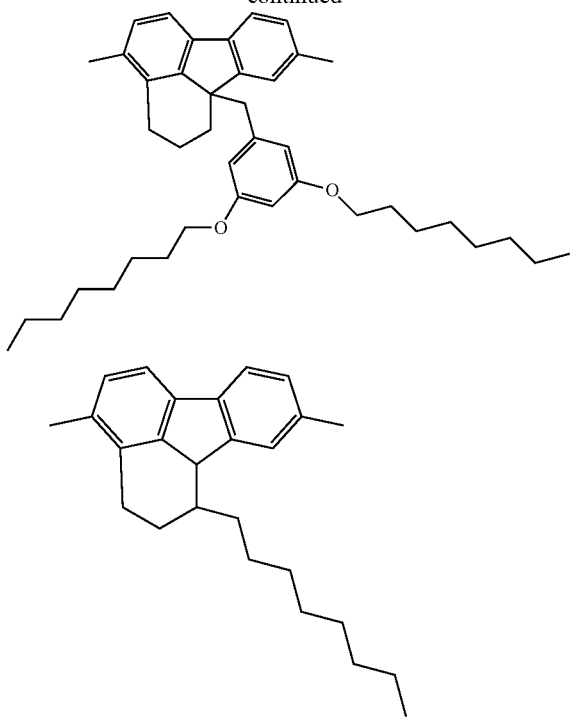
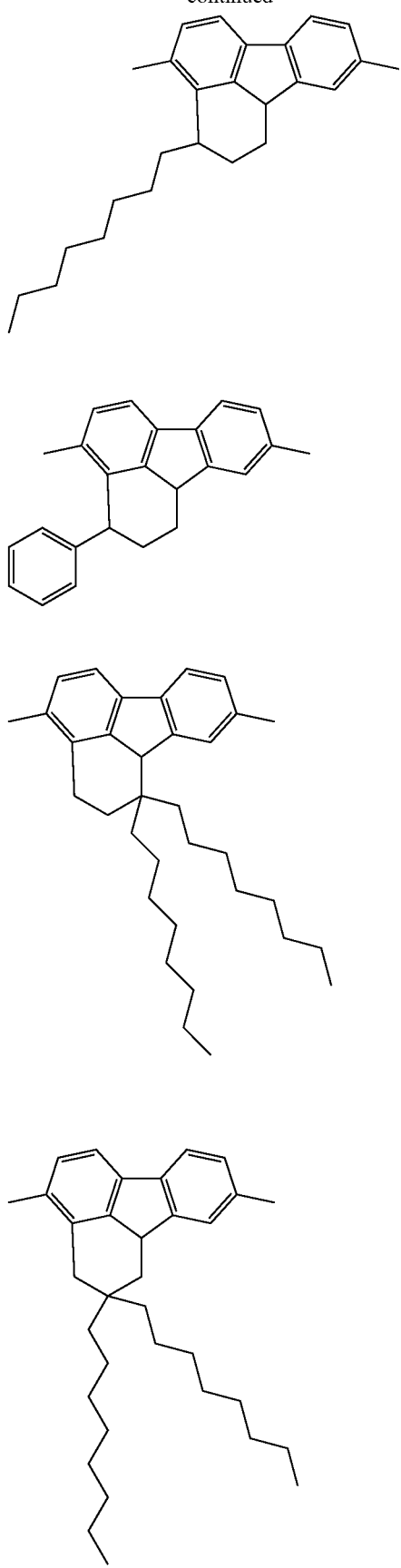

35
-continued
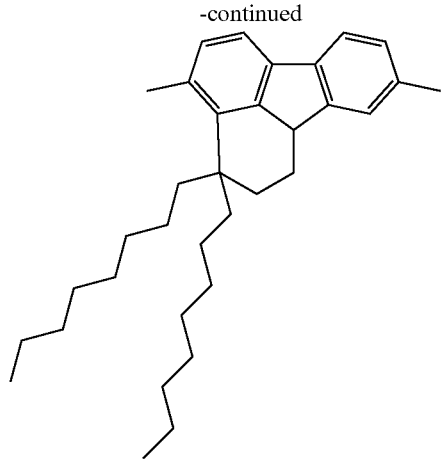
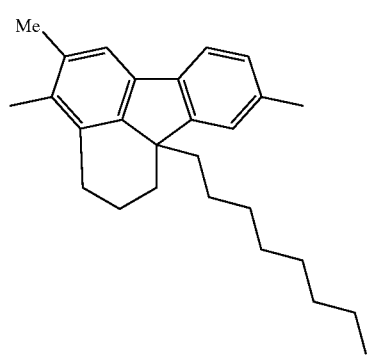
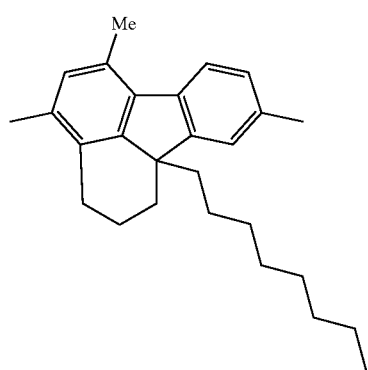
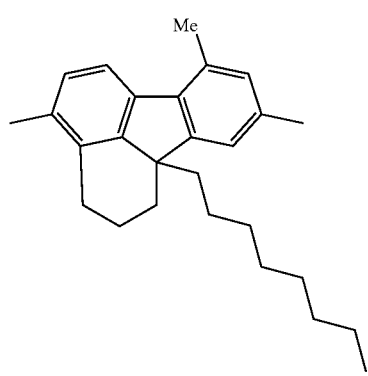
36
-continued
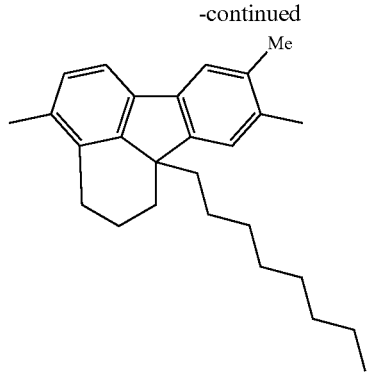
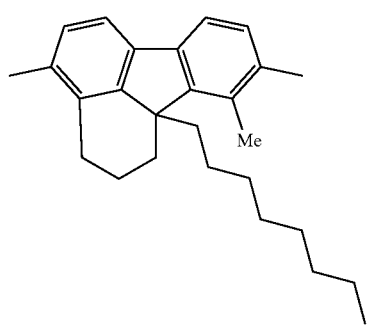
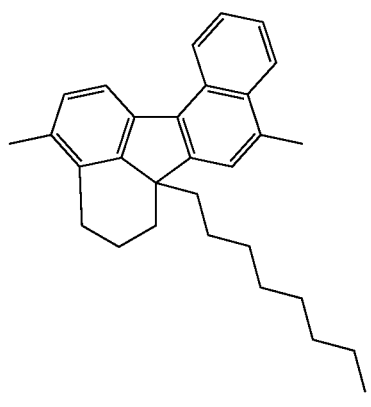
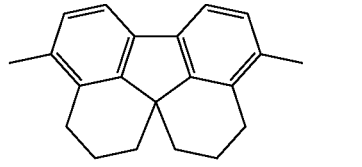

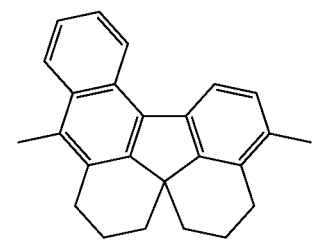
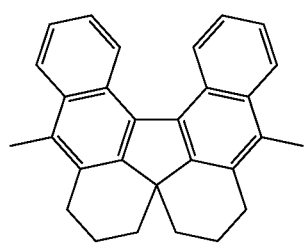
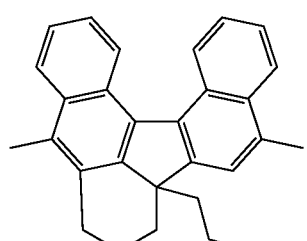
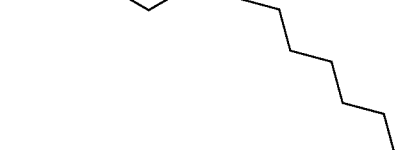
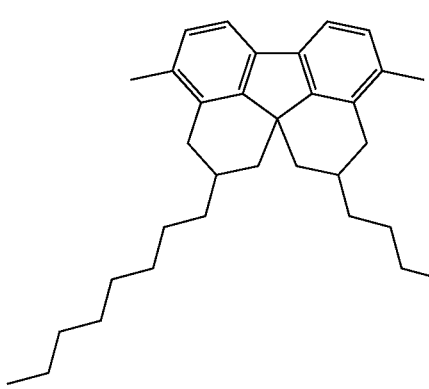
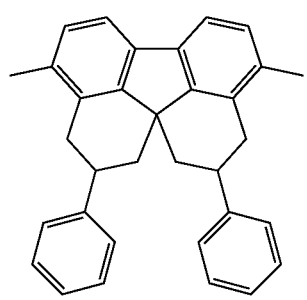
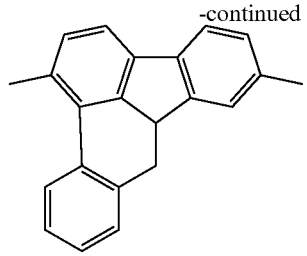
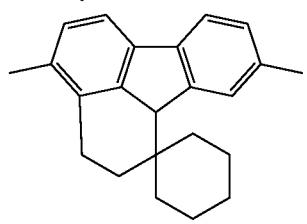
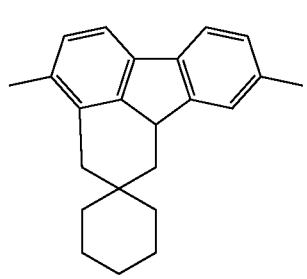
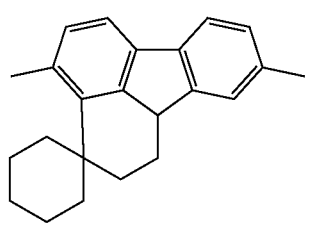
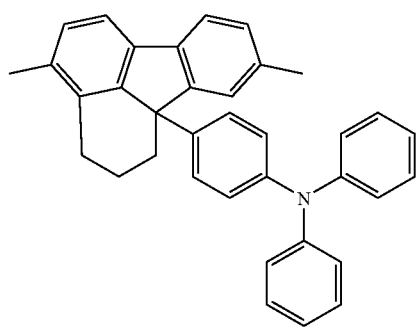
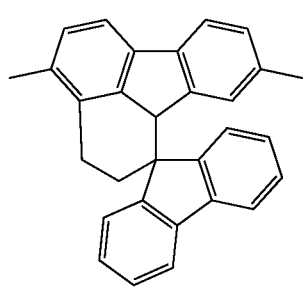

Specific examples of the repeating unit of the above-described formula (4-2) include:
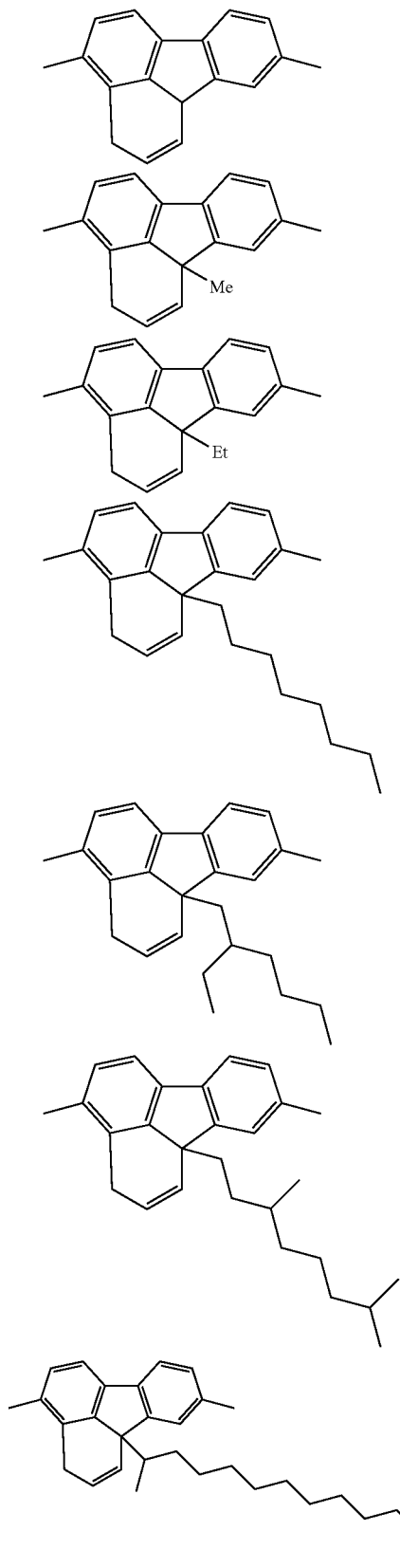
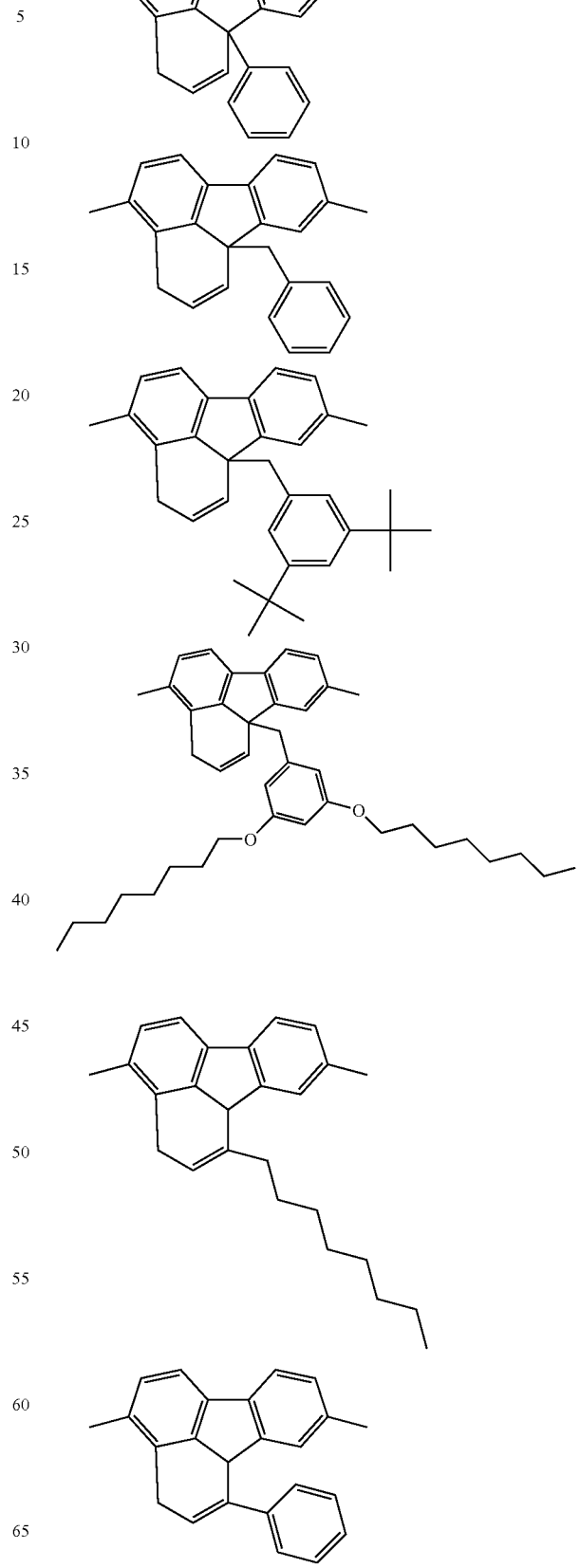

41
-continued
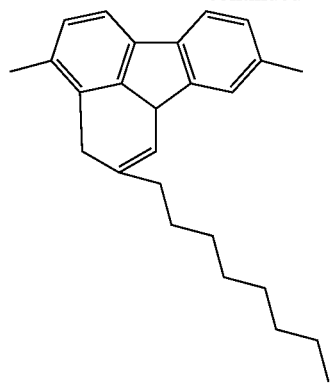
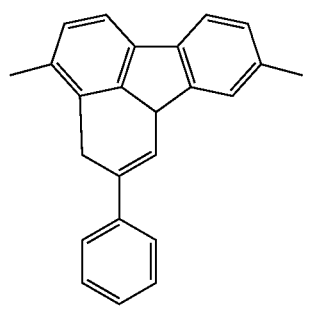
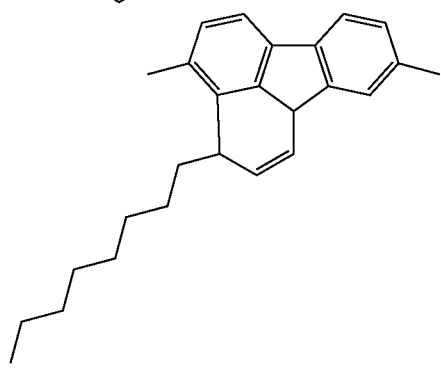
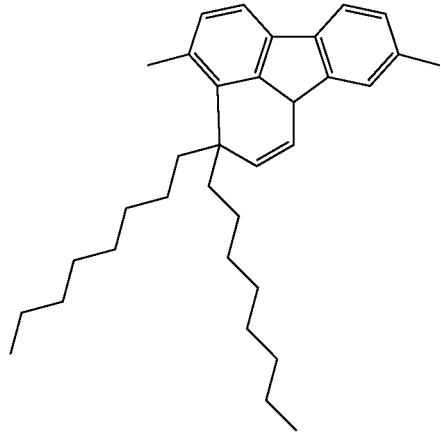
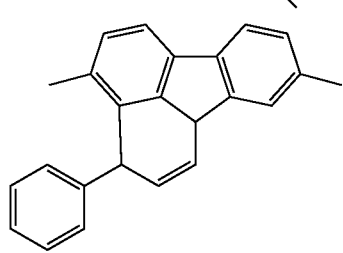
42
-continued
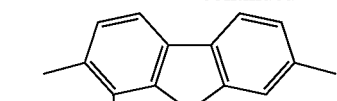
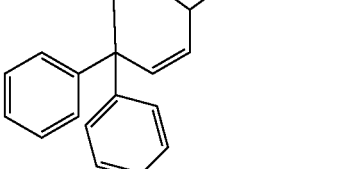
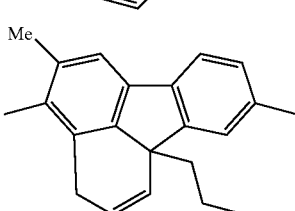
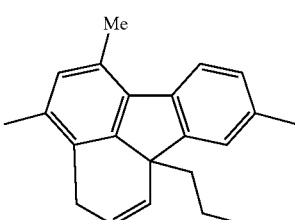
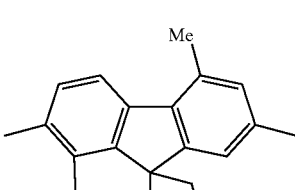
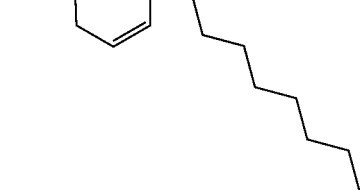
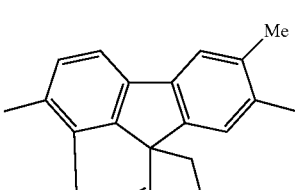
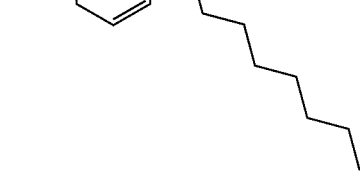

-continued
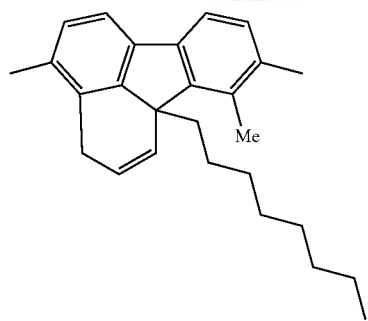
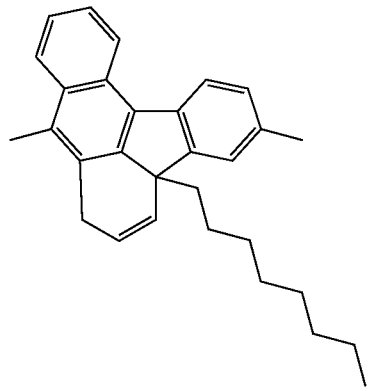
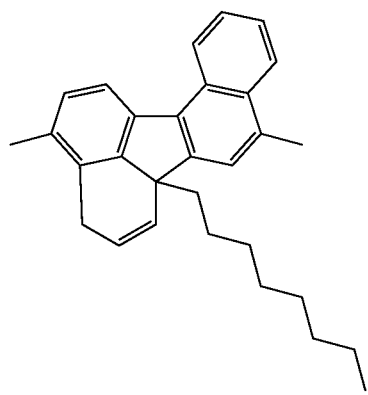
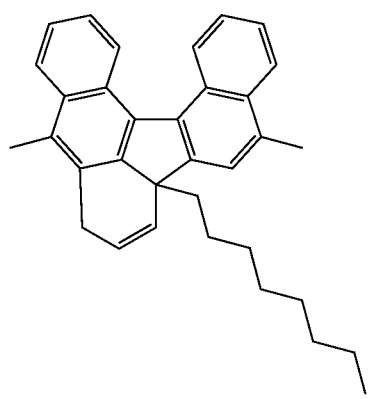
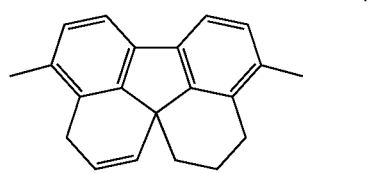
-continued
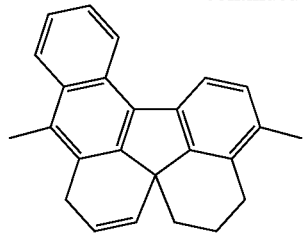
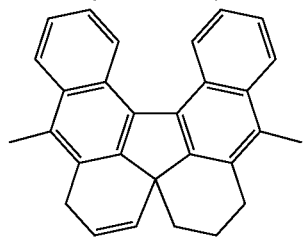
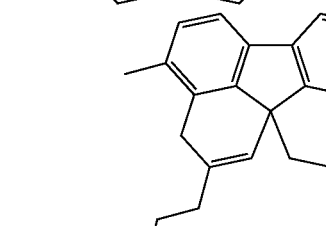
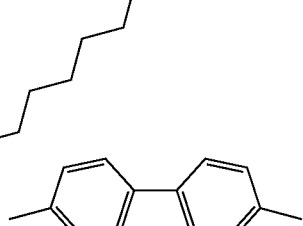
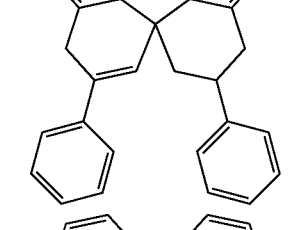
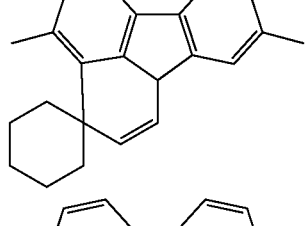
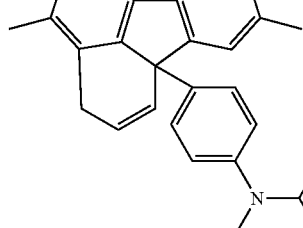
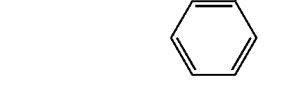

Specific examples of the repeating unit of the above-described formula (4-3) include:
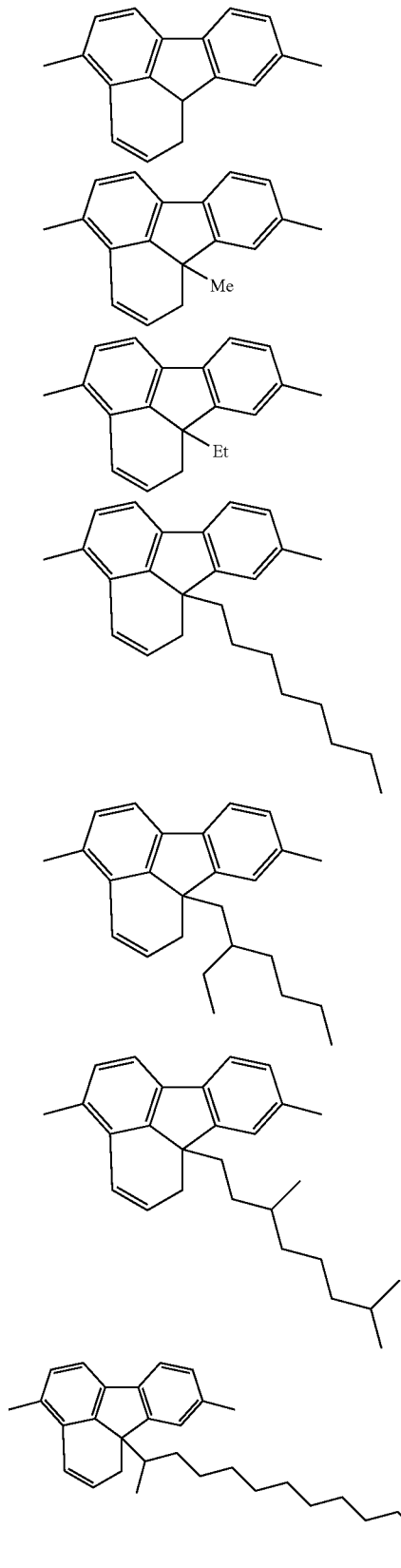
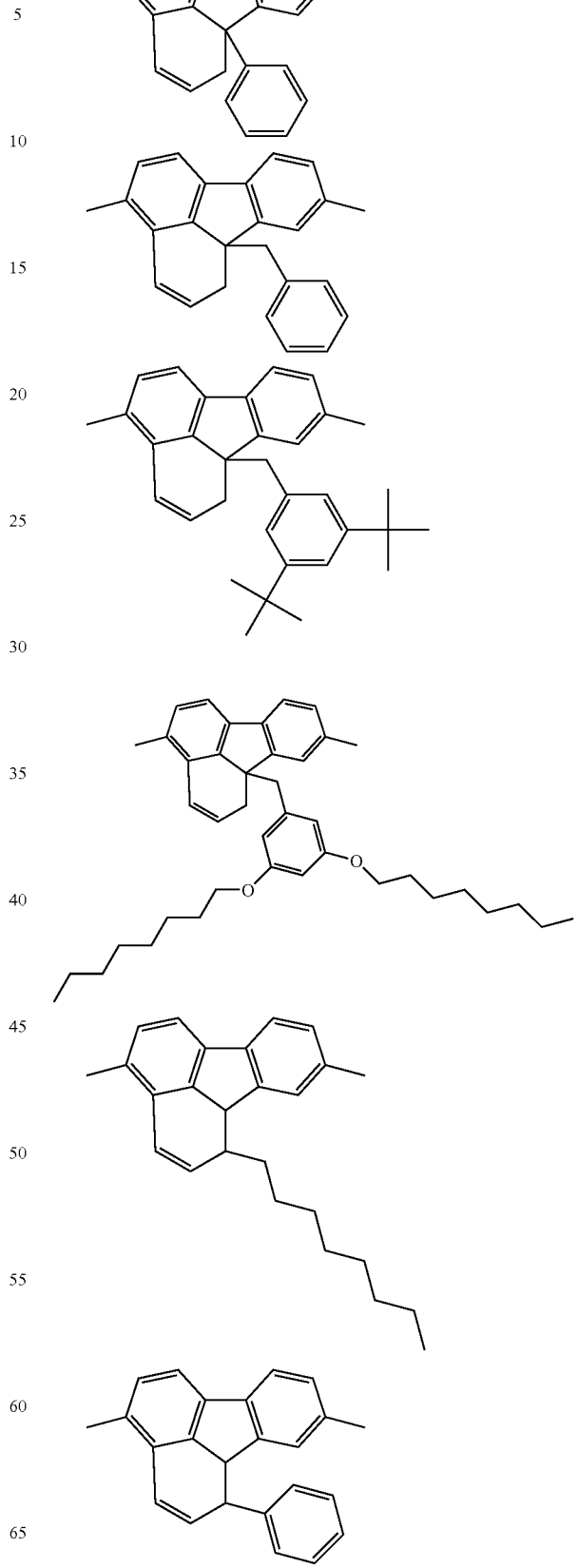

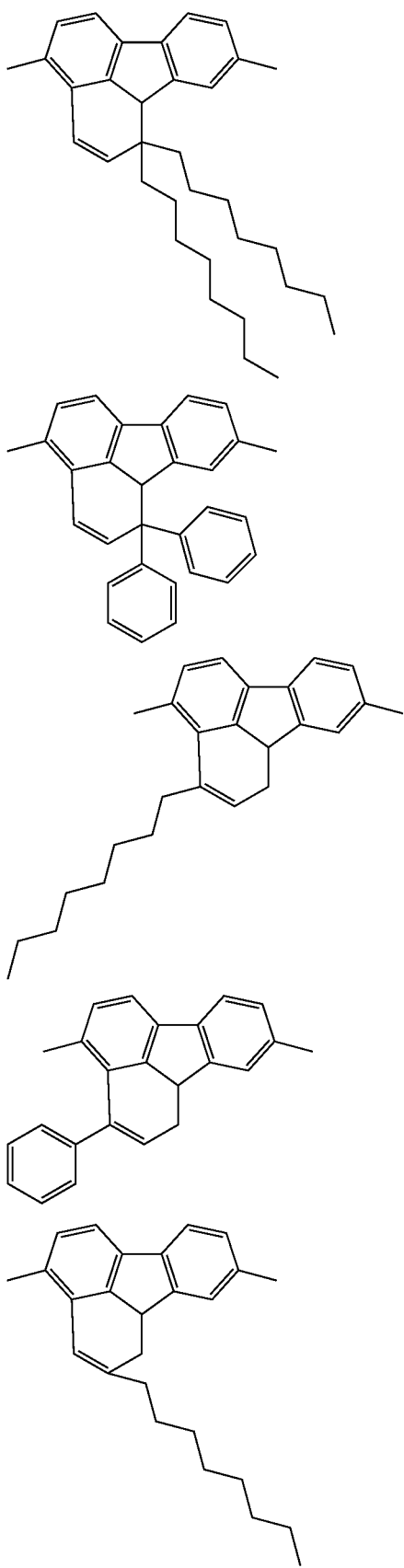
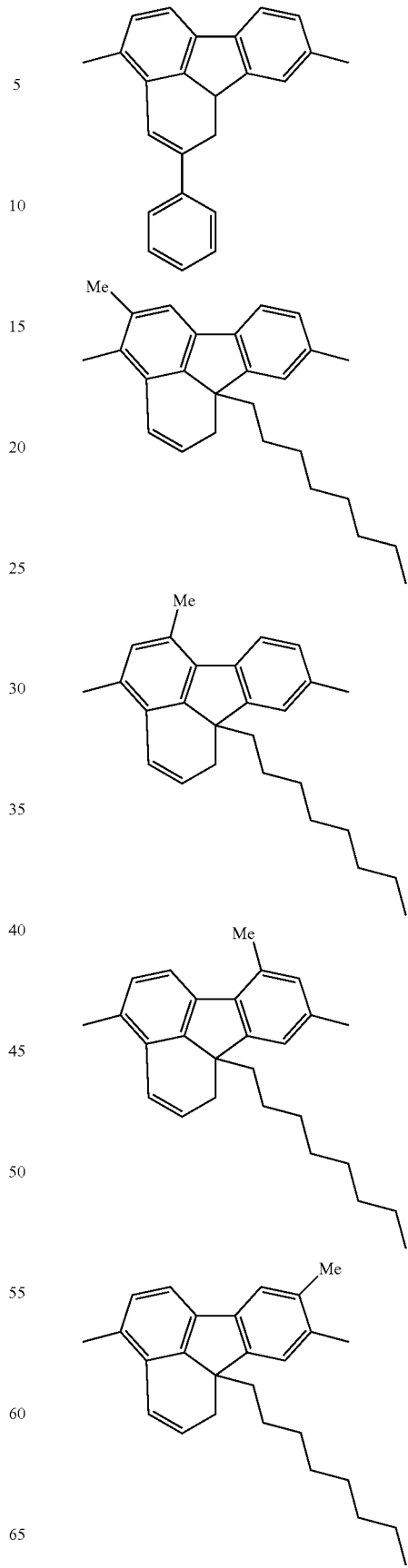

49
-continued
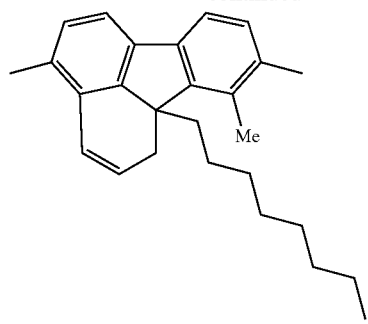
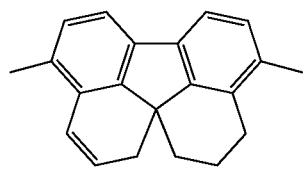
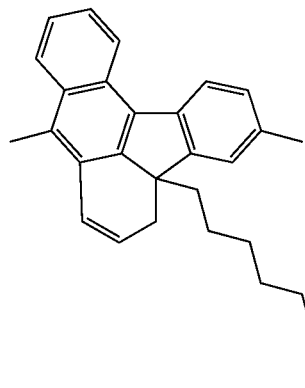
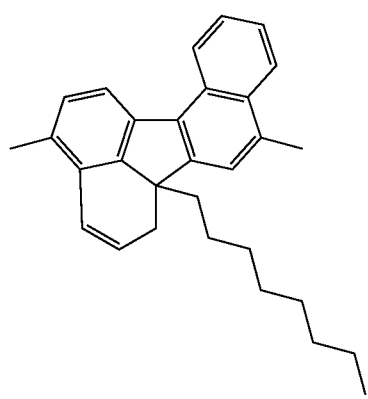
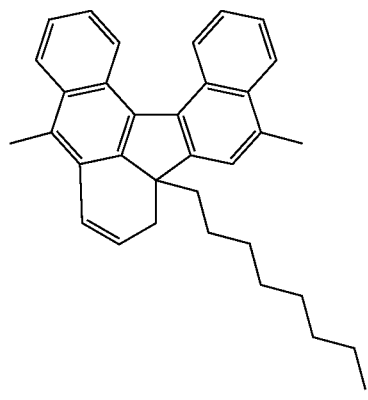
50
-continued
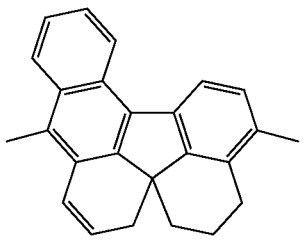
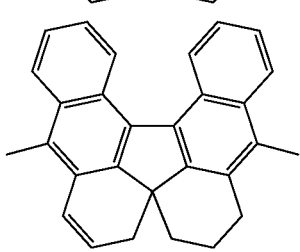
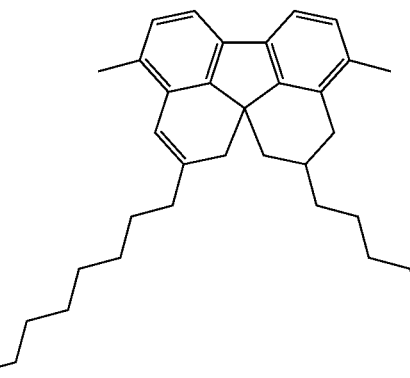
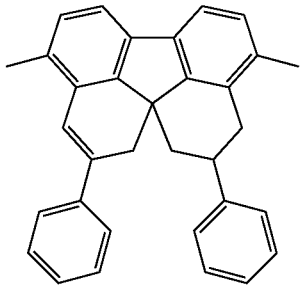
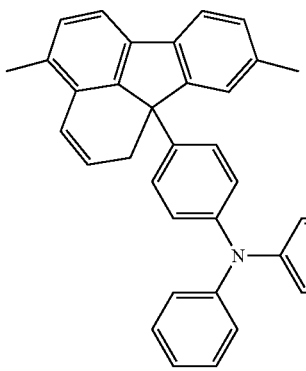

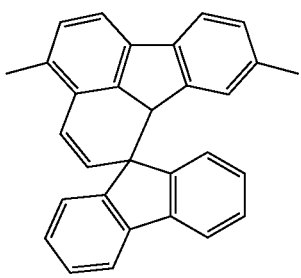
Specific examples of the repeating unit of the above-described formula (4-4) include:
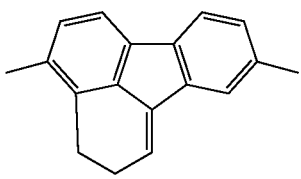
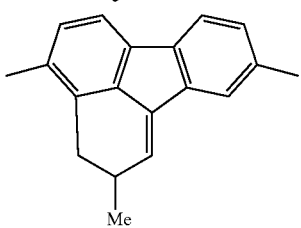
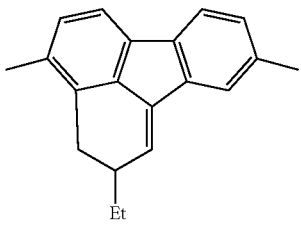
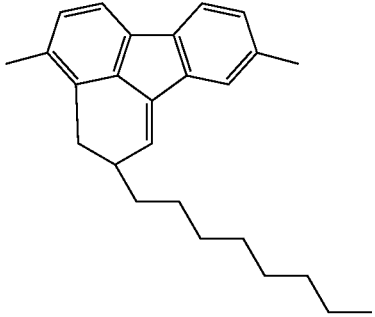
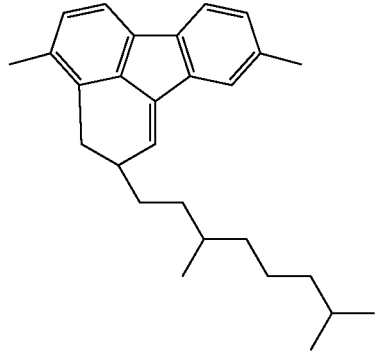
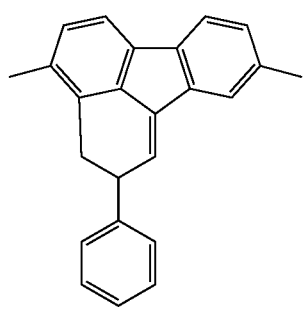
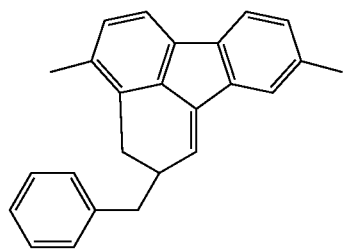
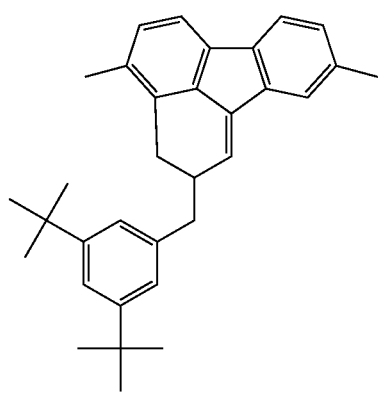

53
-continued
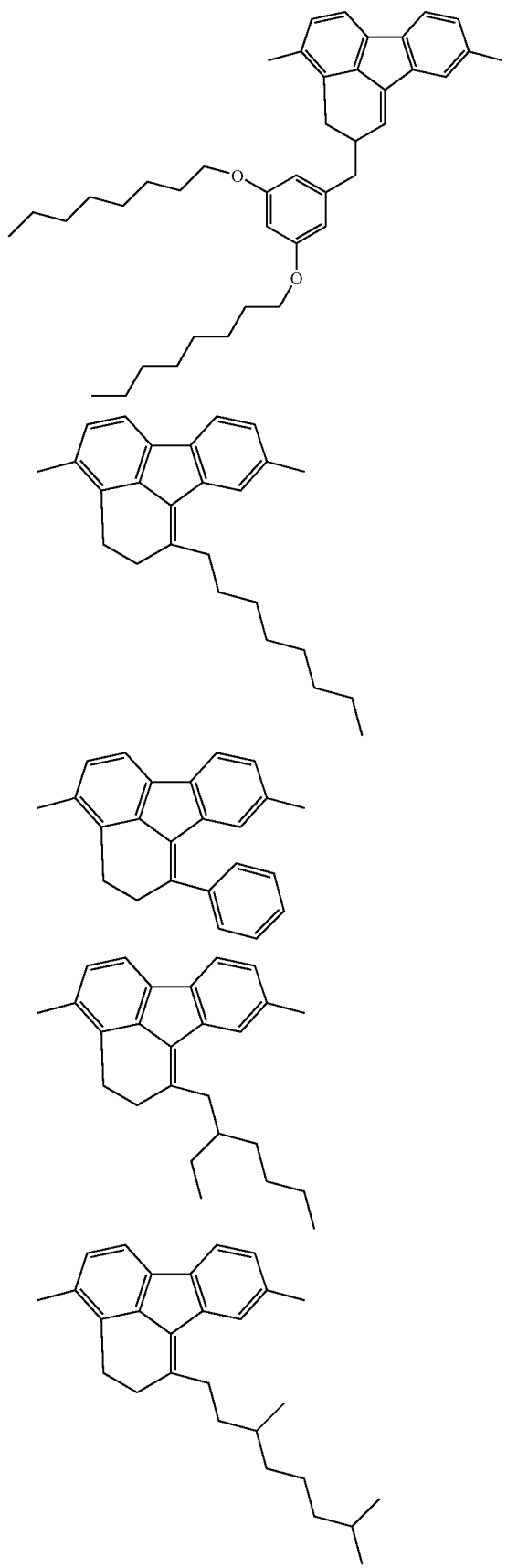
54
-continued
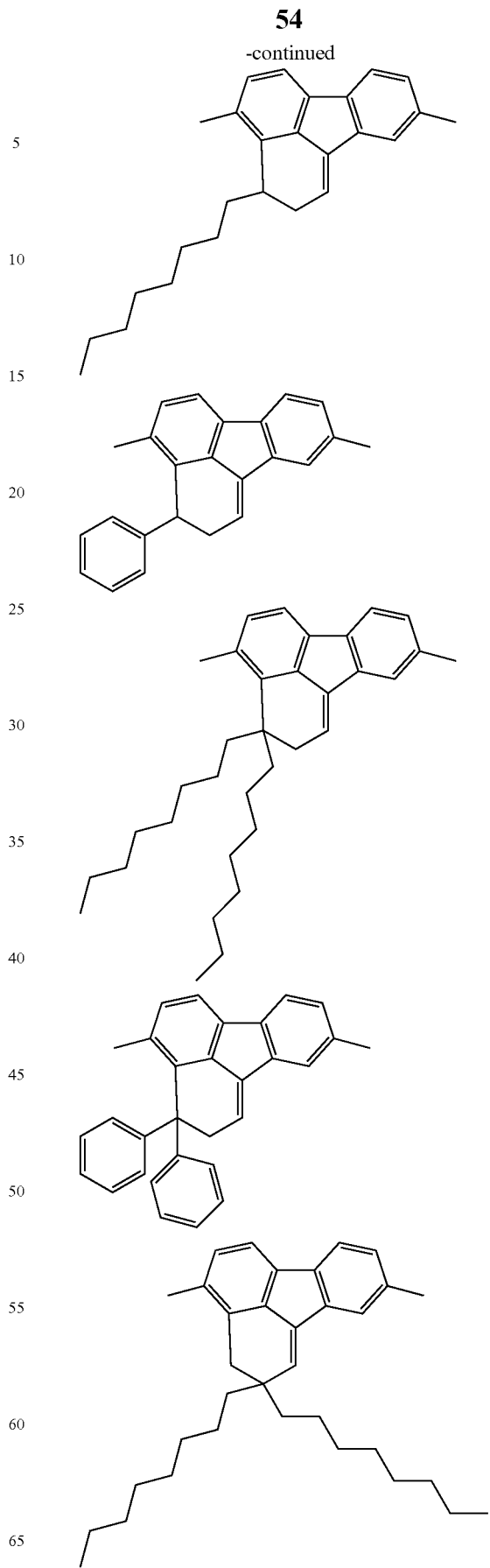

-continued
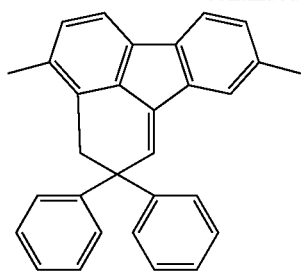
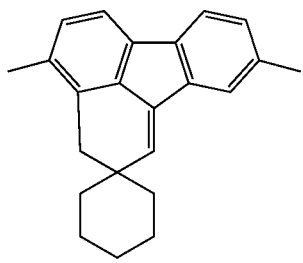
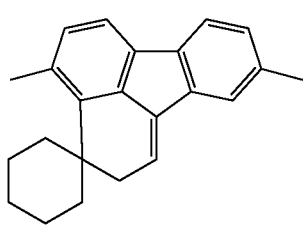
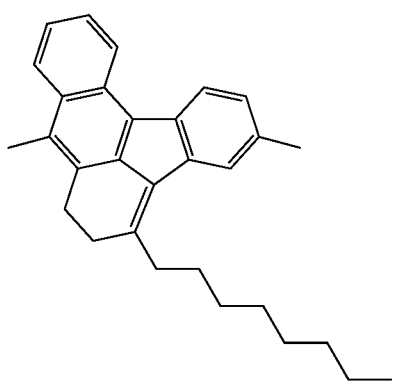
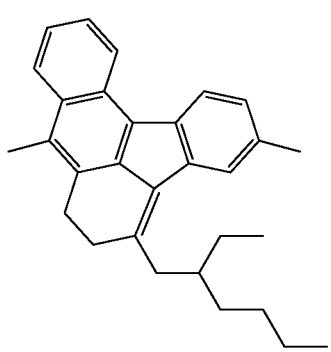
-continued
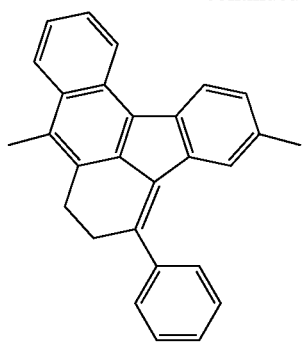
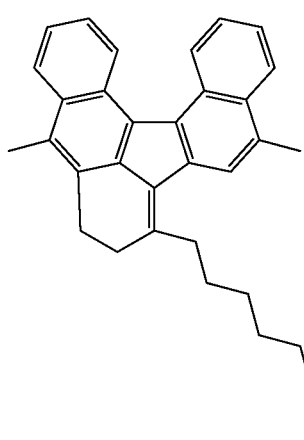
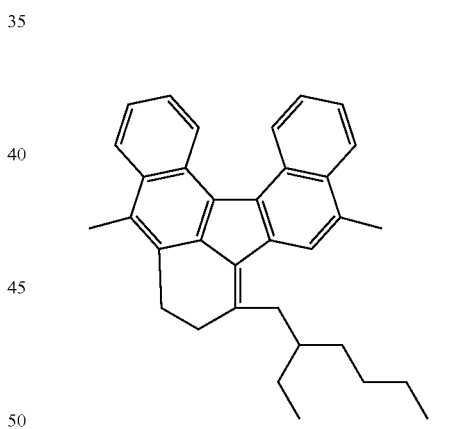
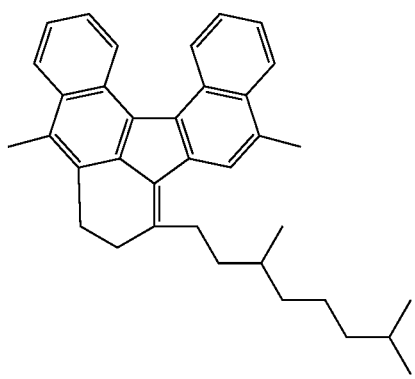

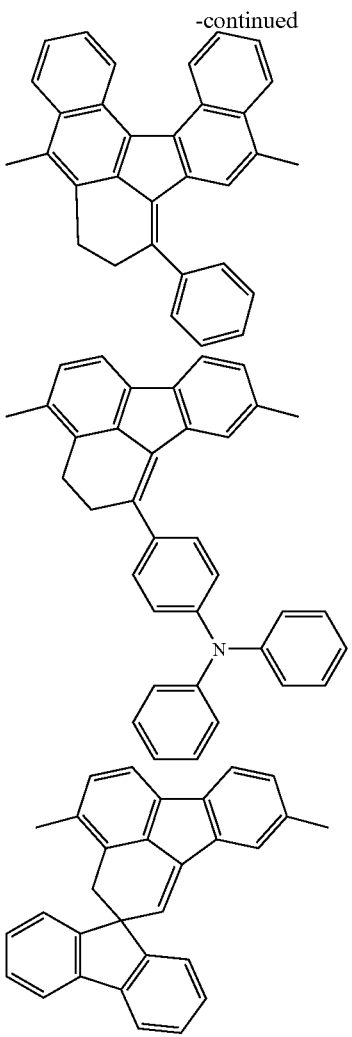

In the formulae, Me represents a methyl group and Et represents an ethyl group, respectively.

The sum of repeating units which are structures of the above-described formulae (1-1), (1-2), (1-3), (2-1), (3-1), (4-1), (4-2), (4-3) and (4-4) is usually 1 mol % or more and 100 mol % or less, preferably 5 mol % or more and 100 mol % or less based on the sum of all repeating units in the polymer compound of the present invention.

The polymer compound of the present invention is preferably a copolymer containing, in addition to repeating units of the above-described formulae (1-1), (1-2), (1-3), (2-1), (3-1), (4-1), (4-2), (4-3) and (4-4), at least one of the other repeating units from the standpoint of variation of light emitting wavelength, from the standpoint of enhancement of light emitting efficiency, from the standpoint of improvement of heat resistance, and the like.

As the repeating units other than the repeating units of the above-described formulae (1-1), (1-2), (1-3), (2-1), (3-1), (4-1), (4-2), (4-3) and (4-4), preferable are repeating units of the following formula (5), (6), (7) or (8):

 (5)

 (6)

 (7)

 (8)

(wherein, $Ar_1$, $Ar_2$, $Ar_3$ and $Ar_4$ represent each independently an arylene group, di-valent heterocyclic group or di-valent group having a metal complex structure. $X_1$, $X_2$ and $X_3$ represent each independently —$CR_9$=$CR_{10}$—, —C≡C—, —N($R_{11}$)— or —(Si$R_{12}R_{13}$)$_m$—. $R_9$ and $R_{10}$ represent each independently a hydrogen atom, alkyl group, aryl group, mono-valent heterocyclic group, carboxyl group, substituted carboxyl group or cyano group. $R_{11}$, $R_{12}$ and $R_{13}$ represent each independently a hydrogen atom, alkyl group, aryl group, mono-valent heterocyclic group, arylalkyl group or substituted amino group. ff represents 1 or 2. m represents an integer of 1 to 12. When there are two or more $R_9$s, two or more $R_{10}$s, two or more $R_{11}$s, two or more $R_{12}$s and two or more $R_{13}$s, respectively, they may be the same or different.).

Here, the arylene group is an atomic group obtained by removing two hydrogen atoms from an aromatic hydrocarbon, and includes those having a condensed ring, and those obtained by bonding of two or more independent benzene rings or condensed rings directly or via a vinylene group and the like. The arylene group may have a substituent.

The substituent includes alkyl groups, alkoxy groups, alkylthio groups, aryl groups, aryloxy groups, arylthio groups, arylakyl groups, arylalkoxy groups, arylalkylthio groups, arylalkenyl groups, arylalkynyl groups, amino group, substituted amino groups, silyl group, substituted silyl groups, halogen atoms, acyl group, acyloxy group, imine residue, amide group, acid imide group, monovalent heterocyclic groups, carboxyl group, substituted carboxyl groups and cyano group.

The number of carbon atoms of a portion an arylene group excepting substituents is usually about 6 to 60, and preferably to 20. The total number of carbon atoms including substituents of an arylene group is usually about 6 to 100.

Examples of the arylene group include phenylene groups (e.g., the following formulae 1 to 3), naphthalene-diyl groups (the following formulae 4 to 13), anthracene-diyl groups (the following formulae 14 to 19), biphenyl-diyl groups (the following formulae 20 to 25), fluorene-diyl groups (the following formulae 36 to 38), terphenyl-diyl groups (the following formulae 26 to 28), condensed ring compound groups (the following formulae 29 to 35), stilbene-diyl groups (the following formulae A to D), distilbene-diyl groups (the following formulae E and F), and the like. Of them, phenylene groups, biphenylene groups, fluorene-diyl groups and stilbene-diyl groups are preferable.

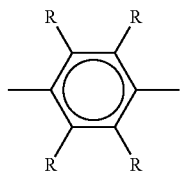

1

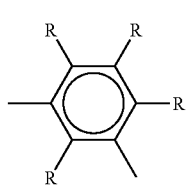

2

-continued
3
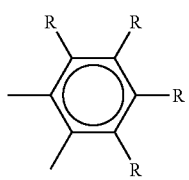
4
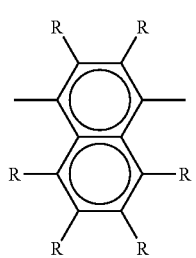
5
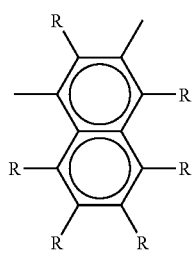
6
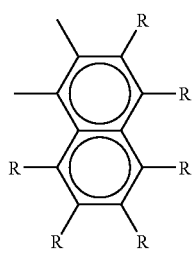
7
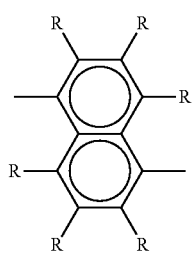
8
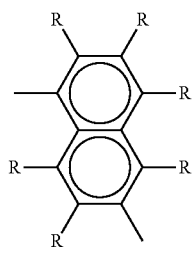
-continued
9
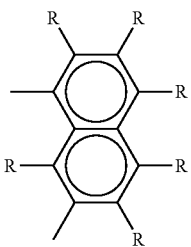
10
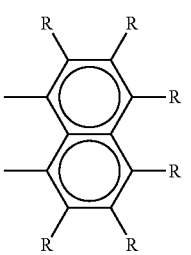
11
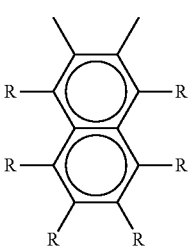
12
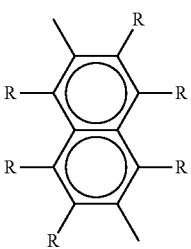
13
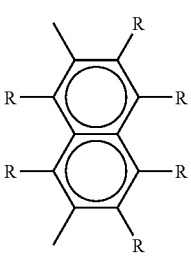
14
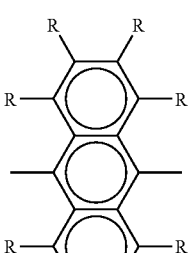

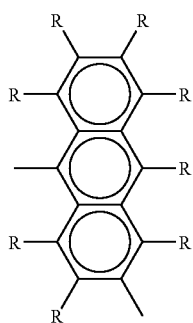
16
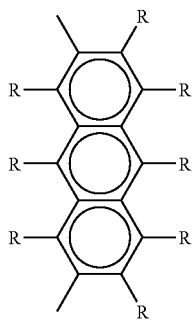
17
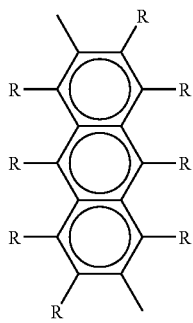
18
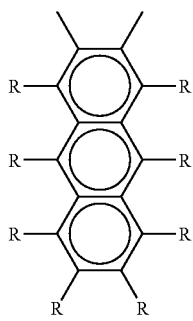
19
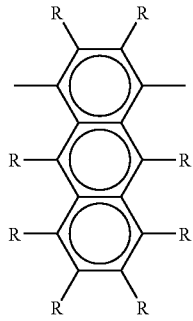
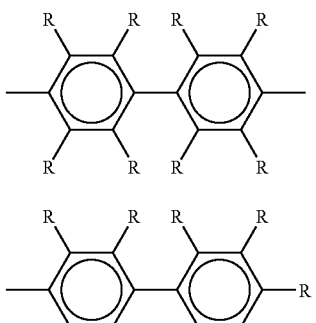
20
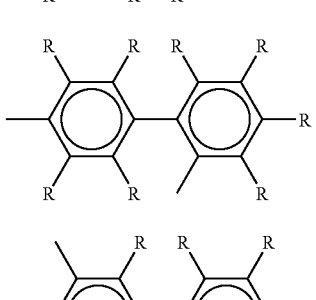
21
22
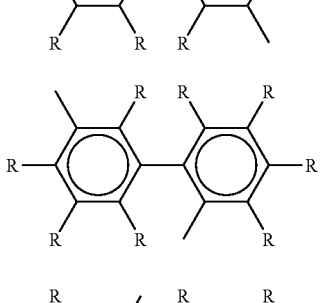
23
24
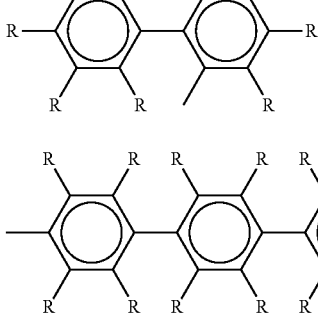
25
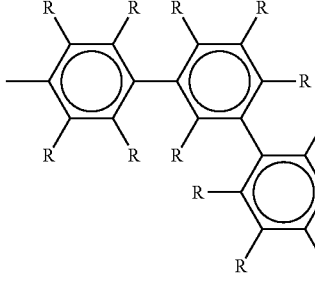
26
27

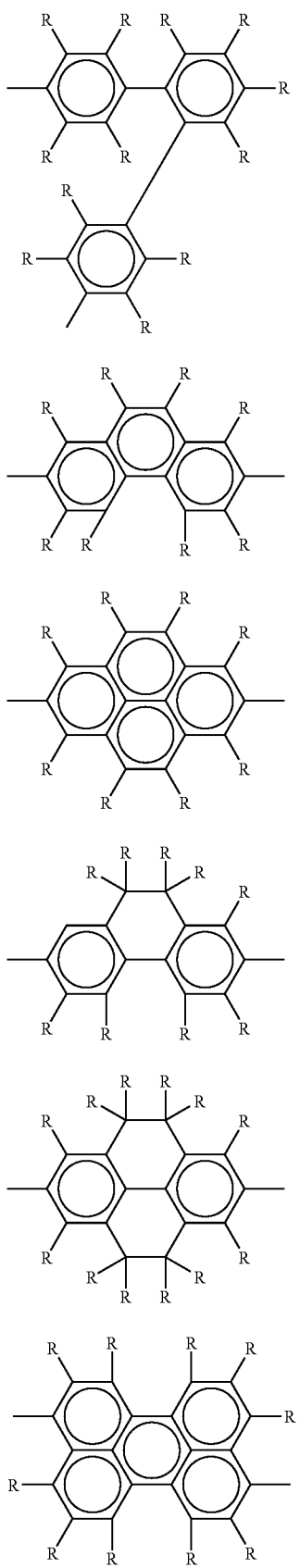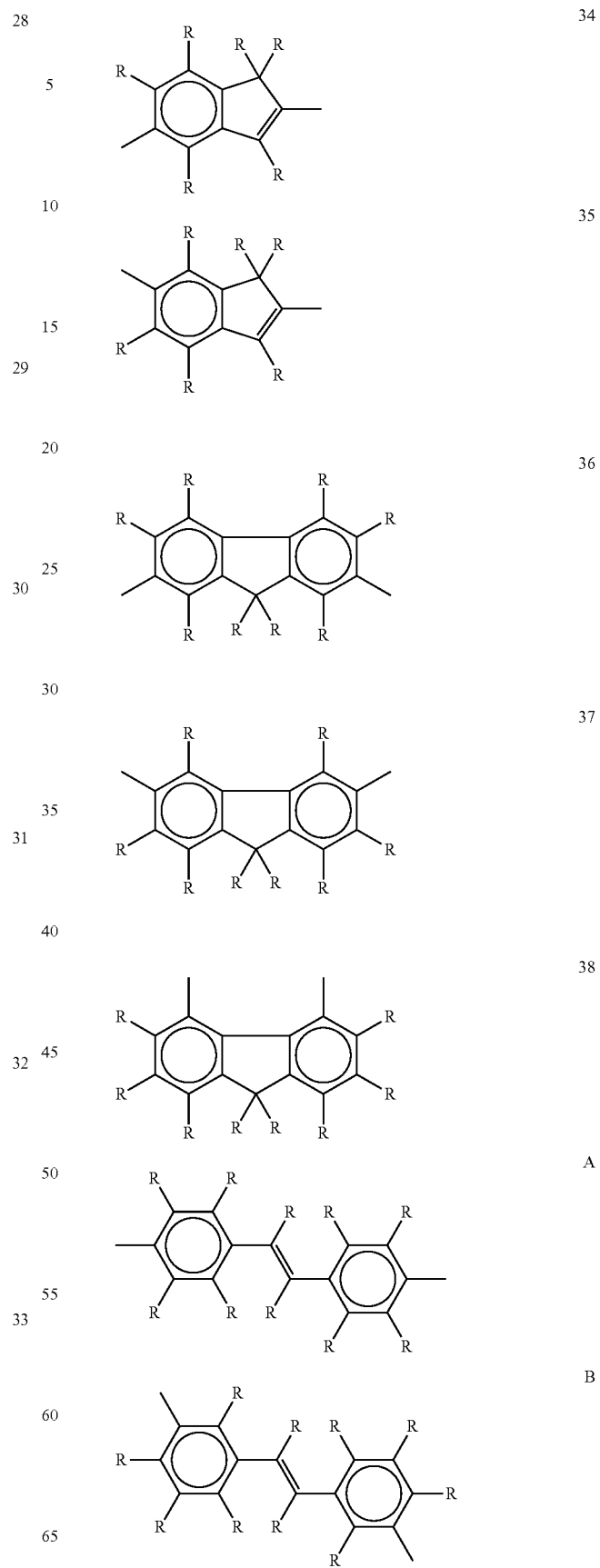

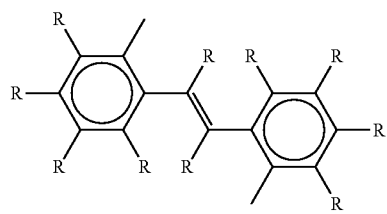

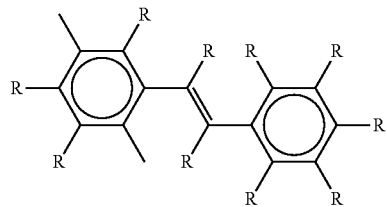

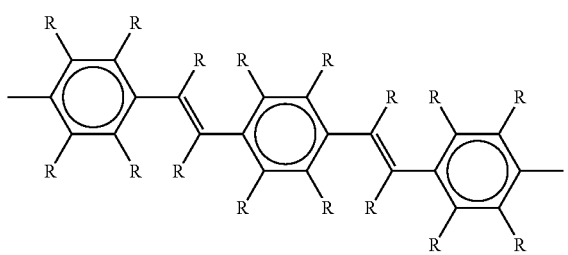

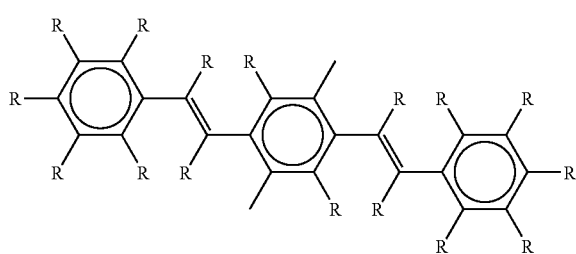

The divalent heterocyclic group $Ar_1$, $Ar_2$, $Ar_3$ or $Ar_4$ means a remaining atomic group obtained by removing two hydrogen atoms from a heterocyclic compound, and may have a substituent. Here, the heterocyclic compound includes organic compounds having a cyclic structure in which elements constituting the ring include not only a carbon atom but also hetero atoms such as oxygen, sulfur, nitrogen, phosphorus, boron, arsenic and the like contained in the ring. Of di-valent heterocyclic groups, preferable are aromatic heterocyclic groups.

The substituent includes alkyl groups, alkoxy groups, alkylthio groups, aryl groups, aryloxy groups, arylthio groups, arylakyl groups, arylalkoxy groups, arylalkylthio groups, arylalkenyl groups, arylalkynyl groups, amino group, substituted amino groups, silyl group, substituted silyl groups, halogen atoms, acyl group, acyloxy group, imine residue, amide group, acid imide group, monovalent heterocyclic groups, carboxyl group, substituted carboxyl groups and cyano group.

The number of carbon atoms of a portion of a divalent heterocyclic group excepting substituents is usually about 3 to 60 The total number of carbon atoms including substituents of a divalent heterocyclic group is usually about 3 to 100.

Examples of the divalent heterocyclic group include the following groups.

Divalent heterocyclic group including nitrogen as a hetero atom; pyridine-dily groups (the following formulae 39 to 44), diazaphenylene groups (the following formulae 45 to 48), quinoline-diyl groups (the following formulae 49 to 63), quinoxaline-diyl groups (the following formulae 64 to 68), acridine-diyl groups (the following formulae 69 to 72), bipyridyl-diyl groups (the following formulae 73 to 75), phenanethroline-dily groups (the following formulae 76 to 78), and the like.

Groups containing silicon, nitrogen, selenium and the like as a hetero atom and having a fluorene structure (the following formulae 79 to 93).

5-membered ring heterocyclic groups containing silicon, nitrogen, sulfur, selenium and the like as a hetero atom (the following formulae 94 to 98).

5-membered ring condensed heterocyclic groups containing silicon, nitrogen, selenium and the like as a hetero atom (the following formulae 99 to 110, 102 to 110).

5-membered ring heterocyclic groups containing silicon, nitrogen, sulfur, selenium and the like as a hetero atom and bonding at a-position of its hetero atom to form a dimer or oligomer (the following formulae 111 to 112).

5-membered ring heterocyclic groups containing silicon, nitrogen, sulfur, selenium and the like as a hetero atom and bonding at a-position of its hetero atom to a phenyl group (the following formulae 113 to 119).

5-membered ring condensed heterocyclic groups containing oxygen, nitrogen, sulfur and the like as a hetero atom and substituted by a phenyl group, furyl group or thienyl group (the following formulae 120 to 125).

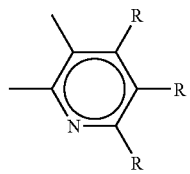

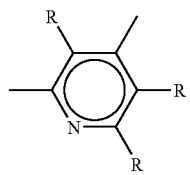

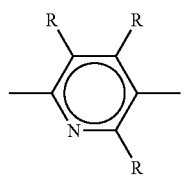

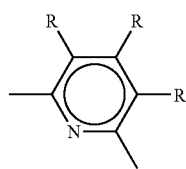

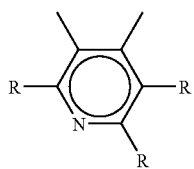
43
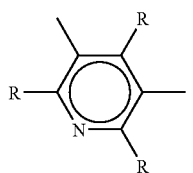
44
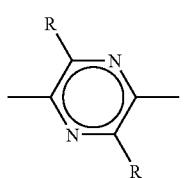
45
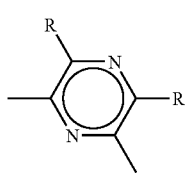
46
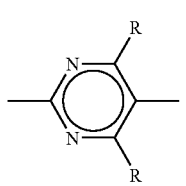
47
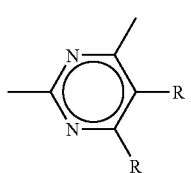
48
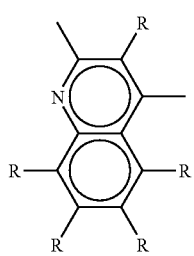
49
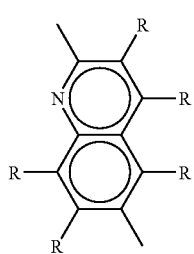
50
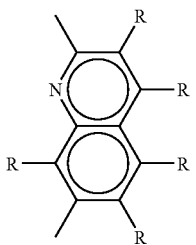
51
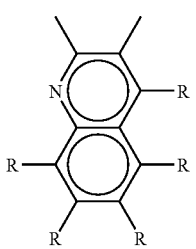
52
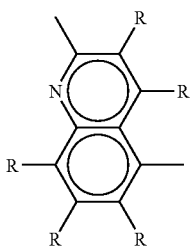
53
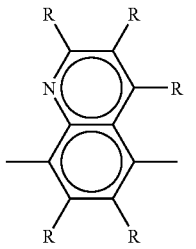
54
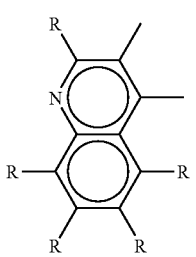
55
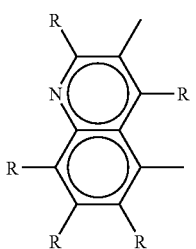
56

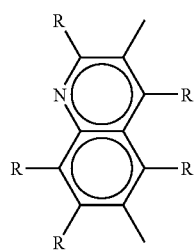
57
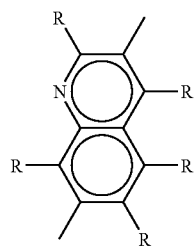
58
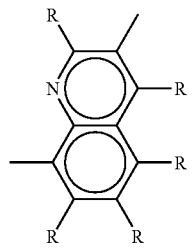
59
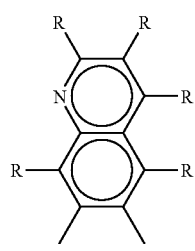
60
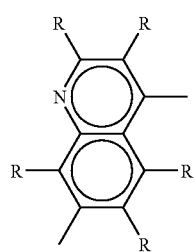
61
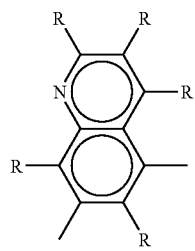
62
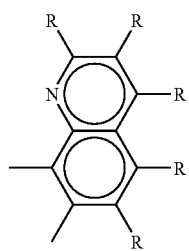
63
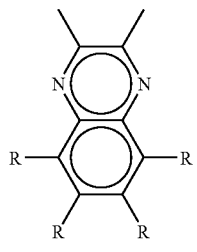
64
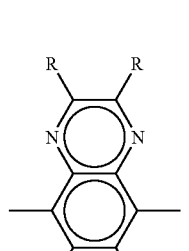
65
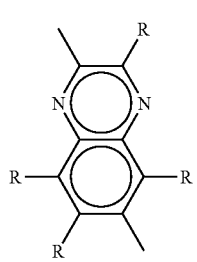
66
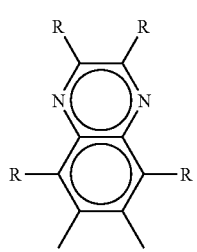
67
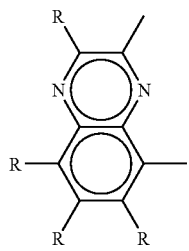
68

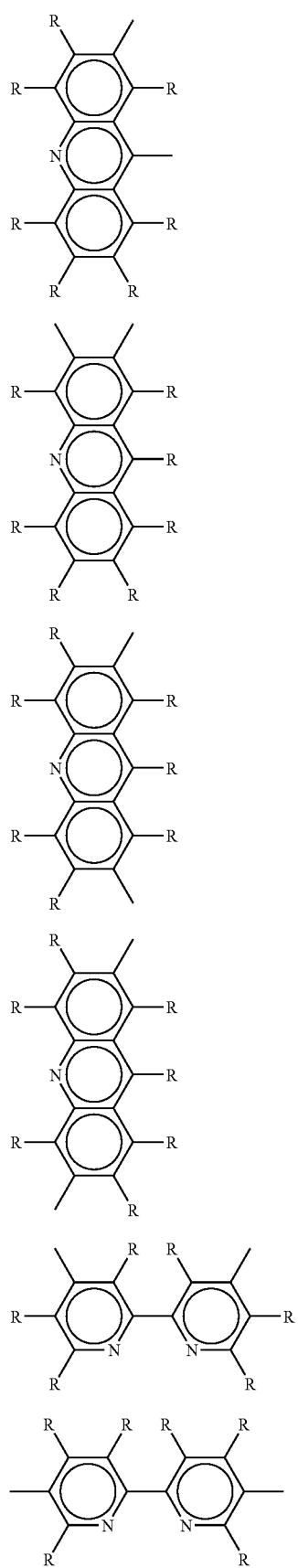
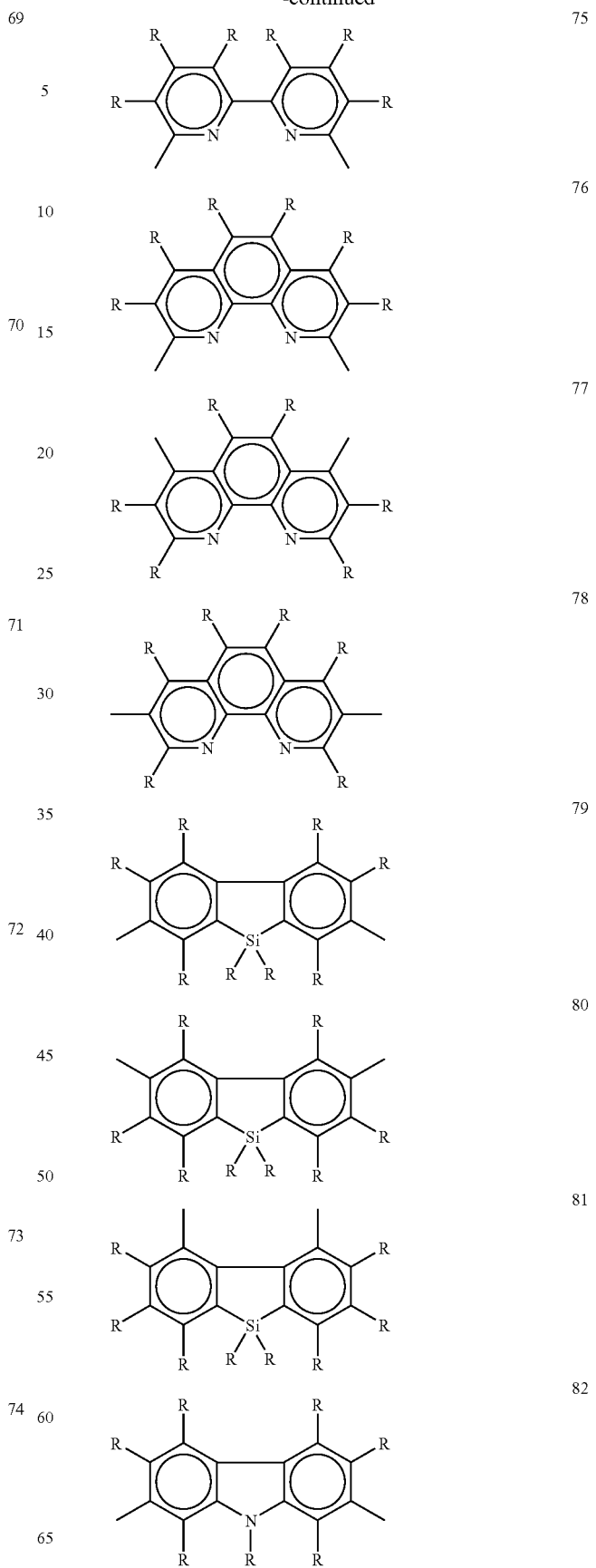

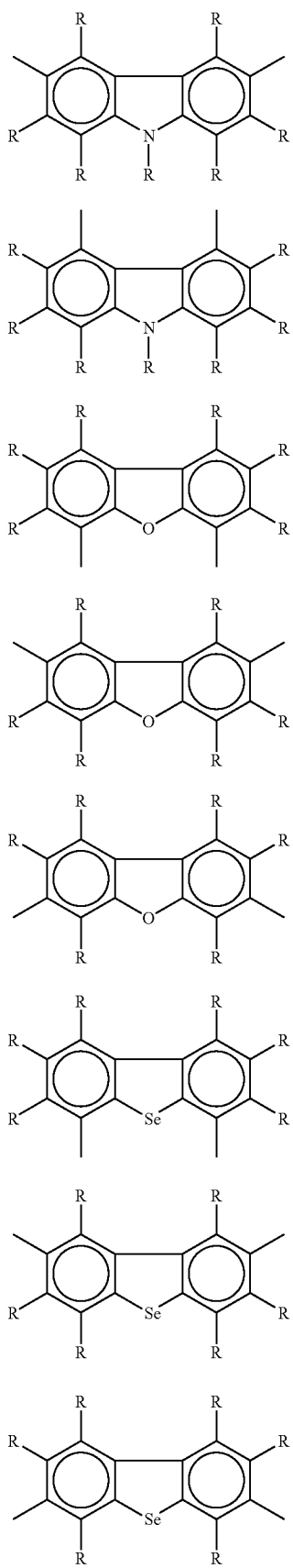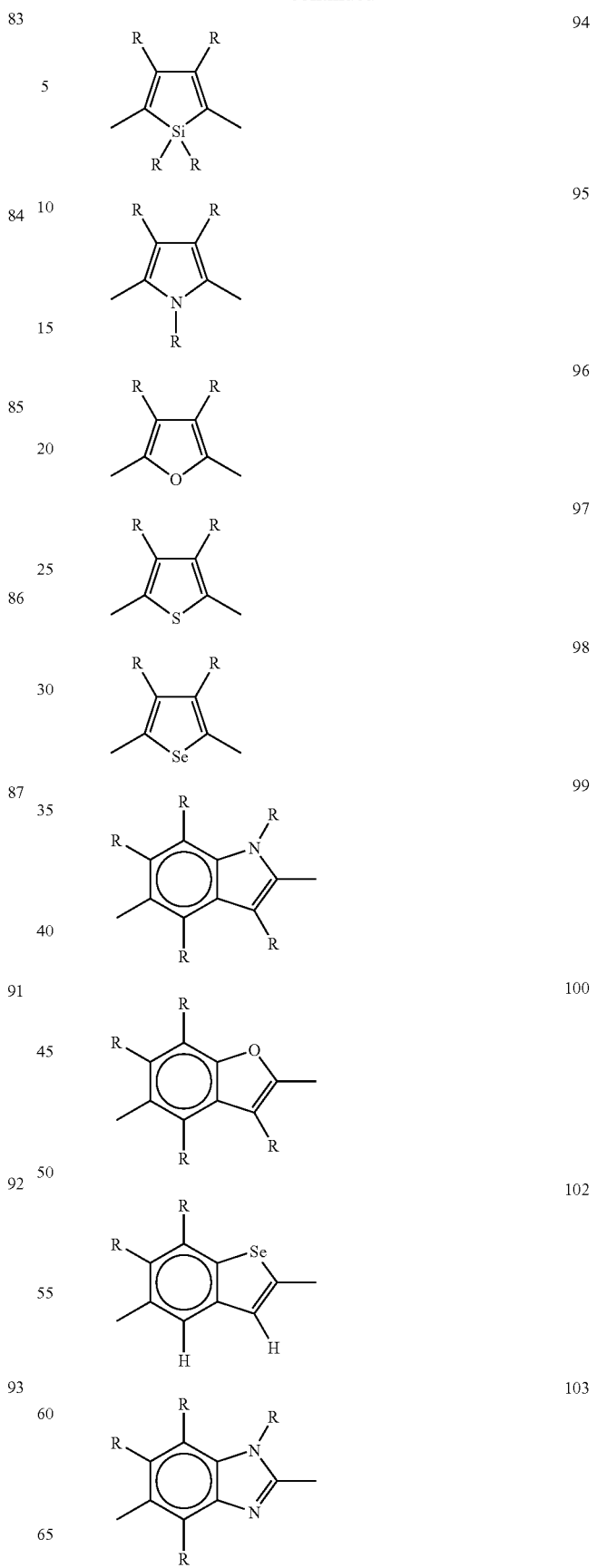

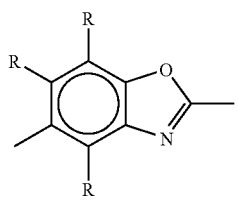
104
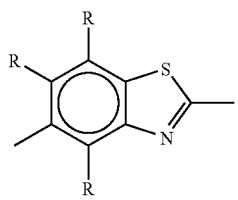
105
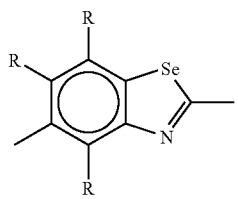
106
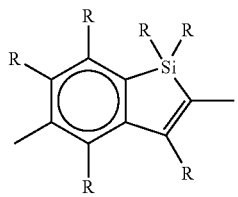
107
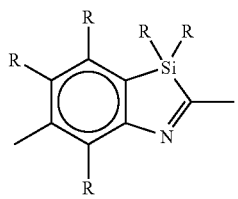
108
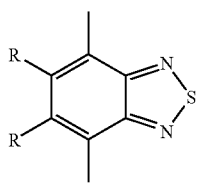
109
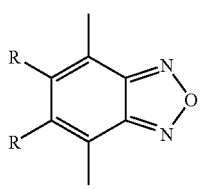
110
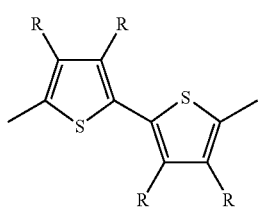
111
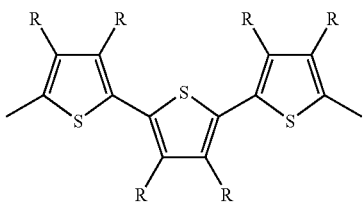
112
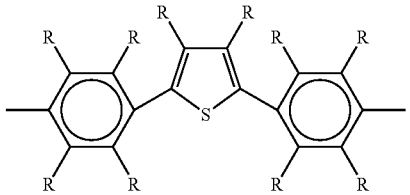
113
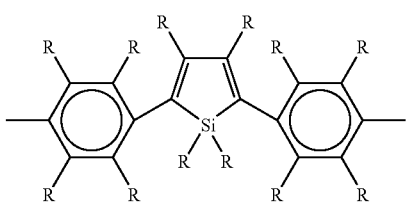
114
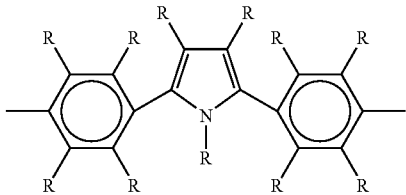
115
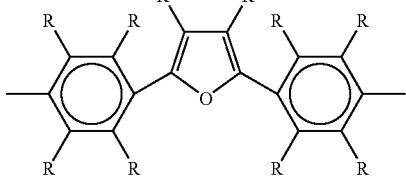
116
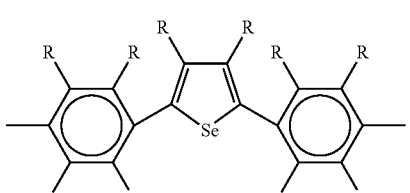
117
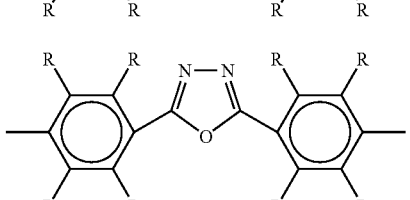
118
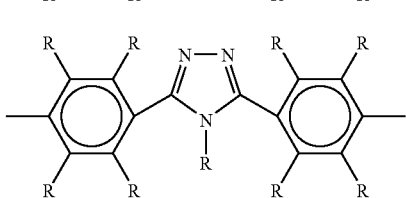
119

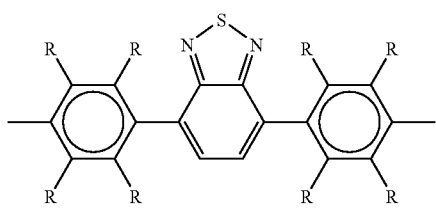

120

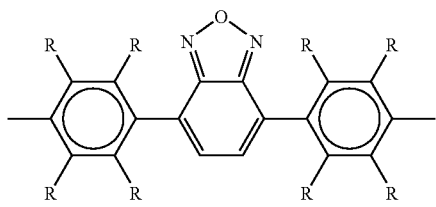

121

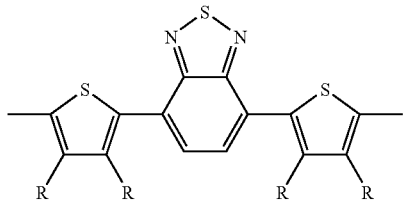

122

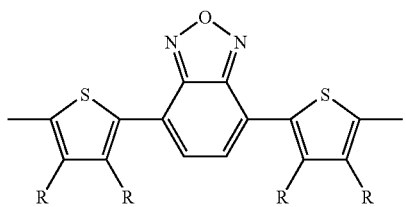

123

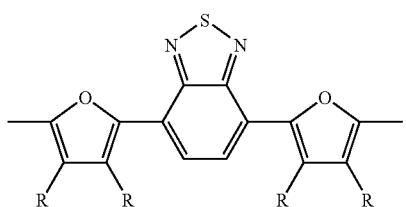

124

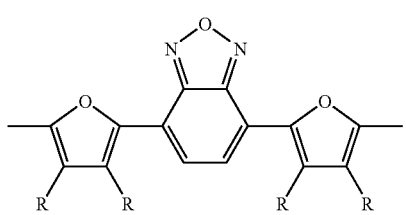

125

The divalent group having a metal complex structure represented by Ar₁, Ar₂, Ar₃ and Ar₄ means a divalent group remaining after removal of two hydrogen atoms from an organic ligand of a metal complex having an organic ligand.

The number of carbon atoms of the organic ligand is usually about 4 to 60, and examples thereof include 8-quinolinol and derivatives thereof, benzoquinolinol and derivatives thereof, 2-phenylpyridine and derivatives thereof, 2-phenyl-benzothiazole and derivatives thereof, 2-phenyl-benzoxazole and derivatives thereof, porphyrin and derivatives thereof, and the like.

Mentioned as the center metal of the complex are, for example, aluminum, zinc, beryllium, iridium, platinum, gold, europium, terbium and the like.

As the metal complex having an organic ligand, mentioned are metal complexes, triplet light emitting complexes and the like known as fluorescent materials or phosphorescent materials of lower molecular weight.

As the divalent group having a metal complex structure, the following groups (126 to 132) are specifically exemplified.

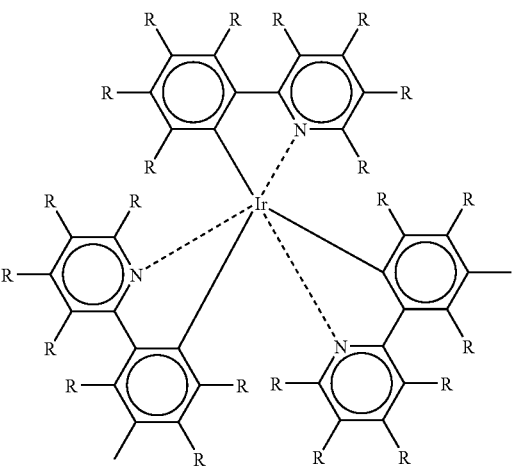

126

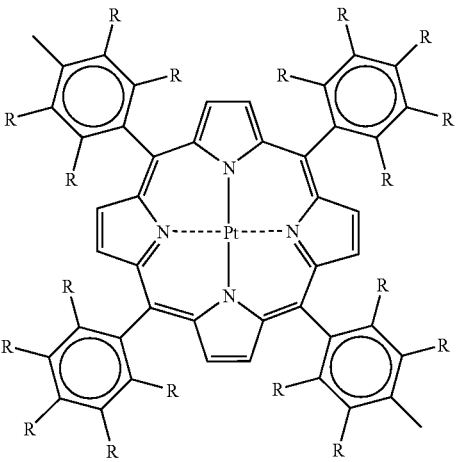

127

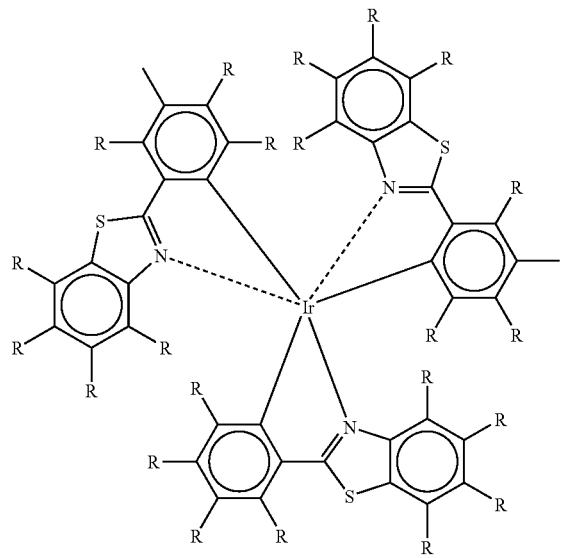

128

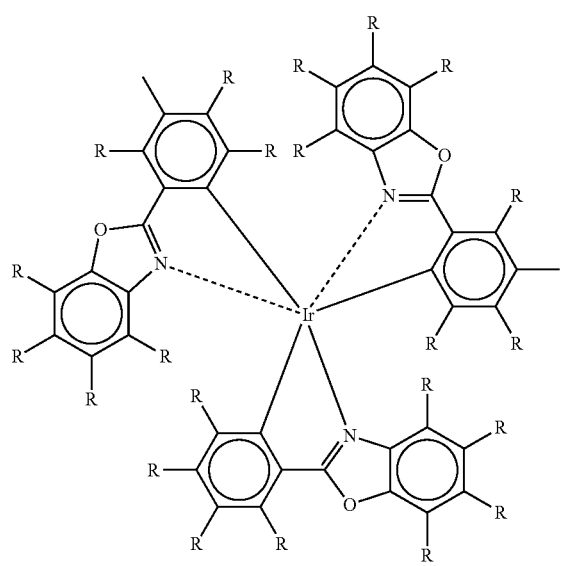

129

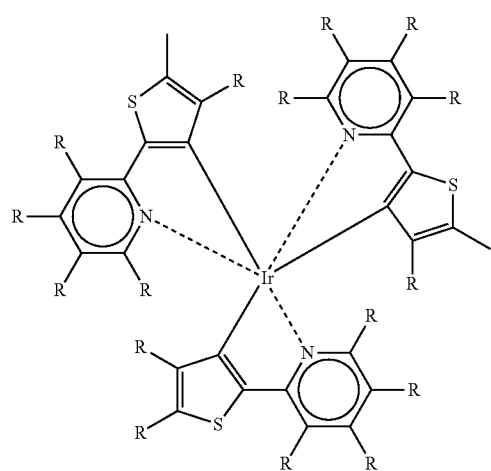

130

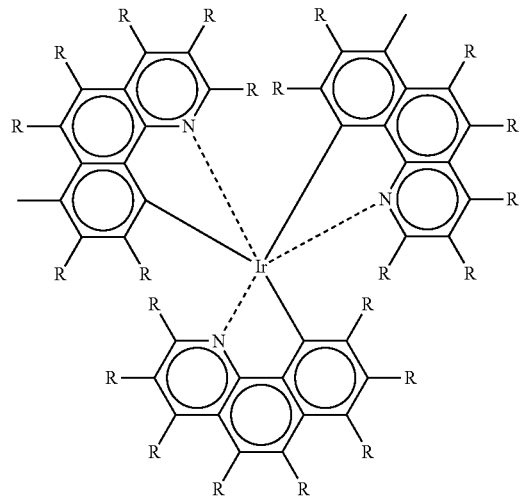

131

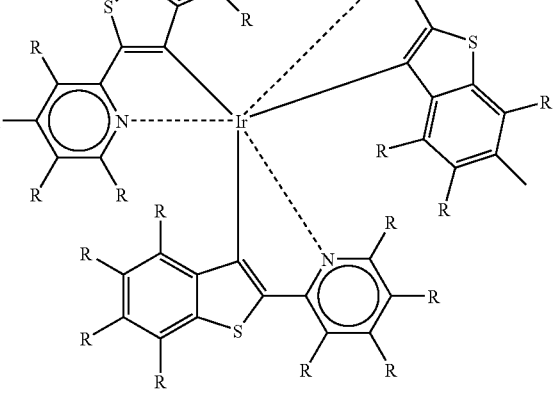

132

In the above-described formulae 1 to 132, Rs represent each independently a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group or cyano group. Carbon atoms in the groups 1 to 132 may be substituted by a nitrogen atom, oxygen atom or sulfur atom, and hydrogen atoms in these groups may be substituted by a fluorine atom.

Further, among the repeating units of the above-described formulae (5), (6), (7) and (8), repeating units of the following formula (9), (10), (11), (12), (13) or (14) are preferable.

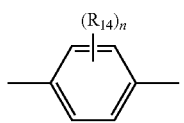
(9)

(wherein, $R_{14}$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. n represents an integer of 0 to 4. When there are two or more $R_{14}$s, they may be the same or different.)

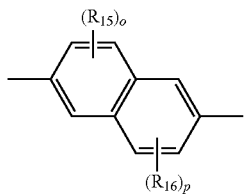
(10)

(wherein, $R_{15}$ and $R_{16}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. o and p represent each independently an integer of 0 to 3. When there are two or more $R_{15}$s and two or more $R_{16}$s, they may be the same or different.)

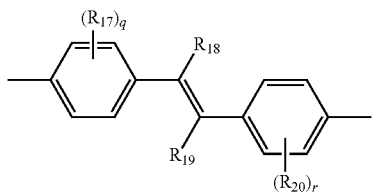
(11)

(wherein, $R_{17}$ and $R_{20}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. q and r represent each independently an integer of 0 to 4. $R_{18}$ and $R_{19}$ represent each independently a hydrogen atom, alkyl group, aryl group, mono-valent heterocyclic group, carboxyl group, substituted carboxyl group or cyano group. When there are two or more $R_{17}$s and two or more $R_{20}$s, they may be the same or different.)

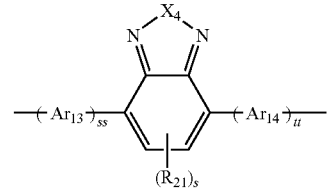
(12)

(wherein, $R_{21}$ represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. s represents an integer of 0 to 2. $Ar_{13}$ and $Ar_{14}$ represent each independently an arylene group, di-valent heterocyclic group or di-valent group having a metal complex structure. ss and tt represent each independently 0 or 1. $X_4$ represents O, S, SO, $SO_2$, Se or Te. When there are two or more $R_{21}$s, they may be the same or different.)

(13)

(wherein, $R_{22}$ and $R_{23}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. t and u represent each independently an integer of 0 to 4. $X_5$ represents O, S, $SO_2$, Se, Te, N—$R_{24}$ or $SiR_{25}R_{26}$. $X_6$ and $X_7$ represent each independently N or C—$R_{27}$. $R_{24}$, $R_{25}$, $R_{26}$ and $R_{27}$ represent each independently a hydrogen atom, alkyl group, aryl group, arylalkyl group or mono-valent heterocyclic group. When there are two or more $R_{22}$s, two or more $R_{23}$s and two or more $R_{27}$s, they may be the same or different.)

Examples of the 5-membered ring at the center of the repeating unit of the formula (11) include thiadiazole, oxadiazole, triazole, thiophene, furan, silole and the like.

(14)

(wherein, $R_{28}$ and $R_{33}$ represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, mono-valent heterocyclic group, carboxyl group, substituted carboxyl group or cyano group. v and w represent each independently an integer of 0 to 4. $R_{29}$, $R_{30}$, $R_{31}$ and $R_{32}$ represent each independently a hydrogen atom, alkyl group, aryl group, mono-valent heterocyclic group, carboxyl group, substituted carboxyl group or cyano group. $Ar_5$ represents an arylene group, di-valent heterocyclic group or di-valent group having a metal complex structure. When there are two or more $R_{28}$s and two or more $R_{33}$s, they may be the same or different.).

Of the repeating units of the above-described formula (6), repeating units of the following formula (15) are preferable from the standpoint of variation of light emitting wavelength, from the standpoint of enhancement of light emitting efficiency and from the standpoint of enhancement of heat resistance.

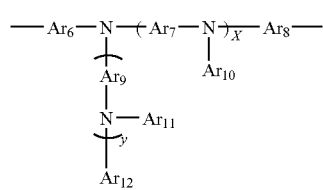
(15)

(wherein, $Ar_6$, $Ar_7$, $Ar_8$ and $Ar_9$ represent each independently an arylene group or di-valent heterocyclic group. $Ar_{10}$, $Ar_{11}$ and $Ar_{12}$ represent each independently an arylene group or mono-valent heterocyclic group. $Ar_6$, $Ar_7$, $Ar_8$, $Ar_9$ and $Ar_{10}$ may have a substituent. x and y represent each independently 0 or 1, and $0 \leq x+y \leq 1$.).

Specific examples of the repeating unit of the above-described formula (15) include those of the following (formulae 133 to 140).

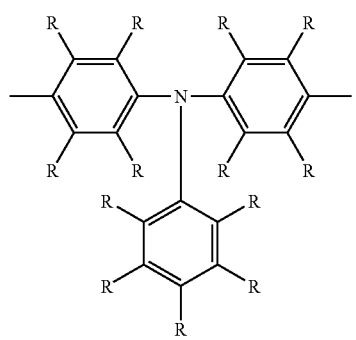
133

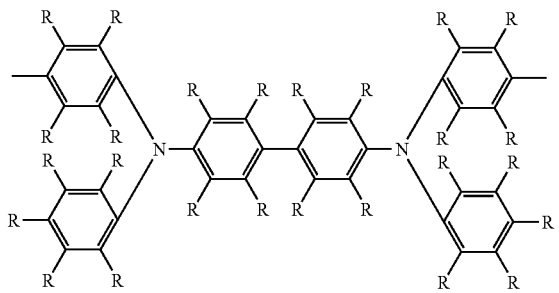
134

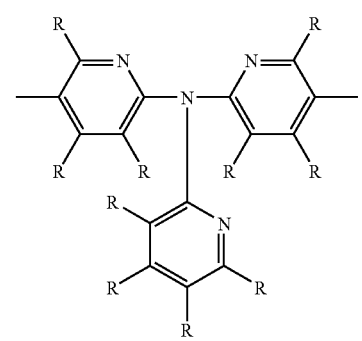
135

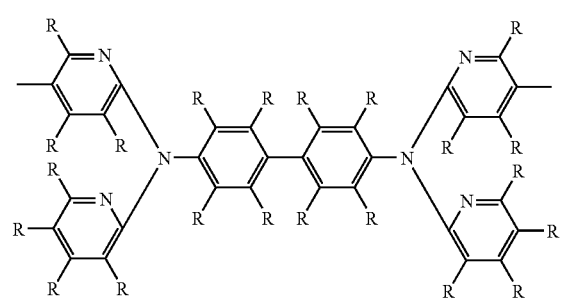
136

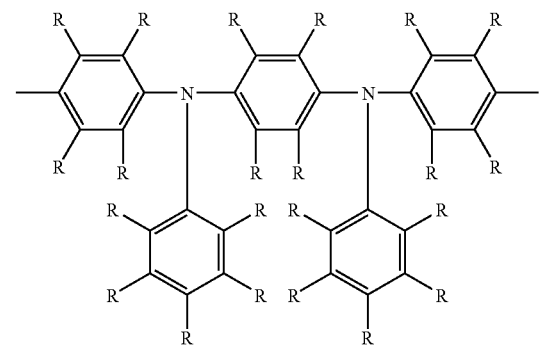
137

-continued

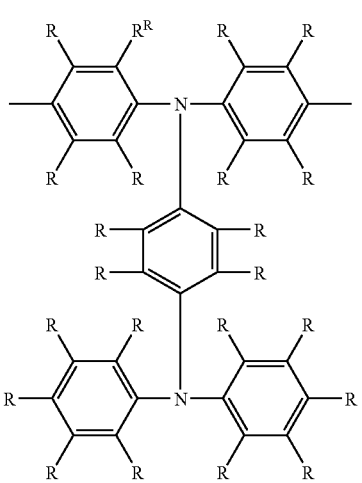

138

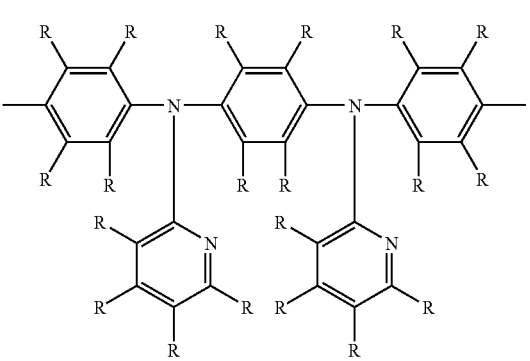

139

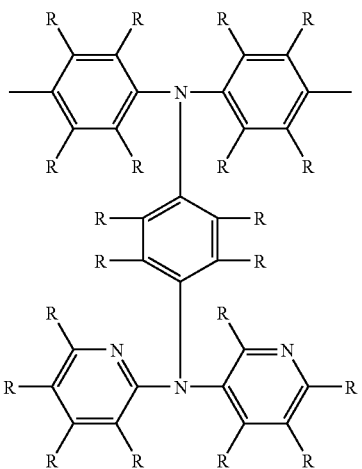

140

In the above-described formulae, Rs are the same as in the above-described formulae 1 to 132.

For enhancing solubility in organic solvents, it is preferable that one or more substituents other than a hydrogen atom are contained and it is preferable that symmetry of the shape of a repeating unit containing substituents is poor.

When Rs contain an alkyl in the above-mentioned formulae, it is preferable, for enhancing solubility of the polymer compound in organic solvents, that one or more Rs contain a cyclic or branched alkyl.

Further, when Rs contain partially an aryl group or heterocyclic group in the above-mentioned formulae, these groups may further have at least one substituent.

Of repeating units of the above-described formula (15), preferable are those in which $Ar_6$, $Ar_7$, $Ar_8$ and $Ar_9$ represent each independently an arylene group and $Ar_{10}$, $Ar_{11}$ and $Ar_{12}$ represent each independently an aryl group from the standpoint of regulation of light emitting wavelength and from the standpoint of device properties and the like.

It is preferable that $Ar_6$, $Ar_7$ and $Ar_8$ represent each independently an unsubstituted phenylene group, unsubstituted biphenyl group, unsubstituted naphthylene group or unsubstituted anthracenediyl group.

From the standpoint of solubility, light emitting efficiency and stability, $Ar_{10}$, $Ar_{11}$ and $Ar_{12}$ represent each independently preferably an aryl group having three or more substituents, more preferably a phenyl group having three or more substituents, naphthyl group having three or more substituents or anthranyl group having three or more substituents, further preferably a phenyl group having three or more substituents.

Among others, preferable are those in which $Ar_{10}$, $Ar_{11}$ and $Ar_{12}$ represent each independently the following formula (15-1).

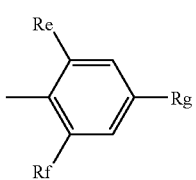

(15-1)

(wherein, Re, Rf and Rg represent each independently an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group, substituted silyloxy group, monovalent heterocyclic group or halogen atom.).

In the repeating unit of the above-described formula (15), $Ar_7$ preferably represents the following formula (15-2) or (15-3).

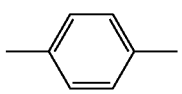

(15-2)

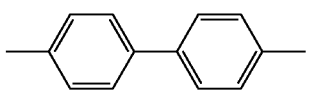

(15-3)

(wherein, benzene rings contained in the structures of (15-2) and (15-3) may have each independently 1 or more and 4 or less substituents. These substituents may be mutually the same or different. A plurality of substituents may be connected to form a ring. Further, another aromatic hydrocarbon ring or heterocyclic ring may be connected adjacent to the benzene ring.).

As particularly preferable specific examples of the repeating unit of the above-described formula (15), repeating units of the following (formulae 141-142) are mentioned.

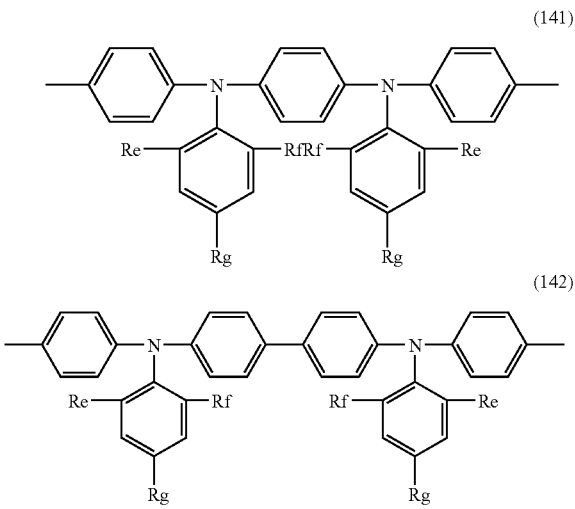

(wherein, Re to Rg are as described above.).

In the above-described formulae, Re to Rg are the same as in the above-described formulae 1 to 132. For enhancing solubility in organic solvents, it is preferable that one or more substituents other than a hydrogen atom are contained and it is preferable that symmetry of the shape of a repeating unit containing substituents is poor.

When Rs contain an alkyl chain in the above-mentioned formulae, it is preferable, for enhancing solubility of the polymer compound in organic solvents, that one or more Rs contain a cyclic or branched alkyl chain.

Further, when Rs contain partially an aryl group or heterocyclic group in the above-mentioned formulae, these groups may further have at least one substituent.

The polymer compound of the present invention may contain a repeating unit other than the repeating units of the above-described formulae (1-1), (1-2), (1-3) and (5) to (15) in a range not deteriorating a light emitting property and charge transporting property. These repeating units and other repeating units may be connected by a non-conjugate unit, and the repeating unit may contain its non-conjugate portion. As the bonding structure, exemplified are those shown below and combinations of two or more of them. Here, R represents a group selected from the same substituents as described above, and Ar represents a hydrocarbon group having 6 to 60 carbon atoms.

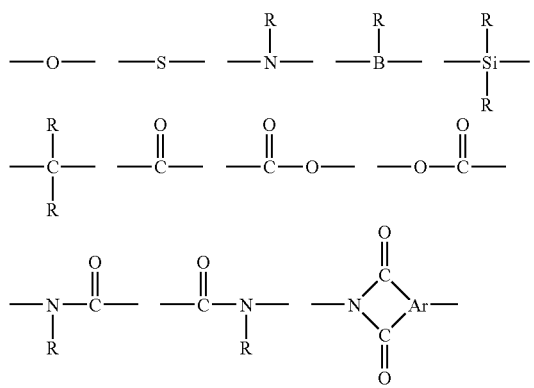

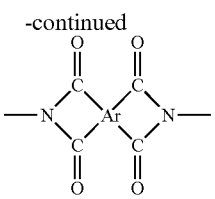

Among the polymer compounds of the present invention, preferable are those composed only of a repeating unit of the above-described formula (1-1), and/or those composed only of a repeating unit of the above-described formula (1-2), and/or those composed only of a repeating unit of the above-described formula (1-3), and those substantially composed of a repeating unit of the above-described formula (1-1) and/or (1-2) and/or (1-3) and a repeating unit of the above-described formula (5) to (15).

The polymer copolymer of the present invention may be a random, block or graft copolymer, or a polymer having an intermediate structure of them, for example, a random copolymer with a block nature. From the standpoint of obtaining a polymer light emitting material showing high fluorescent or phosphorescent quantum yield, random copolymers with a block nature, and block or graft copolymers are preferable more than complete random copolymers. The polymer compound of the present invention includes also those having branching in the main chain and three or more end parts, and dendrimers.

The end group of the polymer compound of the present invention may be protected by a stable group since if a polymerization active group remains intact, there is a possibility of decrease in a light emitting property and life when the compound is made into a device. Those having a conjugate bond sequential to a conjugate structure of a main chain are preferable, and exemplified are structures containing a bond to an aryl group or heterocyclic group via a carbon-carbon bond. Specifically, substituents described in the chemical formula 10 of Japanese Patent Application Laid-Open (JP-A) No. 9-45478 are exemplified.

In the polymer compound of the present invention, it is preferable that at least one of molecule chain ends thereof has an aromatic end group selected from monovalent heterocyclic groups, monovalent aromatic amine groups, monovalent groups derived from heterocyclic coordinated metal complexes and aryl groups. As this aromatic end group, one group may be used or two or more groups may be used. It is preferable that end groups other than aromatic end groups are substantially absent from the standpoint of fluorescence property and device properties. Here, the molecule chain end means an aromatic end group present at the end of a polymer compound by the production method of the present invention, a leaving group of a monomer used for polymerization which has not left in polymerization and is present at the end of a polymer compound, or a hydrogen atom connected instead of connecting of an aromatic end group to a monomer present at the end of a polymer compound though a leaving group derived from the monomer has left. In the case of production of a polymer compound of the present invention using a leaving group of a monomer used for polymerization which has not left in polymerization and is present at the end of a polymer compound, among these molecule chain ends, for example, a monomer having a halogen atom, as a raw material, if a halogen remains at the end of the polymer compound, there is a tendency of decrease in fluorescence property and the like, thus, it is preferable that substantially no leaving groups of a monomer remain at the end.

In the polymer compound, at least one of molecule chain ends thereof can be blocked with an aromatic end group selected from monovalent heterocyclic groups, monovalent aromatic amine groups, monovalent groups derived from heterocyclic coordinated metal complexes and aryl groups having a formula weight of 90 or more, thereby expecting various properties imparted to the polymer compound. Specifically, there are mentioned an effect of elongating time necessary for decrease in brilliance of a device, an effect of enhancing charge injectability, charge transportability, light emitting property and the like, an effect of enhancing compatibility and mutual action between copolymers, an anchor-like effect, and the like.

As the monovalent aromatic amine group, exemplified are structures in which one of two connecting bonds in a structure of the above-described formula (15) is sealed with R.

As the monovalent group derived from a heterocyclic coordinated metal complex, exemplified are structures in which one of two connecting bonds in the above-mentioned divalent group having a metal complex structure is sealed with R.

Of end groups of the polymer compound of the present invention, the aryl group having a formula weight of 90 or more has a number of carbon atoms of usually about 6 to 60. Here, with respect to the formula weight of the aryl group, when the aryl group is represented by a chemical formula, the sum of products obtained by multiplying atomicity by atomic weight of elements in the chemical formula is the formula weight.

As the aryl group, mentioned are a phenyl group, naphthyl group, anthracenyl group, group having a fluorene structure, condensed ring compound groups and the like.

As the phenyl group for sealing the end, for example,

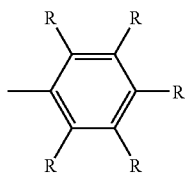

is mentioned.

As the naphthyl group for sealing the end, for example,

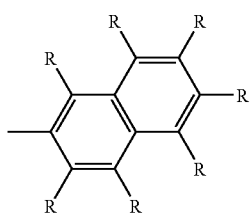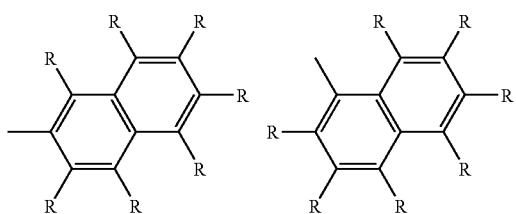

are mentioned.

As the anthracenyl group, for example,

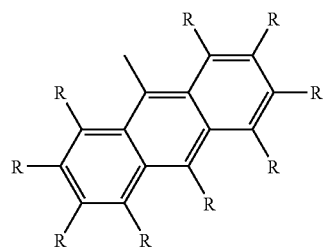

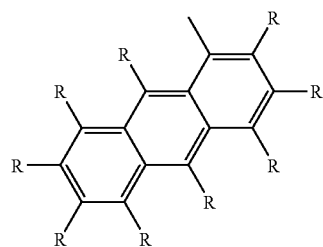

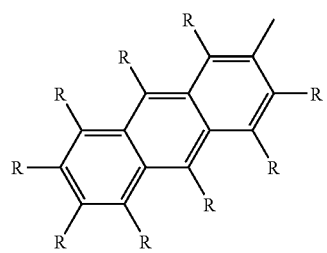

are mentioned.

As the group containing a fluorene structure, for example,

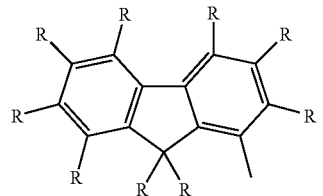

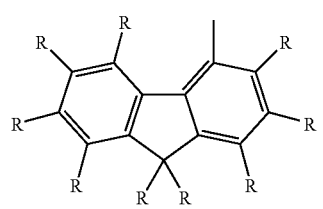

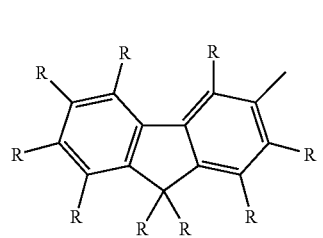

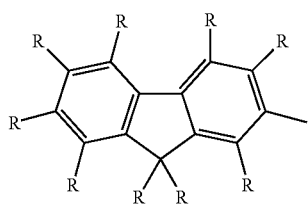

are mentioned.

As the condensed ring compound group, for example,

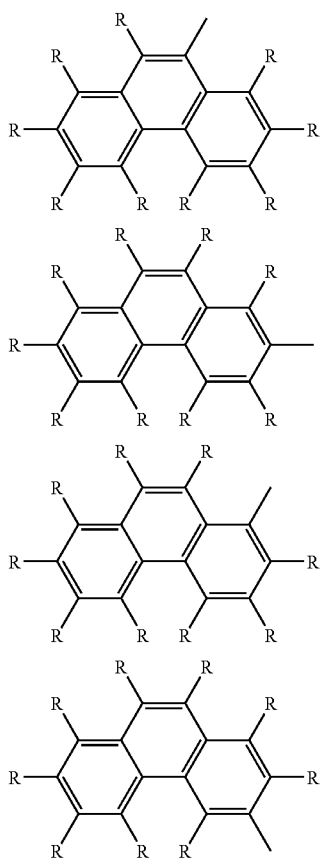

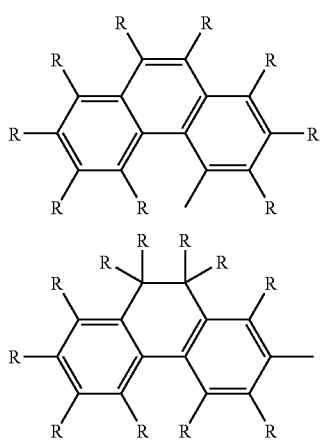

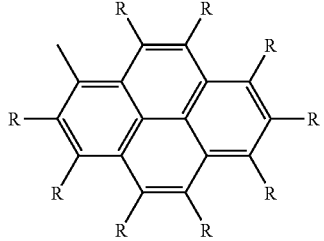

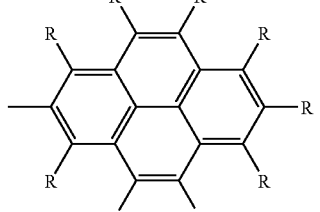

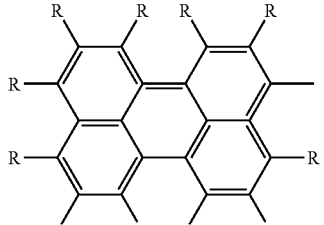

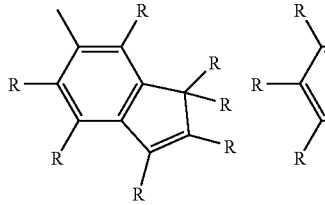

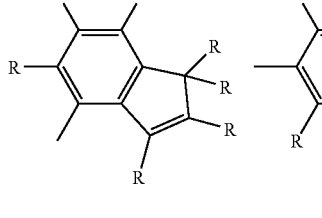

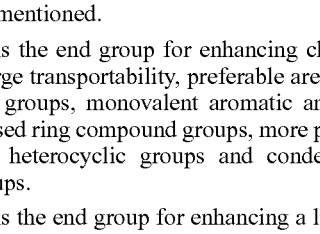

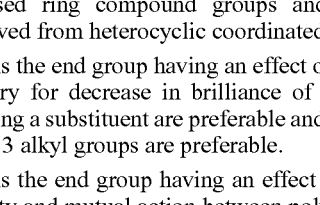

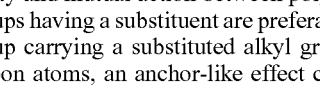

are mentioned.

As the end group for enhancing charge injectability and charge transportability, preferable are monovalent heterocyclic groups, monovalent aromatic amine groups and condensed ring compound groups, more preferable are monovalent heterocyclic groups and condensed ring compound groups.

As the end group for enhancing a light emitting property, preferable are a naphthyl group, anthracenyl group, condensed ring compound groups and monovalent groups derived from heterocyclic coordinated metal complexes.

As the end group having an effect of elongating time necessary for decrease in brilliance of a device, aryl groups having a substituent are preferable and phenyl groups having 1 to 3 alkyl groups are preferable.

As the end group having an effect of enhancing compatibility and mutual action between polymer compounds, aryl groups having a substituent are preferable. By using a phenyl group carrying a substituted alkyl group having 6 or more carbon atoms, an anchor-like effect can be performed. The anchor effect means an effect by which an end group plays an anchor-like role on a coagulated body of a polymer to enhance an mutual action.
As the group for enhancing device properties, the following structures are preferable.
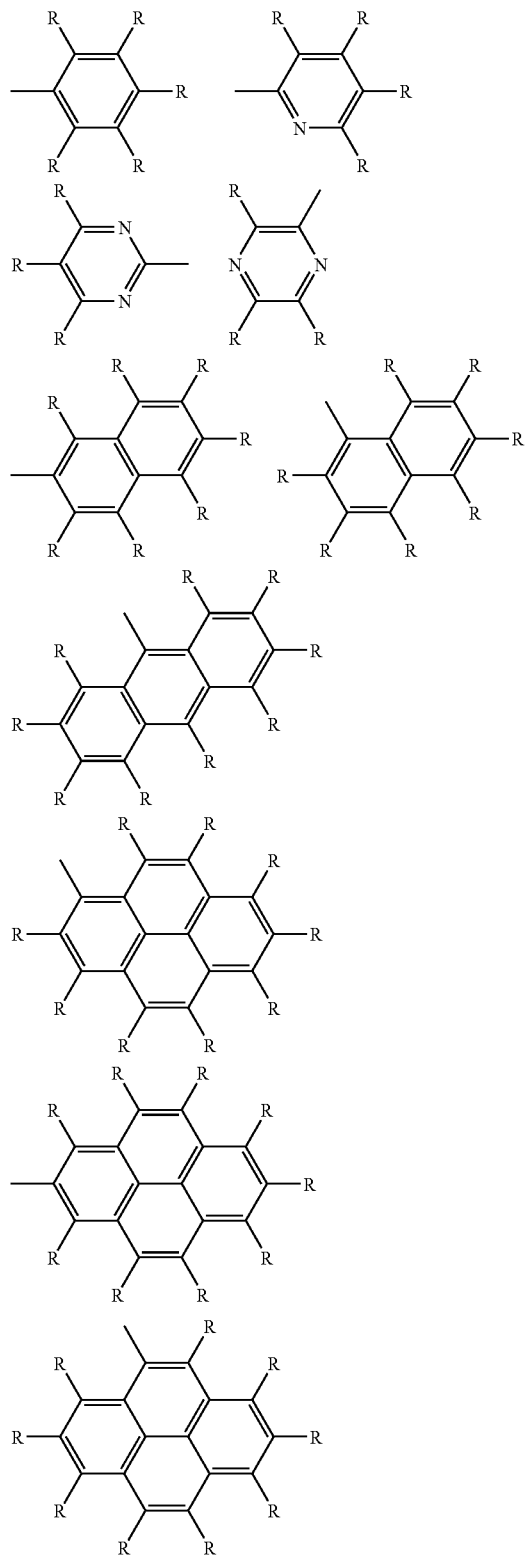
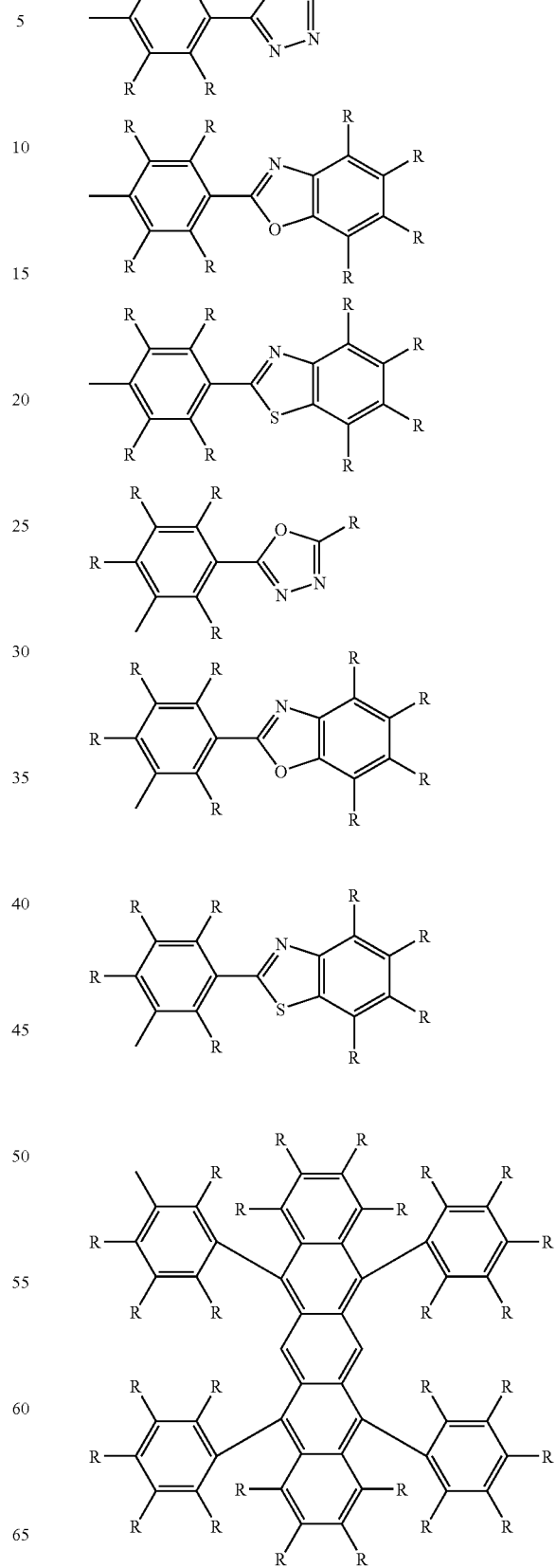

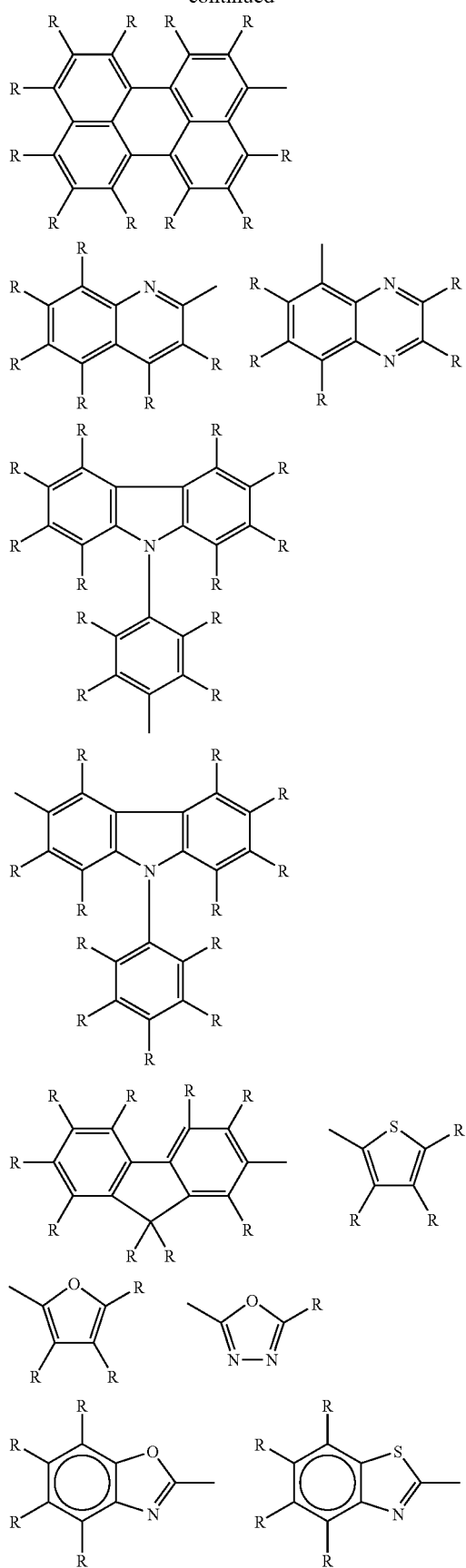

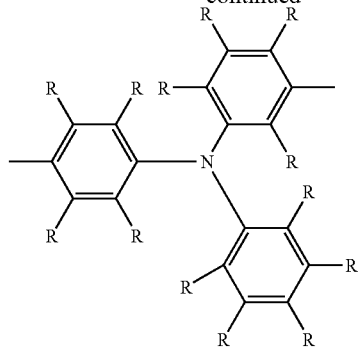

As Rs in the formulae, Rs described above are exemplified.

The polymer compound of the present invention has a polystyrene reduced number average molecular weight of usually about $10^3$ to $10^8$, preferably $10^4$ to $10^6$. The polystyrene reduced weight average molecular weight is $10^3$ to $10^8$, preferably $10^4$ to $5\times10^6$.

As the good solvent for the polymer compound of the present invention, chloroform, methylene chloride, dichloroethane, tetrahydrofuran, toluene, xylene, mesitylene, tetralin, decalin, n-butylbenzene and the like are exemplified. Depending on the structure and molecular weight of the polymer compound, the polymer compound can be dissolved in these solvents usually in an amount of 0.1 wt % or more.

The polymer compound of the present invention is capable of emitting light at shorter wavelength as compared with the correspondent polyfluorene derivative.

Next, the method for producing a polymer compound of the present invention will be described.

Polymer compounds of the present invention having, for example, a repeating unit of the formula (1-1), (1-2) or (1-3) can be produced by polymerizing as a raw material at least a compound of the following formula (16-1), (16-2) or (16-3):

formula (16-1)

formula (16-2)

formula (16-3)

(wherein, ring A, ring B, ring C and $Z_1$ to $Z_5$ represent the same meanings as described above. $Y_1, Y_2, Y_3, Y_4, Y_5$ and $Y_6$ represent each independently a substituent correlated with polymerization.).

Among the compounds of the formula (16-1), compounds of the formula (17-1) are preferable.

formula (17-1)

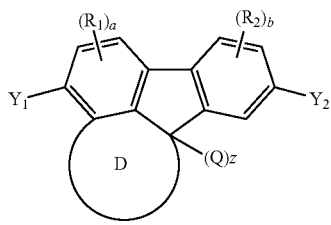

(wherein, $R_1$, $R_2$, a, b, ring D, Q, z, $Y_1$ and $Y_2$ represent the same meanings as described above.).

Among the compounds of the formula (17-1), compounds of the formulae (18-1), (18-2), (18-3) and (18-4) are preferable.

formula (18-1)

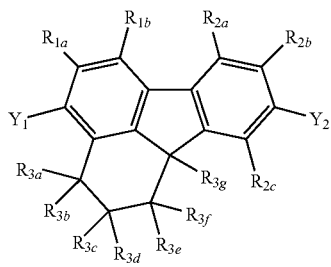

formula (18-2)

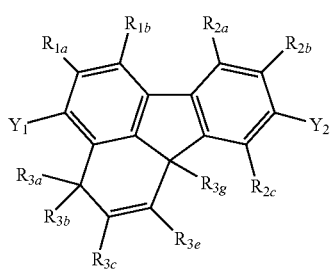

formula (18-3)

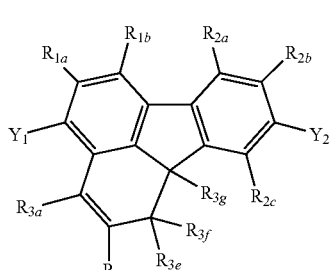

formula (18-4)

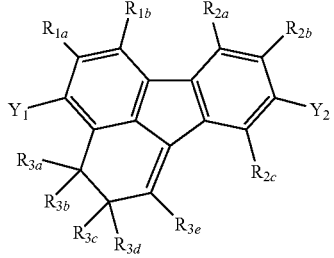

Among the compounds of the formula (16-2), compounds of the formula (17-2) are preferable.

formula (17-2)

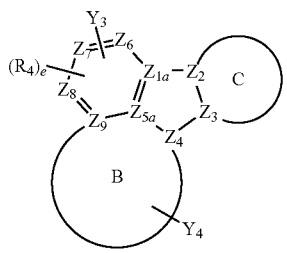

(wherein, ring B, ring C, $Z_2$, $Z_3$, $Z_4$, $Y_3$ and $Y_4$ represent the same meanings as described above. $Z_6$, $Z_7$ and $Z_8$ represent each independently C-$(Q)_z$ or nitrogen atom. $Z_{1a}$, $Z_{5a}$ and $Z_9$ represent each independently a carbon atom. Q and z represent the same meanings as described above. $R_4$ represents a substituent. e represents an integer of 0 to 2. When there are two or more $R_4$s, they may be the same or different. $R_4$s may be mutually connected to form a ring.).

Among the compounds of the formula (16-3), compounds of the formula (17-3) are preferable.

formula (17-3)

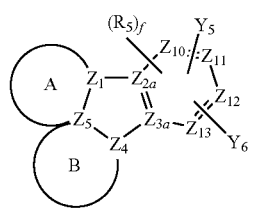

(wherein, ring A, ring B, $Z_1$, $Z_4$, $Z_5$, $Y_5$ and $Y_6$ represent the same meanings as described above. $Z_{10}$, $Z_{11}$, $Z_{12}$ and $Z_{13}$ represent each independently C-$(Q)_z$ or nitrogen atom. $Z_{2a}$ and $Z_{3a}$ represent each independently a carbon atom. Q and z represent the same meanings as described above. $R_5$ represents a substituent. f represents an integer of 0 to 2. When there are two or more $R_5$s, they may be the same or different. $R_5$s may be mutually connected to form a ring.).

In the production method of the present invention, the substituent correlated with polymerization includes halogen atoms, alkyl sulfonate groups, aryl sulfonate groups, aryl alkyl sulfonate groups, borate groups, sulfoniummethyl group, phosphoniummethyl group, phosphonatemethyl group, methyl monohalide groups, —B(OH)$_2$, formyl group, cyano group, vinyl group and the like.

Here, the halogen atom includes a fluorine atom, chlorine atom, bromine atom and iodine atom. From the standpoint of improvement of degree of polymerization, a bromine atom and iodine atom are preferable.

Examples of the alkyl sulfonate group include a methane sulfonate group, ethane sulfonate group, trifluoromethane sulfonate group and the like, examples of the aryl sulfonate group include a benzene sulfonate group, p-toluene sulfonate group and the like, and examples of the aryl sulfonate group include a benzyl sulfonate group and the like.

As the borate group, groups of the following formulae are exemplified.

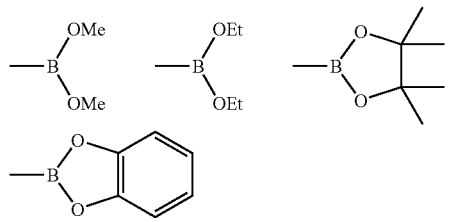

In the formulae, Me represents a methyl group and Et represents an ethyl group.

As the sulfoniummethyl group, groups of the following formulae are exemplified.

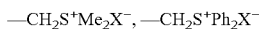

(wherein, X represents a halogen atom and Ph represents a phenyl group.).

As the phosphoniummethyl group, groups of the following formula are exemplified.

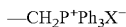

(wherein, X represents a halogen atom.).

As the phosphonatemethyl group, groups of the following formula are exemplified.

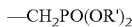

(wherein, X represents a halogen atom and R' represents an alkyl group, aryl group or arylalkyl group.).

Examples of the methyl monohalide group include a methyl fluoride group, methyl chloride group, methyl bromide group and methyl iodide group.

Preferable substituents as the substituent correlating with polymerization vary depending on the kind of the polymerization reaction, and when, for example, a zerovalent nickel complex is used such as in the Yamato coupling reaction and the like, mentioned are halogen atoms, alkyl sulfonate groups, aryl sulfonate groups and aryl alkyl sulfonate groups. When a nickel catalyst or palladium catalyst is used such as in the Suzuki coupling reaction and the like, mentioned are alkyl sulfonate groups, halogen atoms, borate groups, —B(OH)$_2$ and the like.

In particular, a polymer compound having a repeating unit of the formula (4-1) can be obtained also by hydrogenating a polymer compound having a repeating unit of the formulae (4-2) to (4-4) with a catalyst obtained by supporting palladium, platinum, rhodium, ruthenium or a noble metal prepared by mixing them on activated carbon.

In contrast, a polymer compound having a repeating unit of the formulae (4-2) to (4-4) can be obtained also by oxidizing a polymer compound having a repeating unit of the formula (4-1) using 2,3-dichloro-5,6-dicyano-1,4-benzoquinone (DDQ), or using tetrabutylammonium bromide under basic condition.

When the polymer compound of the present invention has repeating units other than the formula (1-1), (1-2) or (1-3), it may be advantageous that polymerization is carried out in co-existence of a compound having two substituents correlated with polymerization which are repeating units other than the formula (1-1), (1-2) or (1-3).

In addition to the compounds of the above-described formula (16-1), (16-2) or (16-3), compounds of any one of the following formulae (19) to (22) can be used as a raw material.

(wherein, Ar$_1$, Ar$_2$, Ar$_3$, Ar$_4$, ff, X$_1$, X$_2$ and X$_3$ represent the same meanings as described above. Y$_7$, Y$_8$, Y$_9$, Y$_{10}$, Y$_{11}$, Y$_{12}$, Y$_{13}$ and Y$_{14}$ represent each independently a polymerizable substituent.).

Polymer compounds having at least one unit of (5), (6), (7) or (8), sequentially, in addition to the unit of the above-described formula (1-1), (1-2) or (1-3) can be produced.

As the compound having two substituents correlated with polymerization corresponding to the above-described formula (15) which are repeating units other than the repeating units of the above-described formula (1-1), (1-2) or (1-3), compounds of the following formula (15-7) are mentioned.

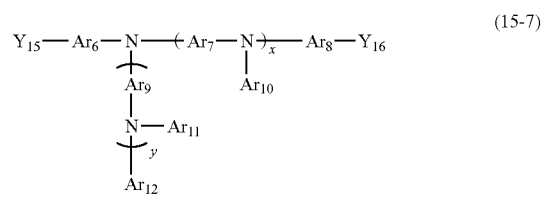

(wherein, Ar$_6$, Ar$_7$, Ar$_8$, Ar$_9$, Ar$_{10}$, Ar$_{11}$, Ar$_{12}$, x and y represent the same meanings as described above. Y$_{15}$ and Y$_{16}$ represent each independently a substituent correlated with polymerization.).

Further preferable are compound of the formula (15-8) or the formula (15-9).

formula (15-8)

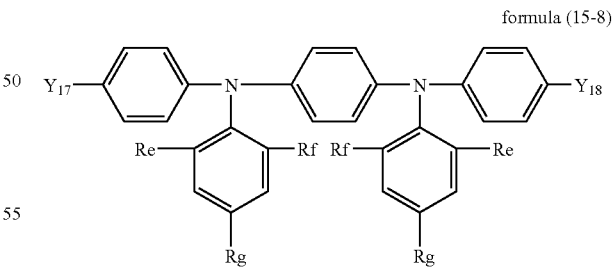

formula (15-9)

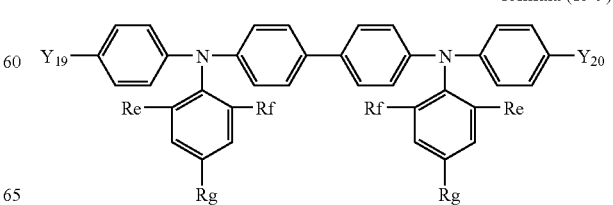

(wherein, Re to Rg are as described above. $Y_{17}$, $Y_{18}$, $Y_{19}$ and $Y_{20}$ represent each independently a substituent correlated with polymerization).

The production method of the present invention can be carried out, specifically, by dissolving a compound having several substituents correlated with condensation polymerization as a monomer if necessary in an organic solvent, and using, for example, an alkali and suitable catalyst, at temperatures of the melting point or higher and the boiling point or lower of the organic solvent. Known methods described in, for example, Organic Reactions, vol. 14, p. 270 to 490, John Wiley & Sons, Inc., 1965, Organic Syntheses, Collective Volume VI, p. 407-411, John Wiley & Sons, Inc. , 1988, Chem. Rev. , vol. 95, p. 2457 (1995), J. Organomet. Chem., vol. 576, p. 147 (1999), Makromol. Chem., Macromol. Symp., vol. 12, p. 229 (1987), and the like can be used.

In the method for producing a polymer compound of the present invention, a known polymerization reaction can be used in accordance with a substituent correlated with polymerization of a compound of the above-described formulae (16-1) to (16-3) and (22) to (25).

When the polymer compound of the present invention produces a double bond in polymerization, for example, a method described in JP-A No. 5-202355 is mentioned. Namely, there are exemplified methods of polymerization of a compound having a formyl group and a compound having a phosphoniummethyl group or polymerization of a compound having a formyl group and a phosphoniummethyl group by the Wittig reaction, polymerization of a compound having a vinyl group and a compound having a halogen atom by the Heck reaction, polymerization of a compound having two or more methyl monohalide groups by a de-halogenating hydrogen method, polymerization of a compound having two or more sulfoniummethyl groups by a sulfonium salt decomposition method, polymerization of a compound having a formyl group and a compound having a cyano group by the Knoevenagel reaction, and the like, and methods of polymerization of a compound having two or more formyl groups by the McMurry reaction, and the like.

When the polymer compound of the present invention has a triple bond in a main chain, for example, the Heck reaction and the Sonogashira reaction can be utilized.

When a double bond or triple bond is not generated, there are exemplified a method of polymerizing from the corresponding monomer by the Suzuki coupling reaction, a method of polymerizing by the Grignard reaction, a method of polymerizing with a nickel(0) complex, a method of polymerizing with an oxidizer such as $FeCl_3$ and the like, a method of electrochemically oxidation-polymerizing, a method by decomposition of an intermediate polymer having a suitable releasing group, and the like.

Of them, polymerization by the Wittig reaction, polymerization by the Heck reaction, polymerization by the Knoevenage reaction, method of polymerizing by the Suzuki coupling reaction, method of polymerizing by the Grignard reaction and method of polymerizing with a nickel zero-valent complex are preferable because of easy structure control.

Among the production methods of the present invention, preferable is a production method in which when polymerizing a compound of the formula (16-1), (16-2) or (16-3) singly or together with at least one selected from compounds of the formulae (19) to (22), $Y_1$, $Y_2$, $Y_3$, $Y_4$, $Y_5$, $Y_6$, $Y_7$, $Y_8$, $Y_9$, $Y_{10}$, $Y_{11}$, $Y_{12}$, $Y_{13}$, $Y_{14}$, $Y_{15}$, $Y_{16}$, $Y_{17}$, $Y_{18}$, $Y_{19}$ and $Y_{20}$ represent each independently a halogen atom, alkyl sulfonate group, aryl sulfonate group or aryl alkyl sulfonate group and condensation polymerization is carried out in the presence a nickel zero-valent complex.

As the raw material compound, mentioned are dihalide compounds, bis(alkyl sulfonate) compounds, bis(aryl sulfonate) compounds, bis(aryl alkyl sulfonate) compounds, or halogen-alkyl sulfonate compounds, halogen-aryl sulfonate compounds, halogen-aryl alkyl sulfonate compounds, alky sulfonate-aryl sulfonate compounds, alkyl sulfonate-aryl alkyl sulfonate compounds and aryl sulfonate-aryl alkyl sulfonate compounds.

Among the production methods of the present invention, preferable is a production method in which when polymerizing a compound of the formula (16-1), (16-2) or (16-3) singly or together with at least one selected from compounds of the formulae (19) to (22), $Y_1$, $Y_2$, $Y_3$, $Y_4$, $Y_5$, $Y_6$, $Y_7$, $Y_8$, $Y_9$, $Y_{10}$, $Y_{11}$, $Y_{12}$, $Y_{13}$, $Y_{14}$, $Y_{15}$, $Y_{16}$, $Y_{17}$, $Y_{18}$, $Y_{19}$ and $Y_{20}$ represent each independently a halogen atom, alkyl sulfonate group, aryl sulfonate group, aryl alkyl sulfonate group, $-B(OH)_2$ or borate group, the ratio of the sum of mol numbers of halogen atoms, alkyl sulfonate groups, aryl sulfonate groups and aryl alkyl sulfonate groups to the sum of mol numbers of $-B(OH)_2$ and borate groups is substantially 1 (usually, K/J is in the range of 0.7 to 1.2), and condensation polymerization is carried out using a nickel or palladium catalyst.

As specific combinations of raw material compounds, mentioned are combinations of dihalide compounds, bis (alkyl sulfonate) compounds, bis(aryl sulfonate) compounds or bis (aryl alkyl sulfonate) compounds with diboric acid compounds or diborate compounds.

Further mentioned are halogen-boric acid compounds, halogen-borate compounds, alkyl sulfonate-boric acid compounds, alkyl sulfonate-borate compounds, aryl sulfonate-boric acid compounds, aryl sulfonate-borate compounds, aryl alkyl sulfonate-boric acid compounds, aryl alkyl sulfonate-boric acid compounds, aryl alkyl sulfonate-borate compounds.

The organic solvent varies depending on the compound to be used and the reaction, and it is preferable that the solvent to be used is subjected to a deoxidation treatment sufficiently and the reaction is allowed to progress under an inert atmosphere, in general for suppressing side reactions. Likewise, a dehydration treatment is preferably conducted. Here, a case of a reaction in a two-phase system with water such as the Suzuki coupling reaction is not included.

Exemplified as the solvent are saturated hydrocarbons such as pentane, hexane, heptane, octane, cyclohexane and the like, unsaturated hydrocarbons such as benzene, toluene, ethylbenzene, xylene and the like, halogenated saturated hydrocarbons such as carbon tetrachloride, chloroform, dichloromethane, chiorobutane, bromobutane, chioropentane, bromopentane, chlorohexane, bromohexane, chlorocyclohexane, bromocyclohexane and the like, halogenated unsaturated hydrocarbons such as chlorobenzene, dichlorobenzene, trichlorobenzene and the like, alcohols such as methanol, ethanol, propanol, isopropanol, butanol, t-butyl alcohol and the like, carboxylic acids such as formic acid, acetic acid, propionic acid and the like, ethers such as dimethyl ether, diethyl ether, methyl-t -butyl ether, tetrahydrofuran, tetrahydropyran, dioxane and the like, amines such as trimethylamine, triethylamine, N,N,N',N'-tetramethylethylene diamine, pyridine and the like, and amides such as N,N-dimethylformamide, N,N-dimethylacetamide, N,N-diethylacetamide, N-methylmorpholine, and the like, and these may be used singly or in admixture. Of them, ethers are preferable, and tetrahydrofuran and diethyl ether are further preferable.

For reaction, alkalis or suitable catalysts are appropriately added. These may be advantageously selected depending on the reaction to be used. As the alkalis or catalysts, those capable of being dissolved sufficiently in a solvent used in the reaction are preferable. As the method for mixing an alkali or catalyst, there is exemplified a method in which a solution of an alkali or catalyst is added slowly while stirring the reaction liquid under an inert atmosphere such as argon or nitrogen and the like, or adversely, the reaction liquid is added slowly to a solution of an alkali or catalyst.

When the polymer compound of the present invention is used in a polymer LED and the like, the purity thereof has an influence on performances of a device such as a light emitting property and the like, thus, it is preferable that monomers before polymerization are purified by a method such as distillation, sublimation purification, re-crystallization and the like before performing polymerization. It is preferable, after polymerization, to perform a refinement treatment such as reprecipitation purification, fractionation by chromatography, and the like.

(16-1) to (16-3), (17-1) to (17-3) and (18-1) to (18-4) which are useful as raw materials of the polymer compound of the present invention are obtained by brominating compounds obtained by substituting $Y_1$ to $Y_6$ in the above-described formulae by hydrogen atoms.

In particular, a compound having a structure of the formula (18-1) can be obtained also by hydrogenating a compound having a structure of the formulae (18-2) to (18-4) with a catalyst obtained by supporting palladium, platinum, rhodium, ruthenium or a noble metal prepared by mixing them on activated carbon.

In contrast, a compound having a structure of the formulae (18-2) to (18-4) can be obtained also by oxidizing a compound having a structure of the formula (18-1) using 2,3-dichloro-5,6-dicyano-1,4-benzoquinone (DDQ), or using tetrabutylammonium bromide under basic condition.

Next, the polymer LED of the present invention will be illustrated.

The polymer LED of the present invention is characterized in that an organic layer is present between electrodes composed of an anode and a cathode and the organic layer contains a polymer compound of the present invention.

The organic layer may be any one of a light emitting layer, hole transporting layer, electron transporting layer or the like, and it is preferable that the organic layer is a light emitting layer.

Here, the light emitting layer means a layer having a function of light emission, the hole transporting layer means a layer having a function of transporting holes, and the electron transporting layer means a layer having a function of transporting electrons. The electron transporting layer and hole transporting layer are called collectively a charge transporting layer. Two or more light emitting layers, two or more hole transporting layers or two or more electron transporting layers may be used each independently.

When the organic layer is a light emitting layer, the light emitting layer as an organic layer may further contain a hole transporting material, electron transporting material or light emitting material. Here, the light emitting material means a material manifesting fluorescence and/or phosphorescence.

When a polymer compound of the present invention and a hole transporting material are mixed, the mixing ratio of the hole transporting material is 1 wt % to 80 wt %, preferably 5 wt % to 60 wt % based on the whole mixture. When a polymer compound of the present invention and an electron transporting material are mixed, the mixing ratio of the electron transporting material is 1 wt % to 80 wt %, preferably 5 wt % to 60 wt % based on the whole mixture. Further, when a polymer compound of the present invention and a light emitting material are mixed, the mixing ratio of the light emitting material is 1 wt % to 80 wt %, preferably 5 wt % to 60 wt % based on the whole mixture. When a polymer compound of the present invention and a light emitting material, hole transporting material and/or electron transporting material are mixed, the mixing ratio of the light emitting material is 1 wt % to 50 wt %, preferably 5 wt % to 40 wt %, the sum of the hole transporting material and the electron transporting material is 1 wt % to 50 wt %, preferably 5 wt % to 40 wt %, and the content of the polymer compound of the present invention is 99 wt % to 20 wt %, based on the whole mixture.

As the hole transporting material, electron transporting material and light emitting material to be mixed, known lower molecular weight compounds, triplet light emitting complexes or polymer compounds can be used, and polymer compounds are preferably used. Examples of the hole transporting material, electron transporting material and light emitting material as a polymer compound include polyfluorenes, derivatives and copolymers thereof, polyarylenes, derivatives and copolymers thereof, polyarylenevinylenes, derivatives and copolymers thereof, and (co)polymers of aromatic amines and derivatives thereof disclosed in WO99/13692, WO99/48160, GB2340304A, WO00/53656, WO01/19834, WO00/55927, GB2348316, WO00/46321, WO00/06665, WO99/54943, WO99/54385, U.S. Pat. No. 5,777,070, WO98/06773, WO97/05184, WO00/35987, WO00/53655, WO01/34772, WO99/24526, WO00/22027, WO00/22026, WO98/27136, U.S. Pat. No. 573,636, WO98/21262, U.S. Pat. No. 5,741,921, WO97/09394, WO96/29356, WO96/10617, EP0707020, WO95/07955, Japanese Patent Application Laid-Open (JP-A) Nos. 2001-181618, 2001-123156, 2001-3045, 2000-351967, 2000-303066, 2000-299189, 2000-252065, 2000-136379, 2000-104057, 2000-80167, 10-324870, 10-114891, 9-111233, 9-45478 and the like.

As the fluorescent material as a lower molecular weight compound, there can be used, for example, naphthalene derivatives, anthracene or derivatives thereof, perylene or derivatives thereof; coloring matters such as polymethine, xanthene, coumarin, cyanine and the like; metal complexes of 8-hydroxyquinoline or derivatives thereof; aromatic amines, tetraphenylcyclopentadiene or derivatives thereof, or tetraphenylbutadiene or derivatives thereof, and the like.

Specifically, known compounds such as those described in, for example, JP-A Nos. 57-51781 and 59-194393, and the like, can be used.

Examples of the triplet light emitting complex include Ir(ppy)$_3$ containing iridium as a center metal, Btp$_2$Ir(acac), PtOEP containing platinum as a center metal, Eu(TTA)$_3$phen containing europium as a center metal, and the like.

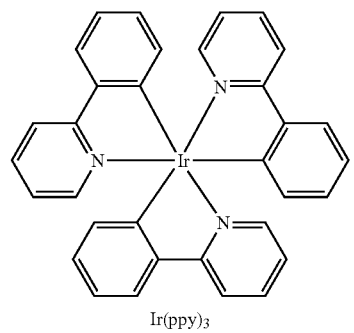

Ir(ppy)$_3$

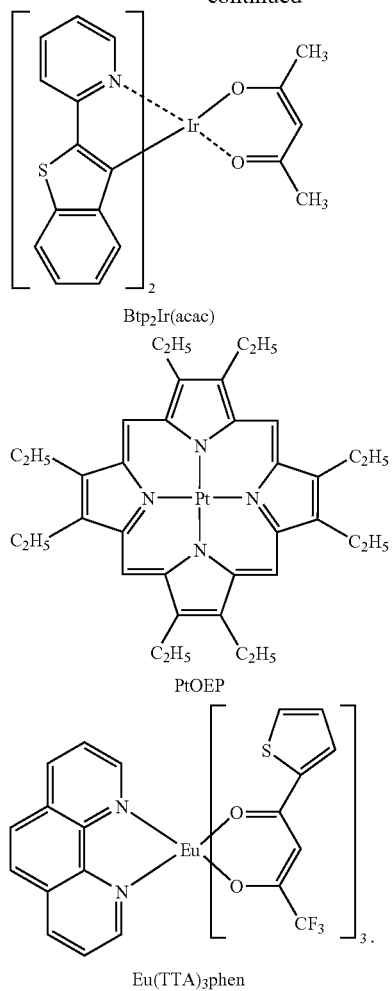

Btp₂Ir(acac)

PtOEP

Eu(TTA)₃phen

The triplet light emitting complex is described specifically in, for example, Nature, (1998), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852, Jpn. J. Appl. Phys., 34, 1883 (1995), and the like.

The composition of the present invention contains at least one material selected from hole transporting materials, electron transporting materials and light emitting materials, and a polymer compound of the present invention, and can be used as a light emitting material or charge transporting material.

The content ratio of at least one material selected from hole transporting materials, electron transporting materials and light emitting materials to a polymer compound of the present invention may be advantageously determined depending on the application.

As another embodiment of the present invention, a polymer composition is exemplified containing two or more polymer compounds of the present invention.

The thickness of a light emitting layer in a polymer LED of the present invention has an optimum value varying depending on a material to be used and may be advantageously selected to give suitable driving voltage and light emitting efficiency, and is for example from 1 nm to 1 µm, preferably from 2 nm to 500 nm, further preferably from 5 nm to 200 nm.

As the method for forming a light emitting layer, for example, a method of film formation from a solution is exemplified. When film formation from a solution is performed by using a polymer compound of the present invention in production of a polymer LED, simple removal of a solvent by drying after application of this solution may be permissible, and also in the case of mixing of a charge transporting material and a light emitting material, analogous means can be applied extremely advantageously for production.

As the method for film formation from a solution, application methods such as a spin coat method, casting method, micro gravure coat method, gravure coat method, bar coat method, roll coat method, wire bar coat method, dip coat method, spray coat method, screen printing method, flexographic printing method, offset printing method, inkjet printing method and the like can be used. From the standpoint of easiness of pattern formation and multicolor divisional painting, preferable are printing methods such as a screen printing method, flexographic printing method, offset printing method, inkjet printing method and the like.

The ink composition of the present invention can be used as the solution to be used in printing methods.

In the ink composition of the present invention, at least one polymer compound of the present invention and a solvent may be contained, and additives such as hole transporting materials, electron transporting materials, light emitting materials, stabilizers and the like may also be contained in addition to the polymer compound of the present invention.

The ink composition of the present invention means a composition which is liquid in manufacturing of a device, and typically, which is liquid at normal pressure (namely, 1 atm) and 25° C.

It is not necessarily required that the ink composition of the present invention is colored.

The proportion of the polymer compound of the present invention in the ink composition is usually 20 wt % to 100 wt %, preferably 40 wt % to 100 wt % based on the total weight of the ink composition excepting a solvent.

The proportion of a solvent in the ink composition is 1 wt % to 99.9 wt %, preferably 60 wt % to 99.9 wt %, further preferably 90 wt % to 99.8 wt % based on the total weight of the ink composition.

The viscosity of the ink composition varies depending on the printing method, and when the ink composition passes through a discharging apparatus such as in an ink jet printing method and the like, the viscosity at 25° C. is preferably in the range from 2 to 20 mPa·s for preventing clogging and aviation curve in discharging.

Exemplified as the solvent to be used in the ink composition of the present invention are chlorine-based solvents such as chloroform, methylene chloride, 1,2-dichloroethane, 1,1, 2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethyl cellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, and amide solvents such as N-methyl-2-pyrrolidone, N,N-dimethylformamide and the like. These organic solvents can be used singly or in combination of two or more. Of the above-described solvents, at least one organic solvent having a structure containing at least one benzene ring and having a melting point of 0° C. or lower and a boiling point of 100° C. or higher is preferably contained.

Regarding the kind of the solvent, aromatic hydrocarbon solvents, aliphatic hydrocarbon solvents, ester solvents and ketone solvents are preferable, from the standpoint of dissolvability into an organic solvent of the polymer compound of the present invention, uniformity in film formation, viscosity property and the like, and toluene, xylene, ethylbenzene, diethylbenzene, trimethylbenzene, mesitylene, n-propylbenzene, i-propylbenene, n-butylbenzene, i-butylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, methyl benzoate, 2-propylcyclohexanone, 2-heptanone, 3-heptanone, 4-heptanone, 2-octanone, 2-nonanone, 2-decanone, and dicyclohexylketone are preferable, and at least one of xylene, anisole, mesitylene, cyclohexylbenzene, bicyclohexyl and methyl benzoate is more preferably contained, The number of the kinds of solvents in the ink composition is preferably 2 or more, more preferably 2 to 3, further preferably 2 from the standpoint of film formability and from the standpoint of device properties and the like.

When two solvents are contained in the ink composition, one solvent of them may be in solid state at 25° C. From the standpoint of film formability, it is preferable that one solvent has a boiling point of 180° C. or higher and another solvent has a boiling point of 180° C. or lower, and it is more preferable that one solvent has a boiling point of 200° C. or higher and another solvent has a boiling point of 180° C. or lower. From the standpoint of viscosity, it is preferable that both of two solvents dissolve a polymer compound of the present invention in an amount of 0.2 wt % or more at 60° C., and it is preferable that one of two solvents dissolves a polymer compound of the present invention in an amount of 0.2 wt % or more at 25° C.

When three solvents are contained in the ink composition, one to two solvents of them may be in solid state at 25° C. From the standpoint of film formability, it is preferable that at least one of three solvents has a boiling point of 180° C. or higher and at least one solvent has a boiling point of 180° C. or lower, and it is more preferable that at least one of three solvents has a boiling point of 200° C. or higher and 300° C. or lower and at least one solvent has a boiling point of 180° C. or lower. From the standpoint of viscosity, it is preferable that two of three solvents dissolve a polymer compound of the present invention in an amount of 0.2 wt % or more at 60° C., and it is preferable that one of three solvents dissolves a polymer compound of the present invention in an amount of 0.2 wt % or more at 25° C.

When two or more solvents are contained in the ink composition, the proportion of a solvent having the highest boiling point is preferably 40 to 90 wt %, more preferably 50 to 90 wt %, further preferably 65 to 85 wt % based on the weight of all solvents in the ink composition from the standpoint of viscosity and film formability.

As the ink composition of the present invention, preferable from the standpoint of viscosity and film formability are a composition composed of anisole and bicyclohexyl, a composition composed of anisole and cyclohexylbenzene, a composition composed of xylene and bicyclohexyl, a composition composed of xylene and cyclohexylbenzene, and a composition composed of mesitylene and methyl benzoate.

Of additives which can be contained in the ink composition of the present invention, mentioned as the hole transporting layer are polyvinylcarbazole or derivatives thereof, polysilane or derivatives thereof, polysiloxane derivatives having an aromatic amine at a side chain or main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, and poly(2,5-thienylenevinylene) or derivatives thereof.

Mentioned as the electron transporting material are oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives; metal complexes of 8-hydroxyquinoline or derivatives thereof; polyquinoline or derivatives thereof, polyquinoxaline or derivatives thereof, polyfluorene or derivatives thereof.

Mentioned as the light emitting material are naphthalene derivatives, anthracene or derivatives thereof, perylene or derivatives thereof; coloring matters such as polymethine, xanthene, coumarin, cyanine and the like; metal complexes of 8-hydroxyquinoline or derivatives thereof; aromatic amines, tetraphenylcyclopentadiene or derivatives thereof, tetraphenylbutadiene or derivatives thereof, and the like.

The ink composition (solution) of the present invention may contain additives for controlling viscosity and/or surface tension in addition to the polymer compound of the present invention. As the additives, polymer compounds of higher molecular weight (thickening agents) for enhancing viscosity, poor solvents, compounds of lower molecular weight for lowering viscosity, surfactants for lowering surface tension, and the like may be appropriately combined and used.

As the above-described polymer compound of higher molecular weight, those which are soluble in the same solvent as for the polymer compound of the present invention and do not disturb light emission and charge transportation are advantageous. For example, polystyrene and polymethyl methacrylate of higher molecular weight, or polymer compounds of the present invention having higher molecular weight, and the like can be used. The weight average molecular weight is preferably 500000 or more, and more preferably 1000000 or more.

A poor solvent can also be used as a thickening agent. That is, viscosity can be enhanced by adding a small amount of poor solvent for solid components in a solution. When a poor solvent is added for this purpose, the kind and addition amount of the solvent may be advantageously selected so as not to cause deposition of solid components in a solution.

The ink composition (solution) of the present invention may contain an antioxidant for improving preservation stability in addition to the polymer compound of the present invention. As the antioxidant, those which are soluble in the same solvent as for the polymer compound of the present invention and dot not disturb light emission and charge transportation are advantageous, and exemplified are phenol-based antioxidants, phosphorus-based antioxidants and the like.

From the standpoint of solubility of the polymer compound of the present invention into a solvent, the difference between solubility parameter of the solvent and solubility parameter of the polymer compound is preferably 10 or less, more preferably 7 or less.

The solubility parameter of the solvent and the solubility parameter of the polymer compound of the present invention can be measured by a method described in "Solvent Handbook (Kodansha Ltd. Publishers, 1976)".

Listed as the polymer LED of the present invention are a polymer LED having an electron transporting layer provided between a cathode and a light emitting layer, a polymer LED having a hole transporting layer provided between an anode and a light emitting layer, a polymer LED having an electron transporting layer provided between a cathode and a light emitting layer, and having a hole transporting layer provided between an anode and a light emitting layer, and the like.

For example, the following structures a) to d) are specifically exemplified.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (wherein, / denotes adjacent lamination of layers, applicable also in the following descriptions)

The polymer LED of the present invention includes also those in which a polymer compound of the present invention is contained in a hole transporting layer and/or electron transporting layer.

When the polymer compound of the present invention is used in a hole transporting layer, it is preferable that the polymer compound of the present invention is a polymer compound containing a hole transporting group, and specific examples thereof include a copolymer with an aromatic amine, a copolymer with stilbene, and the like.

When the polymer compound of the present invention is used in an electron transporting layer, it is preferable that the polymer compound of the present invention is a polymer compound containing an electron transporting group, and specific examples thereof include a copolymer with oxadiazole, a copolymer with triazole, a copolymer with quinoline, copolymer with quinoxaline, a copolymer with benzothiazole, and the like.

When the polymer LED of the present invention has a hole transporting layer, exemplified as the hole transporting material to be used are polyvinylcarbazole or its derivatives, polysilane or its derivatives, polysiloxane derivatives having an aromatic amine in a side chain or main chain, pyrazoline derivatives, arylamine derivatives, stilbene derivatives, triphenyldiamine derivatives, polyaniline or its derivatives, polythiophene or its derivatives, polypyrrole or its derivatives, poly(p-phenylenevinylene) or its derivatives, poly(2,5-thienylenevinylene) or its derivatives, and the like.

Specifically, exemplified as the hole transporting material are those described in JP-A Nos. 63-70257 and 63-175860, JP-A Nos. 2-135359, 2-135361, 2-209988, 3-37992 and 3-152184, and the like.

Of them, preferable as the hole transporting material used in a hole transporting layer are high molecular weight hole transporting materials such as polyvinylcarbazole or its derivatives, polysilane or its derivatives, polysiloxane derivatives having an aromatic amine compound group in a side chain or main chain, polyaniline or its derivatives, polythiophene or its derivatives, poly(p-phenylenevinylene) or its derivatives, poly(2,5-thienylenevinylene) or its derivatives, and the like, and further preferable are polyvinylcarbazole or its derivatives, polysilane or its derivatives and polysiloxane derivatives having an aromatic amine in a side chain or main chain.

As the hole transporting material of a low molecular weight compound, exemplified are pyrazoline derivatives, arylamine derivatives, stilbene derivatives and triphenyldiamine derivatives. In the case of a low molecular weight hole transporting material, it is preferably dispersed in a polymer binder in use.

As the polymer binder to be mixed, those not extremely disturbing charge transportation are preferable and those showing no strong absorption for visible ray are suitably used. As the polymer binder, exemplified are poly(N-vinylcarbazole), polyaniline or its derivatives, polythiophene or its derivatives, poly(p-phenylenevinylene) or its derivatives, poly(2,5-thienylenevinylene) or its derivatives, polycarbonate, polyacrylate, polymethyl acrylate, polymethyl methacrylate, polystyrene, polyvinyl chloride, polysiloxane and the like.

Polyvinylcarbazole or its derivatives are obtained, for example, from vinyl monomers by cation polymerization or radical polymerization.

As polysilane or its derivatives, compounds described in Chem. Rev., vol. 89, p. 1359 (1989), GB Patent No. 2300196 and the like are exemplified. Also as the synthesis method, methods described in these publications can be used, and particularly, Kipping method is suitably used.

As polysiloxane or its derivatives, those having a structure of the above-mentioned low molecular weight hole transporting material in its side chain or main chain are suitable since the siloxane skeleton structure shows little hole transporting property. Particularly, those having a hole transporting aromatic amine in a side chain or main chain are exemplified.

Though the method of forming a hole transporting layer is not particularly restricted, a method of film formation from a mixed solution with a polymer binder is exemplified in the case of a low molecular weight hole transporting material. A method of film formation from a solution is exemplified in the case of a high molecular weight hole transporting material.

As the solvent used for film formation from a solution, those which can dissolve a hole transporting material are not particularly restricted. Exemplified as the solvent are chlorine-based solvents such as chloroform, methylene chloride, 1,2-dichloroethane and the like, ether solvents such as tetrahydrofuran and the like, aromatic hydrocarbon solvents such as toluene, xylene and the like, ketone solvents such as acetone, methyl ethyl ketone and the like, ester solvents such as ethyl acetate, butyl acetate, ethyl cellosolve acetate and the like.

As the method of film formation from a solution, there can be used application methods such as a spin coat method, casting method, micro gravure coat method, gravure coat method, bar coat method, role coat method, wire bar coat method, dip coat method, spray coat method, screen printing method, flexo printing method, offset printing method, inkjet printing method and the like from a solution.

The optimum value of the thickness of a hole transporting layer varies depending on a material to be used, and the thickness may be advantageously selected so as to give suitable driving voltage and light emission efficiency, and at least thickness not causing generation of pin holes is necessary, and when too thick, the driving voltage of a device increases undesirably. Thus, the thickness of the hole transporting layer is, for example, 1 nm to 1 μm, preferably 2 nm to 500 nm, further preferably 5 nm to 200 nm.

When the polymer LED of the present invention has an electron transporting layer, known materials can be used as an electron transporting material to be used, and exemplified are oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, or metal complexes of 8-hydroxyquinoline or its derivatives, polyquinoline or its derivatives, polyquinoxaline or its derivatives, polyfluorene or its derivatives, and the like.

Specifically, those described in JP-A Nos. 63-70257 and 63-175860, JP-A Nos. 2-135359, 2-135361, 2-209988, 3-37992 and 3-152184, and the like are exemplified.

Of them, oxadiazole derivatives, benzoquinone or its derivatives, anthraquinone or its derivatives, or metal complexes of 8-hydroxyquinoline or its derivatives, polyquinoline or its derivatives, polyquinoxaline or its derivatives, polyfluorene or its derivatives are preferable, and 2-(4-biphenylyl)-5-(4-t-butylphenyl)-1,3,4-oxadiazole, benzoquinone, anthraquinone, tris(8-quinolinol)aluminum and polyquinoline are further preferable.

The method of forming an electron transporting layer is not particularly restricted, and in the case of a low molecular weight electron transporting material, a vacuum vapor deposition method from a powder, or a film formation method from a solution or melted condition is exemplified, and in the case of a high molecular weight electron transporting material, a film formation method from a solution or melted condition is exemplified, respectively. In film formation from a solution or melted condition, the above-mentioned polymer binder may be used together.

As the solvent used for film formation from a solution, those which can dissolved an electron transporting material and/or polymer binder are suitable. Exemplified as the solvent are chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, ester solvents such as ethyl acetate, butyl acetate, ethyl cellosolve acetate and the like.

As the method of film formation from a solution, there can be used application methods such as a spin coat method, casting method, micro gravure coat method, gravure coat method, bar coat method, role coat method, wire bar coat method, dip coat method, spray coat method, screen printing method, flexo printing method, offset printing method, inkjet printing method and the like from a solution.

The optimum value of the thickness of an electron transporting layer varies depending on a material to be used, and the thickness may be advantageously selected so as to give suitable driving voltage and light emission efficiency, and at least thickness not causing generation of pin holes is necessary, and when too thick, the driving voltage of a device increases undesirably. Thus, the thickness of the electron transporting layer is, for example, 1 nm to 1 µm, preferably 2 nm to 500 nm, further preferably 5 nm to 200 nm.

Of charge transporting layers provided adjacent to an electrode, those having a function of improving charge injection efficiency from an electrode and having an effect of lowering driving voltage of a device are, in general, called particularly a charge injection layer (hole injection layer, electron injection layer) in some cases.

Further, for improving close adherence with an electrode and improving charge injection from an electrode, the above-mentioned charge injection layer or an insulation layer having a thickness of 2 nm or less may be provided adjacently to an electrode, and for improving close adherence of an interface and preventing mixing, and the like, a thin buffering layer may be inserted in an interface of a charge transporting layer or a light emitting layer.

The order and number of layers to be laminated, and the thicknesses of respective layers can be appropriately selected in view of light emission efficiency and device life.

The polymer compound of the present invention can be used also as a polymer electric field effect transistor as an organic semiconductor thin film. Regarding the structure of the polymer electric field effect transistor, it is usually advantageous that a source electrode and a drain electrode are provided in close proximity to an active layer composed of a polymer and gate electrodes are provided sandwiching an insulation layer in close proximity to the active layer.

The polymer electric field effect transistor is usually formed on a supporting substrate. The material of the supporting substrate is not particularly restricted providing it does not disturb a property as the electric field effect transistor, and also a glass substrate, flexible film substrate and plastic substrate can also be used.

The electric field effect transistor can be produced by known methods, for example, a method described in JP-A No. 5-110069.

It is very advantageous and preferable for production, to use a polymer soluble in an organic solvent in forming the active layer. As the method for film formation from a solution prepared by dissolving a polymer in an organic solvent, application methods such as a spin coat method, casting method, micro gravure coat method, gravure coat method, bar coat method, roll coat method, wire bar coat method, dip coat method, spray coat method, screen printing method, flexographic printing method, offset printing method, inkjet printing method and the like can be used.

A sealed polymer electric field effect transistor obtained by performing sealing after production of a polymer electric field effect transistor is preferable. By this, a polymer electric field effect transistor is blocked from atmospheric air and lowering of a property of a polymer electric field effect transistor can be suppressed.

As the sealing method, there are mentioned a method for covering with a UV hardening resin, thermosetting resin, inorganic SiONx film and the like, a method for pasting glass plates or films together with a UV hardening resin, thermosetting resin and the like, and other methods. For effectively blocking from atmospheric air, it is preferable that a process from production of a polymer electric field effect transistor to insulation thereof is performed without exposing to atmospheric air (for example, in dried nitrogen atmosphere, in vacuum and the like).

In the present invention, listed as the polymer LED having a provided charge injection layer (electron injection layer, hole injection layer) are a polymer LED having a charge injection layer provided adjacently to a cathode and a polymer LED having a charge injection layer provided adjacently to an anode.

For example, the following structures e) to p) are specifically mentioned.

e) anode/hole injection layer/light emitting layer/cathode
f) anode/light emitting layer/charge injection layer/cathode
g) anode/charge injection layer/light emitting layer/charge injection layer/cathode
h) anode/charge injection layer/hole transporting layer/light emitting layer/cathode
i) anode/hole transporting layer/light emitting layer/charge injection layer/cathode j) anode/charge injection layer/hole transporting layer/light emitting layer/charge injection layer/cathode k) anode/charge injection layer/light emitting layer/electron transporting layer/cathode l) anode/light emitting layer/electron transporting layer/charge injection layer/cathode m) anode/charge injection layer/light emitting layer/electron transporting layer/charge injection layer/cathode n) anode/charge injection layer/hole transporting layer/light emitting layer/electron transporting layer/cathode o) anode/hole transporting layer/light emitting layer/electron transporting layer/charge injection layer/cathode p) anode/charge injection layer/hole transporting layer/light emitting layer/electron transporting layer/charge injection layer/cathode As specific examples of the charge injection layer, there are exemplified a layer containing an electrically conductive polymer, a layer provided between an anode and a hole transporting layer and containing a material having ionization potential of an intermediate value between that of an anode material and that of a hole transporting material contained in the hole transporting layer, a layer provided between a cathode and an electron transporting layer and containing a material having electron affinity of an intermediate value between that of a cathode material and that of an electron transporting material contained in the electron transporting layer, and the like.

When the above-mentioned charge injection layer contains an electrically conductive polymer, the electric conductivity of the electrically conductive polymer is preferably $10^{-5}$ S/cm or more and $10^3$ or less, and for decreasing leak current between light emitting picture elements, more preferably $10^{-5}$ S/cm or more and $10^2$ or less, further preferably $10^{-5}$ S/cm or more and $10^1$ or less.

When the above-mentioned charge injection layer contains an electrically conductive polymer, the electric conductivity of the electrically conductive polymer is preferably $10^{-5}$ S/cm or more and $10^3$ or less, and for decreasing leak current between light emitting picture elements, more preferably $10^{-5}$ S/cm or more and $10^2$ or less, further preferably $10^{-5}$ S/cm or more and $10^1$ or less.

Usually, for setting the electric conductivity of the electrically conductive polymer at $10^{-5}$ S/cm or more and $10^3$ or less, the electrically conductive polymer is doped with suitable amount of ions.

Regarding the kind of an ion to be doped, an anion is used in a hole injection layer and a cation is used in an electron injection layer. Examples of the anion include a polystyrenesulfonate ion, alkylbenzenesulfonate ion, camphorsulfonate ion and the like, and examples of the cation include a lithium ion, sodium ion, potassium ion, tetrabutylammonium ion and the like.

The thickness of a charge injection layer is, for example, 1 nm to 100 nm, preferably 2 nm to 50 nm.

The material used in a charge injection layer may be advantageously selected appropriately in relation to a material of an electrode or adjacent layer, and exemplified are polyaniline and its derivatives, polythiophene and its derivatives, pyrrole and its derivatives, polyphenylenevinylene and its derivatives, polythienylenevinylene and its derivatives, polyquinoline and its derivatives, polyquinoxaline and its derivatives, electrically conductive polymers such as a polymer containing an aromatic amine structure in a main chain or side chain, metal phthalocyanine (copper phthalocyanine and the like), carbon and the like.

The insulation layer having a thickness of 2 nm or less has a function of making charge injection easy. As the material of the above-mentioned insulation layer, metal fluorides, metal oxides, organic insulation materials and the like are mentioned. As the polymer LED provided with an insulation layer having a thickness of 2 nm or less, there are mentioned a polymer LED having an insulation layer having a thickness of 2 nm or less provided adjacently to a cathode and a polymer LED having an insulation layer having a thickness of 2 nm or less provided adjacently to an anode.

Specifically, the following structures q) to ab) are listed, for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode The base plate for forming a polymer LED of the present invention may advantageously be that which does not change in forming and electrode and forming a layer of an organic material, and examples thereof include glass, plastic, polymer films, silicon base plates and the like. In the case of an opaque base plate, it is preferable that the opposite electrode is transparent or semi-transparent.

Usually, at least one of an anode and a cathode in a polymer LED of the present invention is transparent or semi-transparent. It is preferable that the anode side is transparent or semi-transparent.

As the material of the anode, electrically conductive metal oxide membranes, semi-transparent metal films and the like are used. Specifically, membranes (NESA and the like) formed using an electrically conductive glass composed of indium oxide, zinc oxide, tin oxide, and their composites indium.tin.oxide (ITO), indium.zinc.oxide and the like, and gold, platinum, silver, copper and the like are used, and preferable are ITO, indium.zinc.oxide and tin oxide. As the production method, a vacuum vapor deposition method, sputtering method, ion plating method, plating method and the like are mentioned. As the anode, organic transparent conductive membranes of polyaniline or its derivatives, polythiophene or its derivatives, and the like may be used.

The thickness of an anode can be appropriately selected in view of light transmission and electric conductivity, and for example, 10 nm to 10 μm, preferably 20 nm to 1 μm, further preferably 50 nm to 500 nm.

For making charge injection easy, a layer composed of a phthalocyanine derivative, electrically conductive polymer, carbon and the like, or a layer having an average thickness of 2 nm or less composed of a metal oxide, metal fluoride, organic insulation material or the like may be provided on an anode.

As the material of a cathode used in a polymer LED of the present invention, materials of small work function are preferable. For examples, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys composed of two or more of then, or alloys composed of at least one of them and at least one of gold, silver, platinum, copper, manganese, titanium, cobalt, nickel, tungsten and tin, and graphite or graphite intercalation compounds, and the like are used. As examples of the alloy, magnesium-silver alloy, magnesium-indium alloy, magnesium-aluminum alloy, indium- silver alloy, lithium-aluminum alloy, lithium-magnesium alloy, lithium- indium alloy, calcium-aluminum alloy, and the like are mentioned. The cathode may have a lamination structure composed of two or more layers.

The thickness of the cathode can be appropriately selected in view of electric conductivity and durability, and for example, 10 nm to 10 μm, preferably 20 nm to 1 μm, further preferably 50 nm to 500 nm.

As the method of producing a cathode, a vacuum vapor deposition method, sputtering method, lamination method of thermally press-bonding a metal film, and the like are used. Between a cathode and an organic substance layer, a layer composed of an electrically conductive polymer, or a layer having an average thickness of 2 nm or less composed of a metal oxide, metal fluoride, organic insulation material or the like may be provided. After producing a cathode, a protective layer may be installed for protecting the polymer LED. For using the polymer LED stably for a long period of time, it is preferable to install a protective layer and/or protective cover for protecting the device from outer environments.

As the protective layer, polymer compounds, metal oxides, metal fluorides, metal borides and the like can be used. As the protective cover, a glass plate, a plastic plate having a surface subjected to treatment for lowering water permeability, and the like can be used, and a method of sealing by pasting the cover to a device base plate with a thermo-setting resin or photo-curing resin is suitably used. When a space is maintained using a spacer, prevention of scaring of a device is easy. When the space is filled with an inert gas such as nitrogen and argon, oxidation of a cathode can be prevented. Further, by placing a drier such as barium oxide and the like in the space, imparting damage to a device by moisture adsorbed in the production process is suppressed easily. Of them, any one or more means are preferably adopted.

The polymer LED of the present invention can be used for sheet light sources, segment displays, dot matrix displays, liquid crystal displays (for example, backlight of liquid crystal display).

For obtaining light emission in the form of sheet using a polymer LED of the present invention, a sheet anode and a sheet cathode may be advantageously placed so as to overlap. For obtaining light emission in the form of pattern, there are a method in which a mask equipped with windows in the form of pattern is placed on the surface of the above-mentioned light emitting device in the form of sheet, a method in which an organic substance layer at a non-light emitting part is formed with extremely large thickness to establish substantially no-light emission, a method in which either an anode or a cathode, or both electrodes are formed in the form of pattern. By forming a pattern by any of these methods and placing several electrodes so that on/off can be switched independently, a display device of segment type capable of displaying numbers and letters, and simple marks and the like is obtained. Further, for obtaining a dot matrix device, it may be advantageous that both of an anode and a cathode are formed in the form of stripe and placed so as to cross. By a method of separately painting a plurality of light emitting materials of different emitting colors or a method of using a color filter or fluorescence exchange filter, it becomes possible to attain partial color display or multi-color display. The dot matrix device may be passively driven or actively driven in combination with TFT and the like. These displays can be used as a display of computers, televisions, portable terminals, portable telephones, car navigations, video camera view finders and the like.

The above-mentioned light emitting device in the form of sheet is of self emitting thin type, and can be suitably used as a sheet light source for back light of a liquid crystal display, or a sheet light source for illumination. If a flexible base plate is used, it can also be used as a light source or display in the form of curved surface.

Examples are shown below for illustrating the present invention further in detail, however, the present invention is not limited to them.

(Number Average Molecular Weight and Weight Average Molecular Weight)

Here, as the number average molecular weight and weight average molecular weight, polystyrene reduced number average molecular weight and polystyrene reduced weight average molecular weight were measured by GPC (manufactured by Shimadzu Corporation.; LC-10Avp). A polymer to be subjected to measurement was dissolved in tetrahydrofuran so as give a concentration of about 0.5 wt %, and the resultant solution was injected in an amount of 50 μL into GPC. As the mobile phase of GPC, tetrahydrofuran was used and allowed to flow at a flow rate of 0.6 mL/min. Regarding the column, two columns of TSKgel Super HM-H (manufactured by Tosoh Corporation) and one column of TSKgel Super H2000 (manufactured by Tosoh Corporation) were connected serially. As the detector, a differential refractive index detector (manufactured by Shimadzu Corporation: RID-10A) was used.

(Fluorescence Spectrum)

Measurement of fluorescence spectrum was carried out by the following method. A 0.8 wt % solution of a polymer was spin-coated on quartz to form a thin film of the polymer. This thin film was excited at a wavelength of 350 nm, and fluorescence spectrum was measured using a fluorescence spectrophotometer (manufactured by Horiba Ltd.: Fluorolog). For obtaining relative fluorescence intensity on the thin film, fluorescence spectrum in which wave numbers are plotted against the intensity of Raman line of water as standard was integrated in a spectrum measurement range, and allocated with absorbances at excitation wavelengths, measured using a spectrophotometer (manufactured by Varian; Cary5E).

(HPLC Measurement)

Measuring apparatus: Agilent 1100LC

Measuring condition: L-Column ODS, 5 μm, 2.1 mm×150 mm;

Liquid A: acetonitrile, Liquid B: THF

Gradient

Liquid B:

0% (60 min.)→10% up/min→100% (10 min.)

Sample concentration: 5.0 mg/mL (THF solution)

Injection amount: 1 μL

Detection wavelength: 350 nm

SYNTHESIS EXAMPLE 1

Synthesis of 1-bromo-4-t-butyl-2,6-dimethylbenzene

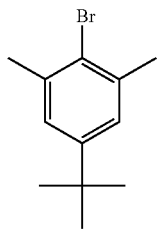

Under an inert atmosphere, 225 g of acetic acid was charged into a 500 ml three-necked flask, and to this was added 24.3 g of 5-t-butyl-m-xylene. Subsequently, 31.2 g of bromine was added, then, the solution was reacted at 15 to 20° C. for 3 hours.

The reaction liquid was added to 500 ml of water and the deposited precipitate was filtrated. The precipitate was washed with 250 ml of water twice, to obtain 34.2 g of white solid.

Synthesis of N,N'-diphenyl-N,N'-bis(4-t-butyl-2,6-dimethylphenyl)-1,4-phenylenediamine

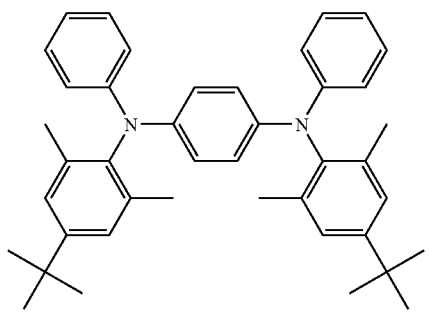

Under an inert atmosphere, 36 ml of deaerated dehydrated toluene was charged into a 100 ml three-necked flask, and to this was added 0.63 g of tri(t-butyl)phosphine. Subsequently, 0.41 g of tris(dibenzylideneacetone)dipalladium, 9.6 g of 1-bromo-4-t-butyl-2,6-dimethylbenzene, 5.2 g of t-butoxysodium and 4.7 g of N,N'-diphenyl-1,4-phenylenediamine were added, then, the solution was reacted at 100° C. for 3 hours.

The reaction liquid was added to 300 ml of saturated saline, and extracted with 300 ml of chloroform warmed at about 50° C. The solvent was distilled off, then, 100 ml of toluene was added and the mixture was heated until dissolving of solid and allowed to cool, then, the resultant precipitate was filtrated to obtain 9.9 g of white solid.

Synthesis of N,N'-bis(4-bromophenyl)-N,N'-bis(4-t-butyl-2,6-dimethylphenyl)-1,4-phenylenediamine

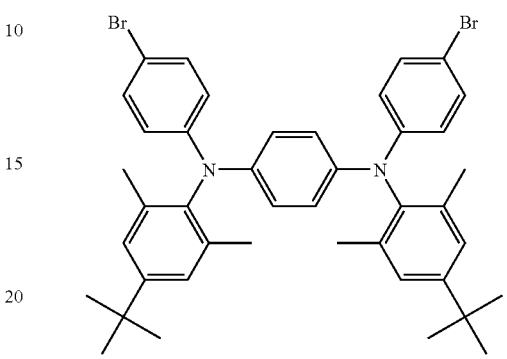

Under an inert atmosphere, 350 ml of dehydrated N,N-dimethylformamide was charged into a 1000 ml three-necked flask, and 5.2 g of N'-diphenyl-N,N'-bis(4-t-butyl-2,6-dimethylphenyl)-1,4-phenylenediamine was dissolved, then, a N-bromosuccinimide 3.5 g/N,N-dimethylformamide solution was dropped in an ice bath, and the resultant solution was reacted over night and day.

150 ml of water was added to the reaction solution, the deposited precipitate was filtrated and washed with 50 ml of methanol twice to obtain 4.4 g of white solid.

$^1$H-NMR (300 MHz/THF-d8):

δ(ppm)=1.3 [s, 18H], 2.0 [s, 12H], 6.6 to 6.7 [d, 4H], 6.8 to 6.9 [br, 4H], 7.1 [s, 4H], 7.2 to 7.3 [d, 4H]

MS (FD$^+$)M$^+$738

SYNTHESIS EXAMPLE 2

Synthesis of N,N'-diphenyl-N,N'-bis(4-t-butyl-2,6-dimethylphenyl)-benzidine

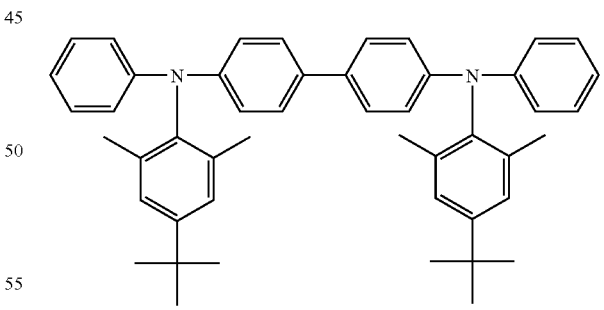

Under an inert atmosphere, 1660 ml of dehydrated toluene was charged into a 300 ml three-necked flask, and to this was added 275.0 g of N,N'-diphenylbenzidine and 449.0 g of 4-t-butyl-2,6-dimethylbromobenzene. Subsequently, 7.48 g of tris(dibenzylideneacetone)dipalladium and 196.4 g of t-butoxysodium were added, then, 5.0 g of tri(t-butyl)phosphine was added. Thereafter, the resultant solution was reacted at 105° C. for 7 hours.

To the reaction liquid was added 2000 ml of toluene and the solution was filtrated through cerite, the filtrate was washed with 1000 ml of water three times, then, concentrated to 700 ml. To this was added 1600 ml of a toluene/methanol (1:1) solution, and the deposited crystal was filtrated and washed with methanol. 479.4 g of white solid was obtained.

Synthesis of N,N'-bis(4-bromophenyl)-N,N'-bis(4-t-butyl-2,6-dimethylphenyl)-benzidine

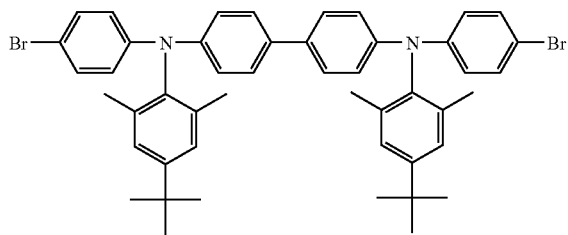

Under an inert atmosphere, into 4730 g of chloroform was dissolved 472.8 g of the above-mentioned N,N'-diphenyl-N, N'-bis(4-t-butyl-2,6-dimethylphenyl)-benzidine, then, 281.8 g of N-bromosuccinimide was charged in 12-divided portions under light shielding in an ice bath over 1 hour, and the solution was reacted for 3 hours.

1439 ml of chloroform was added to the reaction liquid, and filtrated, and a chloroform solution of the filtrate was washed with 2159 ml of 5% sodium thiosulfate, and toluene was distilled off to obtain a white crystal. The resultant white crystal was re-crystallized from toluene/ethanol, to obtain 678.7 g of a white crystal.

MS(APCI(+)): (M+H)$^+$815.2

EXAMPLE 1

Synthesis of Compound B

Synthesis of Compound A

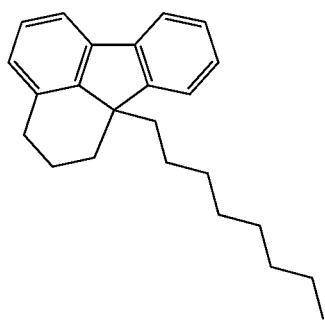
(compound A)

Into a reaction vessel was charged 31 ml of ion exchanged water, and 29 g of sodium hydroxide (727 mmol) was added portion-wise while stirring to attain completion dissolution. An atmosphere in the system was purged with argon, and 30 ml of toluene and 5.0 g (24 mmol) of 1,2,3,10b-tetrahydrofluoranthene were placed and, dissolved by stirring. Subsequently, 2.3 g (7.3 mmol) of tetrabutylammonium bromide and 9.4 g (48 mmol) of octyl bromide were added and reacted at 40° C. for 3 hours. Liquid separation into toluene and water was performed, the organic layer was extracted, then, dried over sodium sulfate. The solvent was distilled off, then, purification was performed by a silica gel column using hexane as a developing solvent, to obtain 6.45 g of a pale yellow crystal.

MS(APCI(+)): 318 ([M+H]$^+$)

$^1$H-NMR (300 MHz/CDCl$_3$) δ7.69 (1H, d), 7.50 (1H, d), 7.40 (1H, d), 7.34 to 7.22 (3H, m), 7.03 (1H, d), 3.07 to 2.96 (1H, m), 2.77 to 2.70 (1H, m), 2.37 to 2.18 (2H, m), 1.95 to 1.74 (3H, m), 1.27 to 1.04 (11H, m), 0.84 to 0.69 (5H, m)

Synthesis of Compound B

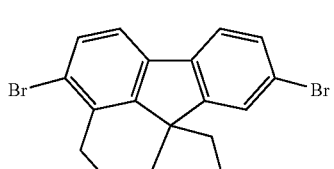
(compound B)

Into an argon-purged reaction vessel was added 5.8 g (18 mmol) of compound A and 115 ml of a mixed solvent of acetic acid: dichloromethane=1:1, and the mixture was stirred at room temperature to cause dissolution. Subsequently, 14 g (36 mmol) of benzyltrimethylammonium tribromide was added and, zinc chloride was added while stirring until complete dissolution of benzyltrimethylammonium tribromide. While tracing the reaction by HPLC, benzyltrimethylammonium tribromide and zinc chloride were added appropriately. After completion of the reaction, liquid separation into chloroform and water was performed, the organic layer was extracted, washed with water twice, then, neutralized with an aqueous potassium carbonate solution. After drying over sodium sulfate, the solvent was distilled off, purification was performed by a silica gel column using hexane as a developing solvent, then, re-crystallized from an ethanol:hexane=10:1 mixed solvent, to obtain 5.08 g of compound B as while powder.

MS(APPI(+)) 476 (M$^+$)

$^1$H-NMR (300 MHz/CDCl$_3$) δ7.53 to 7.43 (4H, m), 7.33 (1H, d), 2.90 to 2.84 (2H, m), 2.33 to 2.22 (2H, m), 2.05 to 1.96 (1H, m), 1.83 to 1.64 (2H, m), 1.32 to 1.05 (13H, m), 0.85 to 0.81 (3H, m)

EXAMPLE 2

Synthesis of Polymer Compound 1

Compound B (0.1 g) and 2,2'-bipyridyl (0.089 g) were dissolved in 19 mL of dehydrated tetrahydrofuran, then, to this solution was added bis(1,5-cyclooctadiene)nickel(0) {Ni(COD)$_2$} (0.156 g) under a nitrogen atmosphere, and the mixture was heated up to 60° C. and reacted for 3 hours. This reaction liquid was cooled down to room temperature, and dropped into a mixed solution of 25% ammonia water 1 mL/methanol 19 mL/ion exchanged water 19 mL and the mixture was stirred for 1 hour, then, the deposited precipitate was filtrated and dried under reduced pressure. The yield of the resultant polymer (hereinafter, referred to as polymer compound 1) was 0.08 g. The polystyrene reduced number average molecular weight was $2.9\times10^4$ and the polystyrene reduced weight average molecular weight was $6.1\times10^4$.

EXAMPLE 3

Synthesis of Polymer Compound 2

Compound B (0.557 g), N,N'-bis(4-bromophenyl)-N,N'-bis(4-t-butyl-2,6-dimethylphenyl)-1,4-phenylenediamine (0.096 g) and 2,2'-bipyridyl (0.548 g) were dissolved in 140 mL of dehydrated tetrahydrofuran, then, bubbling with argon was performed to purge an atmosphere in the system by nitrogen. The solution was heated up to 60° C., then, to this solution was added bis(1,5-cyclooctadiene)nickel(0) {Ni(COD)$_2$} (0.965 g) under a nitrogen atmosphere, and the mixture was stirred and reacted for 3 hours. This reaction liquid was cooled down to room temperature, and dropped into a mixed solution of 25% ammonia water 5 mL/methanol 140 mL/ion exchanged water 140 mL and the mixture was stirred for 1 hour, then, the deposited precipitate was filtrated and dried under reduced pressure, and dissolved in 40 ml of toluene. After dissolution, 1.6 g of radiolite was added and the mixture was stirred for 30 minutes, and insoluble materials were filtrated. The resultant filtrate was purified by passing through an alumina column. Next, 80 mL of 5.2% hydrochloric acid water was added and the mixture was stirred for 3 hours, then, the aqueous phase was removed. Subsequently, 80 mL of 4% ammonia water was added and the mixture was stirred for 2 hours, then, the aqueous phase was removed. Further, about 80 mL of ion exchanged water was added to the organic layer and the mixture was stirred for 1 hour, then, the aqueous phase was removed. Thereafter, the organic layer was poured into 160 ml of methanol and the mixture was stirred for 1 hour, and the deposited precipitate was filtrated and dried under reduced pressure. The yield of the resultant polymer (hereinafter, referred to as polymer compound 2) was 0.33 g. The polystyrene reduced number average molecular weight and the polystyrene reduced weight average molecular weight were $Mn=1.6\times10^4$ and $Mw=8.7\times10^4$, respectively.

EXAMPLE 4

Synthesis of Polymer Compound 3

Compound B (0.433 g), N,N'-bis (4-bromophenyl)-N,N'-bis (4-t-butyl-2,6-dimethylphenyl)-benzidine (0.318 g) and 2,2'-bipyridyl (0.548 g) were dissolved in 140 mL of dehydrated tetrahydrofuran, then, bubbling with argon was performed to purge an atmosphere in the system by nitrogen. The solution was heated up to 60° C., then, to this solution was added bis(1,5-cyclooctadiene)nickel(0) {Ni(COD)$_2$} (0.965 g) under a nitrogen atmosphere, and the mixture was stirred and reacted for 3 hours. This reaction liquid was cooled down to room temperature, and dropped into a mixed solution of 25% ammonia water 5 mL/methanol 140 mL/ion exchanged water 140 mL and the mixture was stirred for 1 hour, then, the deposited precipitate was filtrated and dried under reduced pressure, and dissolved in 40 ml of toluene. After dissolution, 1.6 g of radiolite was added and the mixture was stirred for 30 minutes, and insoluble materials were filtrated. The resultant filtrate was purified by passing through an alumina column. Next, 80 mL of 5.2% hydrochloric acid water was added and the mixture was stirred for 3 hours, then, the aqueous phase was removed. Subsequently, 80 mL of 4% ammonia water was added and the mixture was stirred for 2 hours, then, the aqueous phase was removed. Further, about 80 mL of ion exchanged water was added to the organic layer and the mixture was stirred for 1 hour, then, the aqueous phase was removed. Thereafter, the organic layer was poured into 160 ml of methanol and the mixture was stirred for 1 hour, and the deposited precipitate was filtrated and dried under reduced pressure. The yield of the resultant polymer (hereinafter, referred to as polymer compound 3) was 0.46 g. The polystyrene reduced number average molecular weight and the polystyrene reduced weight average molecular weight were $Mn=1.0\times10^4$ and $Mw=6.1\times10^4$, respectively.

EXAMPLE 5

Synthesis of Polymer Compound 4

Compound B (0.588 g), N,N'-bis(4-bromophenyl)-N,N'-bis(4-t-butyl-2,6-dimethylphenyl)-benzidine (0.053 g) and 2,2'-bipyridyl (0.548 g) were dissolved in 140 mL of dehydrated tetrahydrofuran, then, bubbling with argon was performed to purge an atmosphere in the system by nitrogen. The solution was heated up to 60° C., then, to this solution was added bis(1,5-cyclooctadiene)nickel(0) {Ni(COD)$_2$} (0.965 g) under a nitrogen atmosphere, and the mixture was stirred and reacted for 3 hours. This reaction liquid was cooled down to room temperature, and dropped into a mixed solution of 25% ammonia water 5 mL/methanol 140 mL/ion exchanged water 140 mL and the mixture was stirred for 1 hour, then, the deposited precipitate was filtrated and dried under reduced pressure, and dissolved in 40 ml of toluene. After dissolution, 1.6 g of radiolite was added and the mixture was stirred for 30 minutes, and insoluble materials were filtrated. The resultant filtrate was purified by passing through an alumina column. Next, 80 mL of 5.2% hydrochloric acid water was added and the mixture was stirred for 3 hours, then, the aqueous phase was removed. Subsequently, 80 mL of 4% ammonia water was added and the mixture was stirred for 2 hours, then, the aqueous phase was removed. Further, about 80 mL of ion exchanged water was added to the organic layer and the mixture was stirred for 1 hour, then, the aqueous phase was removed. Thereafter, the organic layer was poured into 160 ml of methanol and the mixture was stirred for 1 hour, and the deposited precipitate was filtrated and dried under reduced pressure. The yield of the resultant polymer (hereinafter, referred to as polymer compound 4) was 0.31 g. The polystyrene reduced number average molecular weight and the polystyrene reduced weight average molecular weight were $Mn=2.5\times10^4$ and $Mw=1.2\times10^5$, respectively.

EXAMPLE 6

Manufacturing and Performance of EL Device

Preparation of Solution

The polymer compound 2 obtained above was dissolved in toluene, to obtain a toluene solution having a polymer concentration of 1.8 wt %.

Manufacturing of EL Device

On a glass substrate carrying thereon an ITO film with a thickness of 150 nm formed by a sputtering method, a solution obtained by filtrating a suspension of poly(3,4)ethylenedioxythiophene/polystyrenesulfonic acid (manufactured by Bayer, BaytronP AI4083) through a 0.2 μm membrane filter was spin-coated to form a thin film with a thickness of 70 nm, and dried on a hot plate at 200° C. for 10 minutes. Next, the toluene solution obtained above was spin-coated at a revolution of 3400 rpm to form a film. The thickness after film formation was about 95 nm. Further, this was dried at 80° C. for 1 hour under reduced pressure, then, lithium fluoride was vapor-deposited with a thickness of about 4 nm, and as a cathode, calcium was vapor-deposited with a thickness of about 5 nm and, then, aluminum was vapor-deposited with a thickness of about 80 nm, to manufacture an EL device. After the degree of vacuum reached $1 \times 10^{-4}$ Pa or less, vapor-deposition of a metal was initiated.

Performance of EL Device

By applying voltage on the resultant device, EL light emission having a peak at 485 nm was obtained from this device. If EL emitted color is represented by C. I. E. chromatic coordinate value, x=0.150 and y=0.128, showing very good blue color. The intensity of EL light emission was approximately in proportion to current density. This device showed initiation of light emission from 5.2 V. The light emitting efficiency increased monotonically in the range of application voltage measured (0 V to 12 V), however, showed an efficiency as relatively high as 1.02 cd/m² at 12 V.

EXAMPLE 7

Manufacturing and Performance of EL Device

Preparation of Solution

The polymer compound 4 obtained above and the polymer compound 3 obtained above were dissolved at a ratio of 90 wt % to 10 wt % in toluene, to obtain a toluene solution having a polymer concentration of 1.8 wt %.

Manufacturing of EL Device

An EL device was manufactured in utterly the same manner as in Example 6 excepting that the toluene solution obtained above was used. The revolution in spin coat of the polymer solution was 3300 rpm, and the thickness of the polymer membrane after film formation was 95 nm.

Performance of EL Device

By applying voltage on the resultant device, EL light emission having a peak at 425 nm was obtained from this device. If EL emitted color is represented by C. I. E. chromatic coordinate value, x=0.155 and y=0.072, showing very good blue color. The intensity of EL light emission was approximately in proportion to current density. This device showed initiation of light emission from 5.5 V. The light emitting efficiency increased monotonically in the range of application voltage measured (0 V to 12 V), however, showed an efficiency as relatively high as 0.22 cd/m² at 12 V.

EXAMPLE 8

Manufacturing and Performance of EL Device

Preparation of Solution

The polymer compound 4 obtained above was dissolved in toluene, to obtain a toluene solution having a polymer concentration of 1.8 wt %.

Manufacturing of EL Device

An EL device was manufactured in utterly the same manner as in Example 6 excepting that the toluene solution obtained above was used. The revolution in spin coat of the polymer solution was 2500 rpm, and the thickness of the polymer membrane after film formation was 90 nm.

Performance of EL Device

By applying voltage on the resultant device, EL light emission having a peak at 425 nm was obtained from this device. If EL emitted color is represented by C. I. E. chromatic coordinate value, x=0.155 and y=0.074, showing very good blue color. The intensity of EL light emission was approximately in proportion to current density. This device showed initiation of light emission from 5.8 V. The light emitting efficiency increased monotonically in the range of application voltage measured (0 V to 12 V), however, showed an efficiency as relatively high as 0.57 cd/m² at 12 V.

EXAMPLE 9

Synthesis of Compound D

Synthesis of Compound C

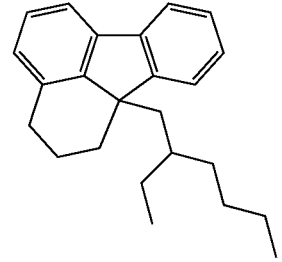

(compound C)

Into a reaction vessel was charged 31 ml of ion exchanged water, and 29 g of sodium hydroxide (727 mmol) was added portion-wise while stirring to attain completion dissolution. An atmosphere in the system was purged with argon, and 30 ml of toluene and 5.0 g (24 mmol) of 1,2,3,10b-tetrahydrofluoranthene were placed and, dissolved by stirring. Subsequently, 2.3 g (7.3 mmol) of tetrabutylammonium bromide and 9.4 g (48 mmol) of 2-ethylhexyl bromide were added and reacted at 40° C. for 3 hours. Liquid separation into toluene and water was performed, the organic layer was extracted, then, dried over sodium sulfate. The solvent was distilled off, then, purification was performed by a silica gel column using hexane as a developing solvent, to obtain 6.88 g of a yellow oil.

MS(APPI(+)): 318 ([M+H]⁺)

¹H-NMR (300 MHz/CDCl₃) δ7.69 (1H, d), 7.50 (1H, d), 7.40 (1H, d), 7.33 to 7.22 (3H, m), 7.02 (1H, d), 3.07 to 2.96

(1H, m), 2.79 to 2.71 (1H, m), 2.36 to 2.22 (2H, m), 2.10 to 1.99 (1H, m), 1.93 to 1.76 (2H, m), 1.24 to 1.15 (11H, m), 0.88 to 0.37 (9H, m)

Synthesis of Compound D

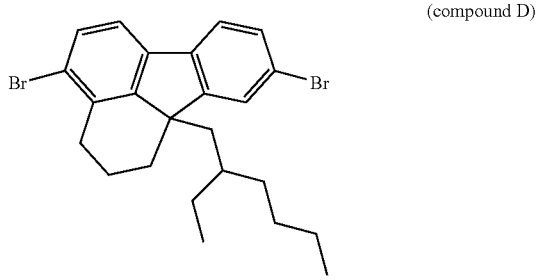

(compound D)

Into an argon-purged reaction vessel was added 6.8 g (21 mmol) of compound C, 6.7 g (49 mmol) of zinc chloride and 134 ml of a mixed solvent of acetic acid: dichloromethane=1: 1, and the mixture was stirred at room temperature. Subsequently, 18 g (47 mmol) of benzyltrimethylammonium tribromide was dissolved in 150 ml of dichloromethane and droped. After completion of dropping, the solution was reacted at room temperature for 2 hours, subsequently, at 40° C. and 50° C. each for 30 minutes, then, chloroform and a 5% sodium hydrogen sulfite aqueous solution were added to terminate the reaction. Liquid separation into chloroform and water was performed, the organic layer was extracted, washed with water twice, then, neutralized with an aqueous potassium carbonate solution. After drying over sodium sulfate, the solvent was distilled off, purification was performed 3 times by a silica gel column using hexane as a developing solvent, to obtain 1.73 g of compound D as yellow oil (when left at room temperature, turned into while crystal slowly).

MS(APPI(+)) 476 (M+)

$^1$H-NMR (300 MHz/CDCl$_3$) δ7.52 to 7.42 (4H, m), 7.33 (1H, d), 3.00 to 2.80 (2H, m), 2.40 to 2.20 (2H, m), 2.02 to 1.89 (2H, m), 1.75 to 1.70 (1H, m), 1.31 to 1.15 (2H, m), 0.96 to 0.39 (8H, m)

EXAMPLE 10

Synthesis of Polymer Compound 5

Under a nitrogen atmosphere, compound D (0.476 g) and 2,2'-bipyridyl (0.422 g) were dissolved in 72 mL of dehydrated tetrahydrofuran, then, dissolved by stirring. To this solution was added bis(1,5-cyclooctadiene)nickel(0) {Ni (COD)$_2$} (0.743 g), and the mixture was stirred and reacted at 60° C. for 3 hours. This reaction liquid was cooled down to room temperature, and dropped into a mixed solution of 25% ammonia water 4 mL/methanol 72 mL/ion exchanged water 72 mL and the mixture was stirred for 1 hour, then, the deposited precipitate was filtrated and dried under reduced pressure, and dissolved in 20 ml of toluene. After dissolution, 1.6 g of radiolite was added and the mixture was stirred for 30 minutes, and insoluble materials were filtrated. The resultant filtrate was purified by passing through an alumina column. Next, 40 mL of 5.2% hydrochloric acid water was added and the mixture was stirred for 3 hours, then, the aqueous phase was removed. Subsequently, 40 mL of 4% ammonia water was added and the mixture was stirred for 2 hours, then, the aqueous phase was removed. Further, about 40 mL of ion exchanged water was added to the organic layer and the mixture was stirred for 1 hour, then, the aqueous phase was removed. Thereafter, the organic layer was poured into 80 ml of methanol and the mixture was stirred for 1 hour, and the deposited precipitate was filtrated and dried under reduced pressure. The yield of the resultant polymer (hereinafter, referred to as polymer compound 5) was 0.17 g. The polystyrene reduced number average molecular weight and the polystyrene reduced weight average molecular weight were Mn=1.1×10$^5$ and Mw=3.2×10$^5$, respectively.

COMPARATIVE EXAMPLE 1

Synthesis of Polymer Compound 6

0.22 g (0.40 mmol) of 2,7-dibromo-9,9-dioctylfluorene, 0.20 g (0.27 mmol) of (N,N'-bis (4-bromophenyl)-N,N'-bis (4-t-butyl-2,6-dimethylphenyl)-1,4-phenylenediamine and 0.24 g (1.5 mmol) of 2,2'-bipyridyl were charged in a reaction vessel, then, an atmosphere in the reaction system was purged by a nitrogen gas. To this was added 20 ml of tetrahydrofuran (dehydrated solvent) deaerated previously by bubbling with an argon gas. Next, to this mixed solution was added 0.42 g (1.5 mmol) of bis(1,5-cyclooctadiene)nickel(0), and the mixture was reacted at 60° C. for 3 hours. The reaction was carried out in a nitrogen gas atmosphere. After the reaction, this solution was cooled, then, poured into a mixed solution of 25% ammonia water 10 mL/methanol 120 mL/ion exchanged water 50 mL and the mixture was stirred for about 1 hour. Then, the generated precipitate was recovered by filtration. This precipitate was washed with ethanol, then, dried under reduced pressure for 2 hours. Then, this precipitate was dissolved in 50 mL of toluene, and 50 mL of 1 N hydrochloric acid was added to this and the mixture was stirred for 1 hour, and the aqueous layer was removed and, 50 mL of 4% ammonia water was added to the organic layer, and the resultant mixture was stirred for 1 hour, then, the aqueous layer was removed. The organic layer was dropped into 120 mL of methanol and the resultant mixture was stirred for 1 hour, and the deposited precipitate was filtrated and dried under reduced pressure for 2 hours, and dissolved in 40 Ml of toluene. Thereafter, purification was performed by passing through an alumina column (alumina amount: 20 g), and the recovered toluene solution was dropped into 120 mL of methanol and the resultant mixture was stirred for 1 hour, and the deposited precipitate was filtrated and dried under reduced pressure for 2 hours. The yield of the resultant polymer compound 6 was 0.094 g.

The polymer compound 6 had a polystyrene reduced number average molecular weight of 2.0×10$^4$ and a polystyrene reduced weight average molecular weight of 1.1×10$^5$.

COMPARATIVE EXAMPLE 2

Manufacturing and Performance of EL Device

Preparation of Solution

The polymer compound 6 obtained above was dissolved in chloroform, to obtain a chloroform solution having a polymer concentration of 1.8 wt %.

Manufacturing of EL Device

On a glass substrate carrying thereon an ITO film with a thickness of 150 nm formed by a sputtering method, a solution of poly(ethylenedioxythiophene)/polystyrenesulfonic acid (manufactured by Bayer, BaytronP) was spin-coated to form a film with a thickness of 50 nm, and dried on a hot plate at 200° C. for 10 minutes. Next, the chloroform solution prepared above was spin-coated at a revolution of 2500 rpm to form a film. The thickness was about 100 nm. Further, this was dried at 80° C. for 1 hour under reduced pressure, then, LiF was vapor-deposited with a thickness of about 4 nm as a cathode buffering layer, and calcium was vapor-deposited with a thickness of about 5 nm, then, aluminum was vapor-deposited with a thickness of about 80 nm, as a cathode, producing an EL device. After the degree of vacuum reached $1\times10^{-4}$ Pa or less, vapor-deposition of a metal was initiated.

Performance of EL Device

By applying voltage on the resultant device, EL light emission having a peak at 448 nm was obtained. If EL emitted color is represented by C. I. E. chromatic coordinate value, x=0.155 and y=0.133. The device showed maximum light emitting efficiency at about 10 V, and its value was 0.14 cd/A.

INDUSTRIAL APPLICABILITY

The polymer compound of the present invention provides, when used as a material for an electron device, an electron device excellent in device performances.

The polymer compound of the present invention usually emits fluorescence or phosphorescence at solid state, and can be used as a polymer light emitter (light emitting material of high molecular weight).

The polymer compound has excellent charge transportability, and can be suitably used as a polymer LED material or charge transporting material. The polymer LED using the polymer light emitter is a high performance polymer LED which can be driven at low voltage with high efficiency. Thus, the polymer LED can be preferably used as back light of liquid crystal displays, or in curved or flat light sources for illumination, segment type display devices, dot matrix type flat panel displays and the like.

The polymer compound of the present invention can also be used as a coloring matter for laser, a material for organic solar battery, or a material for conductive thin films such as organic semiconductors, electrically conductive thin films, organic semiconductor thin films and the like for organic transistors.

Further, the polymer compound of the present invention can also be used as a material for luminescent thin film materials showing fluorescence or phosphorescence.

The invention claimed is:

1. A method for producing a polymer compound comprising at least one of residues of compounds of the following formula (1):

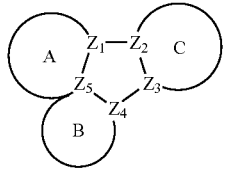

formula 1 wherein, ring A, ring B and ring C represent each independently an aromatic ring or non-aromatic ring optionally having a substituent, $Z_1$, $Z_2$, $Z_3$, $Z_4$ and $Z_5$ represent each independently C-(Q)$_z$ or nitrogen atom, Q represents a substituent or hydrogen atom, z represents 0 or 1, the ring A and the ring B may share an atom other than $Z_5$ constituting each ring, and one or more and two or less of the rings A, B and C are non-aromatic rings, wherein the method comprises polymerizing as a raw material at least a compound of the following formula (17-2):

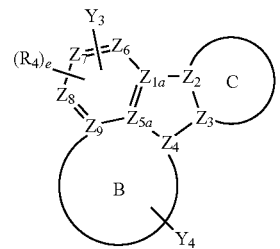

formula (17-2)

wherein, ring B, ring C, $Z_2$, $Z_3$, and $Z_4$, represent the same meanings as described above, $Y_3$ and $Y_4$, represent each independently a substituent correlated with polymerization, $Z_6$, $Z_7$ and $Z_8$ represent each independently C-(Q)$_z$ or nitrogen atom, $Z_{1a}$, $Z_{5a}$ and $Z_9$ represent each independently a carbon atom, Q and z represent the same meanings as described above, $R_4$ represents a substituent, e represents an integer of 0 to 2, when there are two or more $R_4$s, they may be the same or different, and $R_4$s may be mutually connected to form a ring.

2. A method for producing a polymer compound comprising at least one of residues of compounds of the following formula (1):

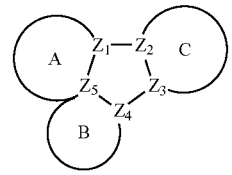

formula 1 wherein, ring A, ring B and ring C represent each independently an aromatic ring or non-aromatic ring optionally having a substituent, $Z_1$, $Z_2$, $Z_3$, $Z_4$ and $Z_5$ represent each independently C-(Q)$_z$ or nitrogen atom, Q represents a substituent or hydrogen atom, z represents 0 or 1, the ring A and the ring B may share an atom other than $Z_5$ constituting each ring, and one or more and two or less of the rings A, B and C are non-aromatic rings, wherein the method comprises polymerizing as a raw material at least a compound of the following formula (17-3):

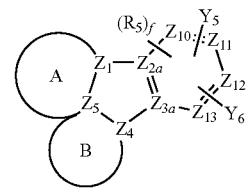

formula (17-3)

wherein, ring A, ring B, $Z_1$, $Z_4$, and $Z_5$ represent the same meanings as described above, $Y_5$ and $Y_6$ represent each independently a substituent correlated with polymerization, $Z_{10}$, $Z_{11}$, $Z_{12}$ and $Z_{13}$ represent each independently C-$(Q)_z$ or nitrogen atom, $Z_{2a}$ and $Z_{3a}$ represent each independently a carbon atom, Q and z represent the same meanings as described above, $R_5$ represents a substituent, f represents an integer of 0 to 2, when there are two or more $R_5$s, they may be the same or different, and $R_5$s may be mutually connected to form a ring.

3. A compound of the following formula (16-2) or (16-3):

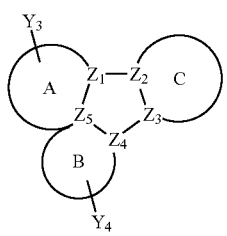

formula (16-2)

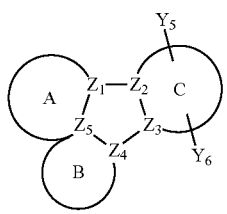

formula (16-3)

wherein, ring A, ring B and ring C represent each independently an aromatic ring or non-aromatic ring optionally having a substituent, $Z_1$, $Z_2$, $Z_3$, $Z_4$ and $Z_5$ represent each independently C-$(Q)_z$ or nitrogen atom, Q represents a substituent or hydrogen atom, z represents 0 or 1, the ring A and the ring B may share an atom other than $Z_5$ constituting each ring, one or more and two or less of the rings A, B and C are non-aromatic rings, and $Y_3$, $Y_4$, $Y_5$ and $Y_6$ represent each independently a substituent correlated with polymerization.

4. A compound of the following formula (17-2) or (17-3):

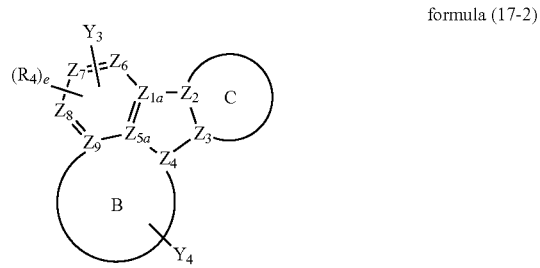

formula (17-2)

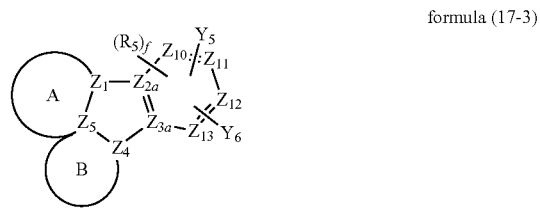

formula (17-3)

wherein, ring A, ring B and ring C represent each independently an aromatic ring or non-aromatic ring optionally having a substituent, $Z_1$, $Z_2$, $Z_3$, $Z_4$ and $Z_5$ represent each independently C-$(Q)_z$ or nitrogen atom, Q represents a substituent or hydrogen atom, z represents 0 or 1, the ring A and the ring B may share an atom other than $Z_5$ constituting each ring, one or more and two or less of the rings A, B and C are non-aromatic rings, $Y_3$, $Y_4$, $Y_5$ and $Y_6$ represent each independently a substituent correlated with polymerization, $Z_6$, $Z_7$ and $Z_8$ represent each independently C-$(Q)_z$, or nitrogen atom, $Z_{1a}$, $Z_{5a}$ and $Z_9$ represent each independently a carbon atom, $R_4$ represents a substituent, e represents an integer of 0 to 2, when there are two or more $R_4$s, they may be the same or different, and $R_4$s may be mutually connected to form a ring, $Z_{10}$, $Z_{11}$, $Z_{12}$ and $Z_{13}$ represent each independently C-$(Q)_z$, or nitrogen atom, $Z_{2a}$, and $Z_{3a}$ represent each independently a carbon atom, $R_5$ represents a substituent, f represents an integer of 0 to 2, when there are two or more $R_5$s, they may be the same or different, and $R_5$s may be mutually connected to form a ring.

* * * * *